United States Patent
Nagata et al.

(10) Patent No.: US 12,381,136 B2
(45) Date of Patent: *Aug. 5, 2025

(54) LEAD FRAME AND MANUFACTURING METHOD THEREOF

(71) Applicant: DAI NIPPON PRINTING CO., LTD., Tokyo (JP)

(72) Inventors: Masahiro Nagata, Tokyo (JP); Kazuhiro Shinozaki, Tokyo (JP); Masahiro Yamada, Tokyo (JP); Daisuke Okuyama, Tokyo (JP); Chiaki Hatsuta, Tokyo (JP); Kentarou Seki, Tokyo (JP); Hideto Matsui, Tokyo (JP); Kazunori Oouchi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/678,270

(22) Filed: May 30, 2024

(65) Prior Publication Data

US 2024/0404928 A1 Dec. 5, 2024

Related U.S. Application Data

(63) Continuation of application No. 18/375,193, filed on Sep. 29, 2023, now Pat. No. 12,243,811, which is a
(Continued)

(30) Foreign Application Priority Data

Sep. 3, 2021 (JP) .................. 2021-144288
Sep. 3, 2021 (JP) .................. 2021-144291
(Continued)

(51) Int. Cl.
*H01L 23/495* (2006.01)
*C23C 18/22* (2006.01)
(Continued)

(52) U.S. Cl.
CPC .... *H01L 23/49582* (2013.01); *H01L 21/4828* (2013.01); *H01L 21/4842* (2013.01);
(Continued)

(58) Field of Classification Search
CPC ......... H01L 23/49582; H01L 23/49503; H01L 23/49579; H01L 23/49513;
(Continued)

(56) References Cited

U.S. PATENT DOCUMENTS 7,205,180 B1   4/2007 Sirinorakul et al.
7,327,017 B2   2/2008 Sirinorakul et al.
(Continued)

FOREIGN PATENT DOCUMENTS

CN   101164165 A   4/2008
CN   112133640 A   12/2020
(Continued)

OTHER PUBLICATIONS

JP H10135586 A—Machine English Translation (Year: 2025).*
(Continued)

*Primary Examiner* — Jose R Diaz
(74) *Attorney, Agent, or Firm* — Oliff PLC

(57) ABSTRACT

A lead frame includes a plurality of lead portions. At least a part of an upper surface of the lead portion and a sidewall surface of the lead portion is a rough surface having been subjected to roughening treatment. A value of a* in a CIELab color space of the rough surface is within a range from 12 to 19, and a value of b* is within a range from 12 to 17.

9 Claims, 45 Drawing Sheets

Related U.S. Application Data continuation of application No. 18/279,608, filed as application No. PCT/JP2022/033037 on Sep. 1, 2022.

(30) Foreign Application Priority Data

| Nov. 12, 2021 | (JP) | ................................ | 2021-185138 |
| Nov. 12, 2021 | (JP) | ................................ | 2021-185144 |
| Mar. 31, 2022 | (JP) | ................................ | 2022-058471 |

(51) Int. Cl.
  *H01L 21/48* (2006.01)
  *H01L 23/00* (2006.01)
  *H01L 23/31* (2006.01)

(52) U.S. Cl.
  CPC ...... *H01L 23/495* (2013.01); *H01L 23/49503* (2013.01); *H01L 23/49513* (2013.01); *H01L 23/49517* (2013.01); *H01L 23/49541* (2013.01); *H01L 23/49579* (2013.01); *C23C 18/22* (2013.01); *H01L 23/3107* (2013.01); *H01L 24/16* (2013.01); *H01L 24/32* (2013.01); *H01L 24/48* (2013.01); *H01L 24/73* (2013.01); *H01L 2224/16245* (2013.01); *H01L 2224/32245* (2013.01); *H01L 2224/48245* (2013.01); *H01L 2224/73265* (2013.01); *H05K 2203/0307* (2013.01)

(58) Field of Classification Search
  CPC ............. H01L 23/49541; H01L 23/495; H01L 21/4828; C23C 18/22; H05K 2203/0307
  See application file for complete search history.

(56) References Cited

U.S. PATENT DOCUMENTS

| 8,742,554 | B2 | 6/2014 | Shimazaki et al. | |
| 9,461,220 | B2 | 10/2016 | Ikenaga et al. | |
| 9,735,096 | B1 | 8/2017 | Hishiki et al. | |
| 2006/0097366 | A1* | 5/2006 | Sirinorakul | H01L 23/495 257/E23.054 |
| 2009/0039486 | A1 | 2/2009 | Shimazaki et al. | |
| 2014/0048934 | A1* | 2/2014 | Chen | H01L 21/563 257/738 |
| 2020/0303289 | A1* | 9/2020 | Hishiki | H01L 23/3142 |
| 2020/0312753 | A1 | 10/2020 | Hishiki et al. | |
| 2022/0278039 | A1 | 9/2022 | Saito et al. | |
| 2023/0101079 | A1 | 3/2023 | Tanioka et al. | |
| 2024/0030114 | A1* | 1/2024 | Nagata | H01L 23/3142 |

FOREIGN PATENT DOCUMENTS

| JP | H10135586 A * | 5/1998 | ......... H01L 2224/16 |
| JP | 2002-110849 A | 4/2002 | |
| JP | 2007-287765 A | 11/2007 | |
| JP | 2012164877 A | 8/2012 | |
| JP | 2017-022267 A | 1/2017 | |
| JP | 2017-084880 A | 5/2017 | |
| JP | 2017-098291 A | 6/2017 | |
| JP | 2017-168871 A | 9/2017 | |
| JP | 2019-40994 A | 3/2019 | |
| JP | 2020-167207 A | 10/2020 | |
| JP | 7540579 B2 | 8/2024 | |

OTHER PUBLICATIONS

Jul. 16, 2024 Non-Final Rejection issued in U.S. Appl. No. 18/375,193.
Jul. 16, 2024 Office Action issued in Japanese Patent Application No. 2024-082632.
Nov. 15, 2022 International Search Report issued in International Patent Application No. PCT/JP2022/033037.
Aug. 1, 2023 Decision to Grant a Patent issued in Japanese Patent Application No. 2023-541129.
Nov. 15, 2022 Written Opinion issued in International Patent Application No. PCT/JP2022/033037.
Sep. 29, 2023 Office Action issued in Japanese Patent Application No. 2023-113314.
Dec. 5, 2023 Office Action issued in U.S. Appl. No. 18/375,193.
Mar. 21, 2024 Notice of Allowance issued in U.S. Appl. No. 18/375,193.
Mar. 5, 2024 International Preliminary Report on Patentability issued in PCT Application No. PCT/JP2022/033037.
May 23, 2024 Office Action issued in U.S. Appl. No. 18/279,608.
Apr. 5, 2024 Corrected Notice of Allowability issued in U.S. Appl. No. 18/375,193.
Mar. 22, 2024 Notice of Reasons for Refusal issued in Japanese Patent Application No. 2023-216133.
Jul. 16, 2024 Decision to Grant issued in Japanese Patent Application No. 2023-216133.
Mar. 18, 2025 Office Action issued in U.S. Appl. No. 18/279,608.
Jan. 7, 2025 Office Action issued in Taiwanese Patent Application No. 113118694.
Sep. 16, 2024 Office Action issued in Chinese Patent Application No. 202410065609.0.
Hongqi Sun, Study on RFFlow Discoloration of Pure Tin Deposit in Microelectronics Packing Industry, Thesis Submitted to Shanghai Jiao Tong University for Degree of Engineering Master, Jun. 30, 2013, p. 52.
Han Yuanshuai, "Study of Electromagnetic Scattering From Random Rough Surfaces and Its Complex Scattering With Targets", Thesis Submitted to Nanjing University of Science and Technology for Degree of Master, Mar. 31, 2011, p. 2.
Oct. 30, 2024 Office Action issued in U.S. Appl. No. 18/279,608.
Nov. 11, 2024 Office Action issued in Korean Patent Application No. 10-2023-7029193.
Apr. 26, 2025 Office Action issued in Chinese Patent Application No. 202411165078.9.

* cited by examiner

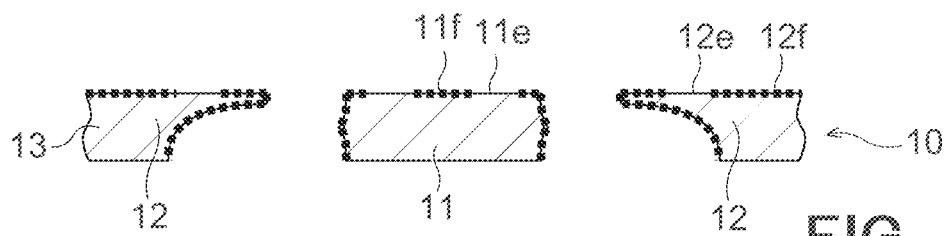
FIG. 15A
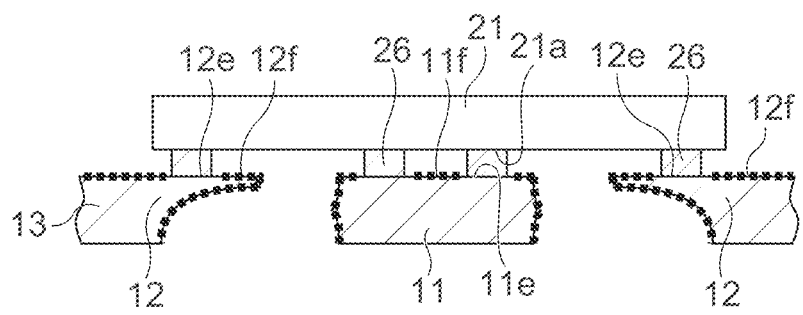
FIG. 15B
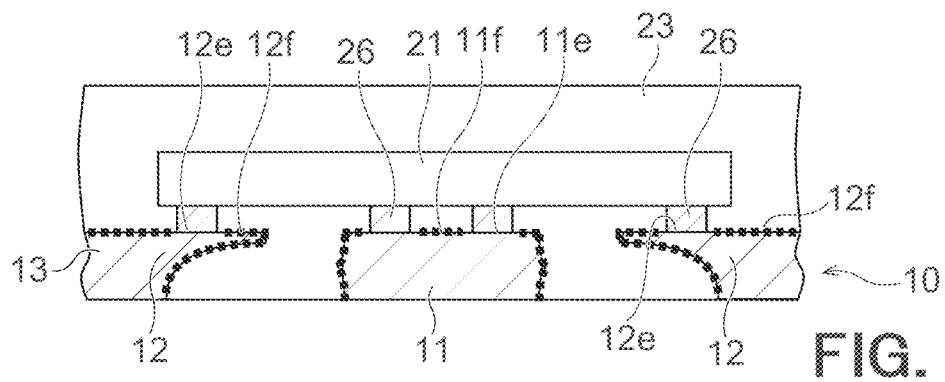
FIG. 15C
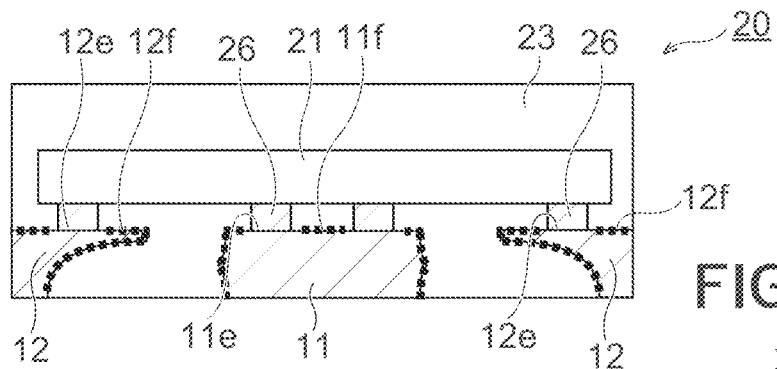
FIG. 15D
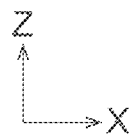

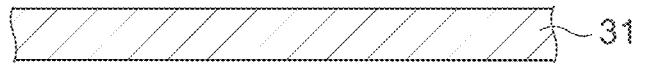
FIG. 23A
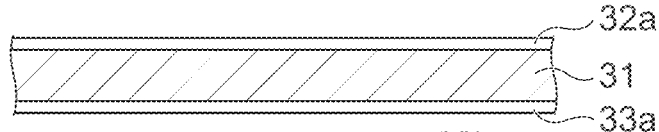
FIG. 23B
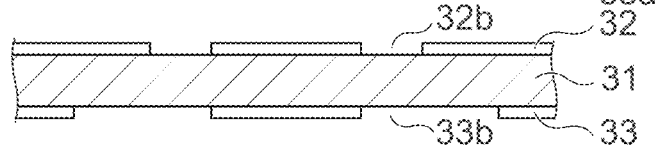
FIG. 23C
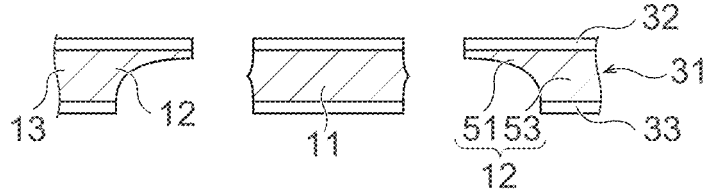
FIG. 23D
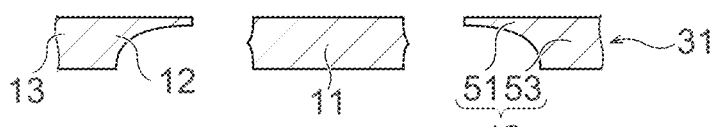
FIG. 23E
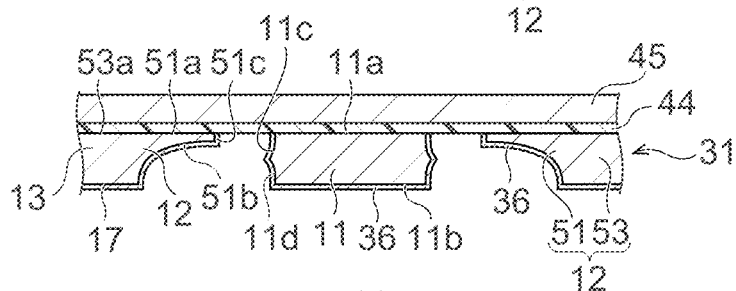
FIG. 23F
FIG. 23G
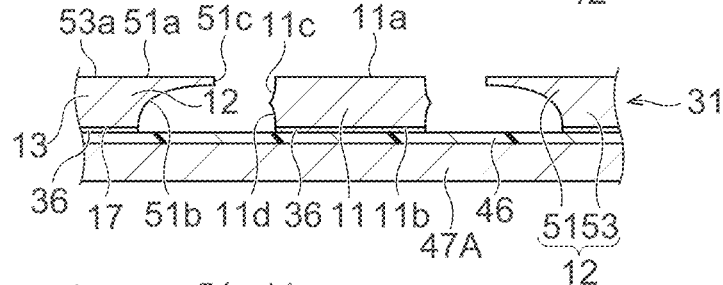
FIG. 23H
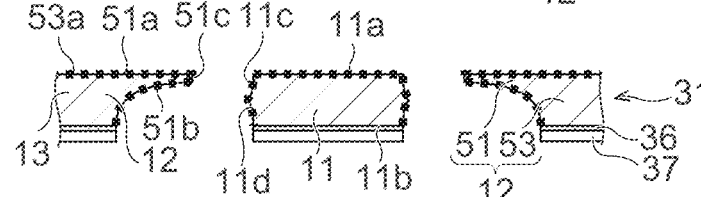
FIG. 23I
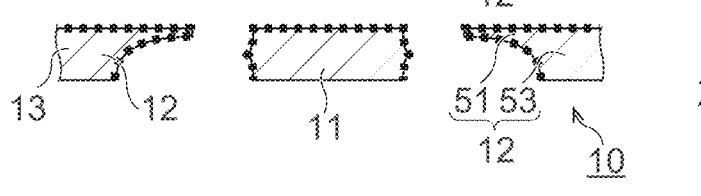

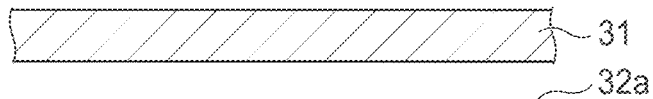
FIG. 28A
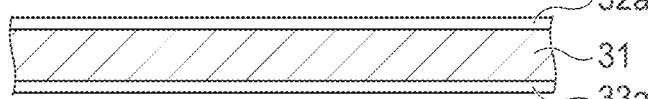
FIG. 28B
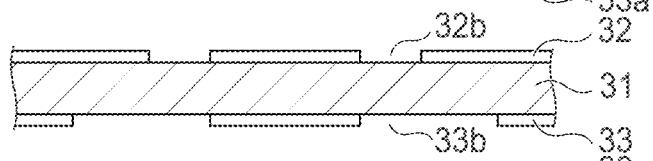
FIG. 28C
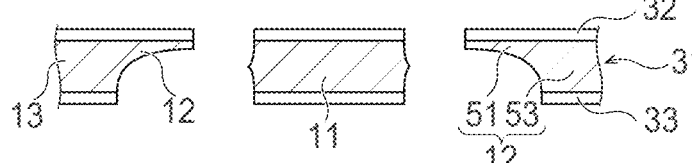
FIG. 28D
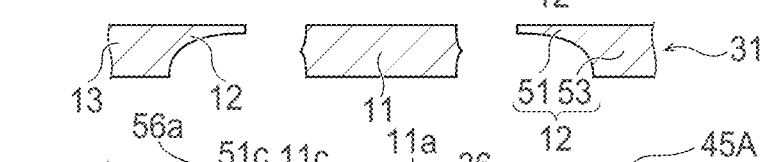
FIG. 28E
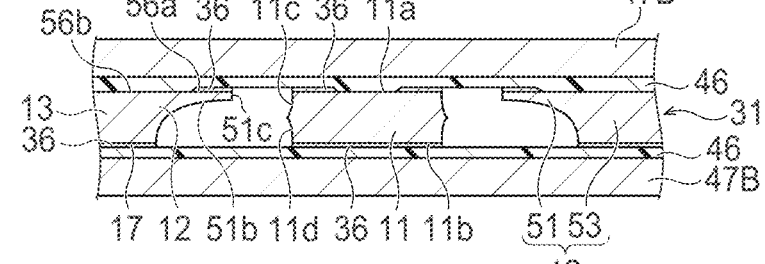
FIG. 28F
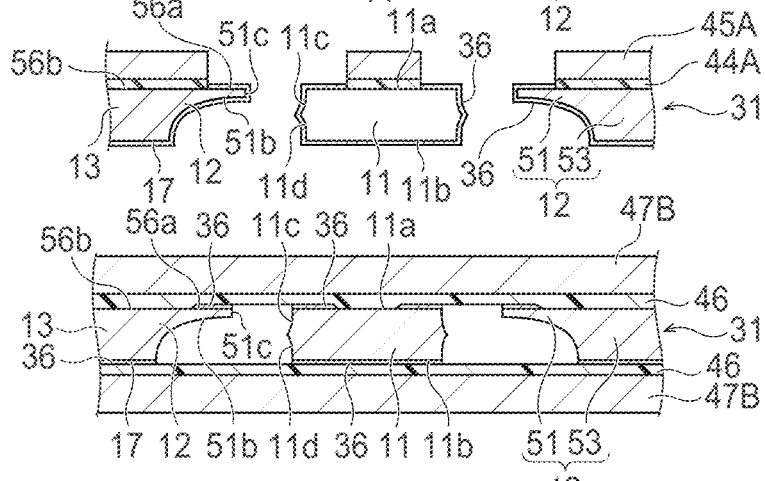
FIG. 28G
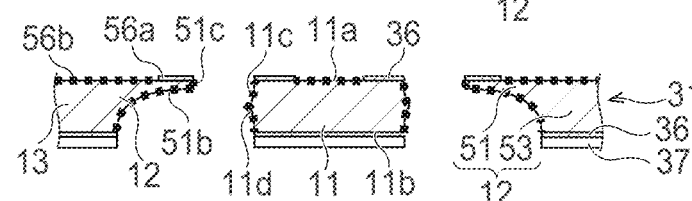
FIG. 28H
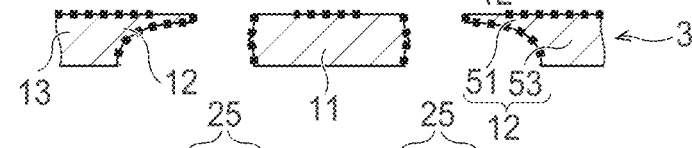
FIG. 28I
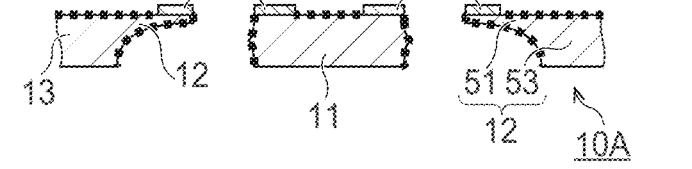
FIG. 28J
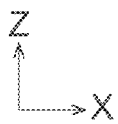

FIG. 40B
FIG. 40C
FIG. 40D
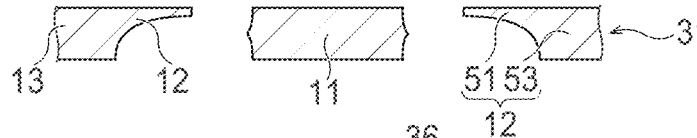
FIG. 40E
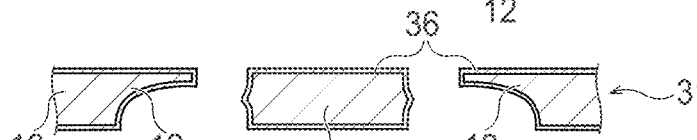
FIG. 40F
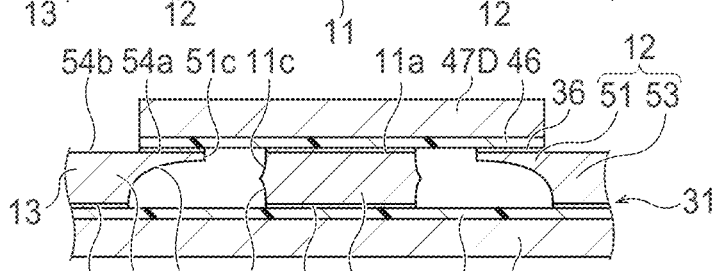
FIG. 40G
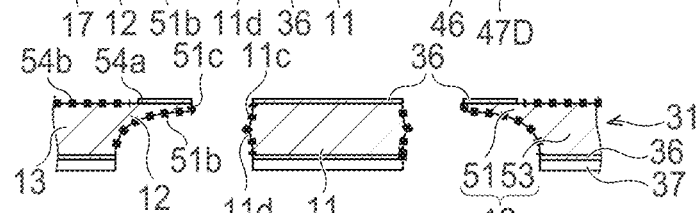
FIG. 40H
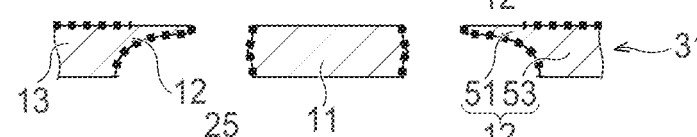
FIG. 40I
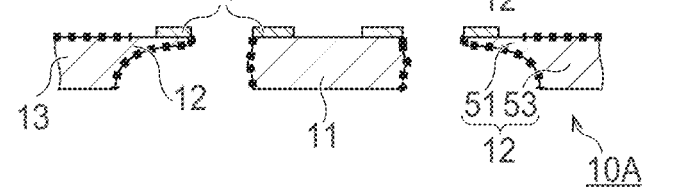
FIG. 40J
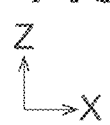

FIG. 54A
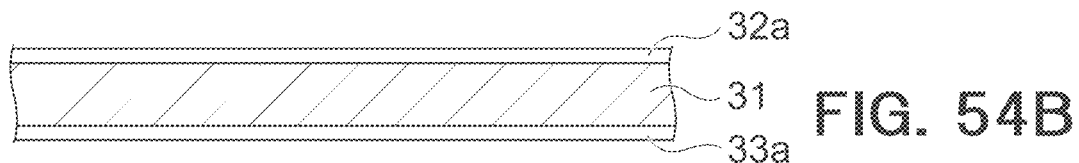
FIG. 54B
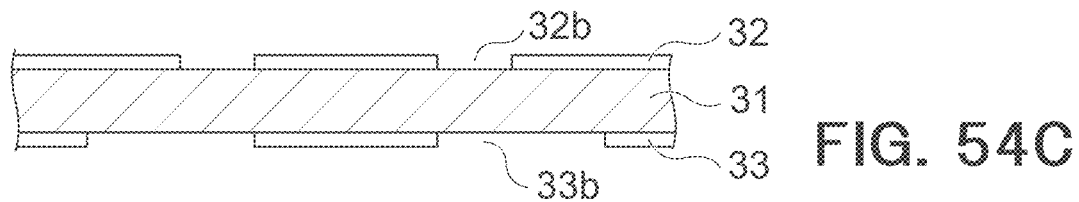
FIG. 54C
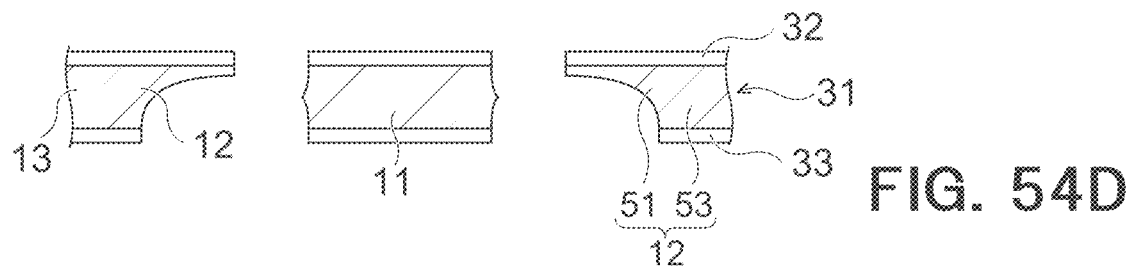
FIG. 54D
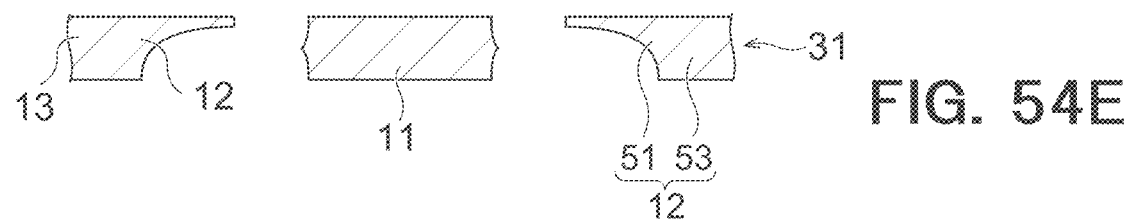
FIG. 54E
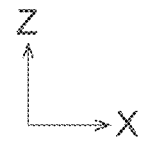

LEAD FRAME AND MANUFACTURING METHOD THEREOF

CROSS REFERENCE TO RELATED APPLICATIONS

This is a Continuation of application Ser. No. 18/375,193 filed Sep. 29, 2023, which in turn is a Continuation of application Ser. No. 18/279,608 filed Aug. 31, 2023, which in turn is a national stage entry of PCT/JP2022/033037 filed Sep. 1, 2022, which claims priority to JP 2022-058471 filed Mar. 31, 2022, JP 2021-185144 and JP 2021-185138 each filed Nov. 12, 2021, and JP 2021-144291 and JP 2021-144288 each filed Sep. 3, 2021. The disclosure of each of the prior applications is hereby incorporated by reference herein in its entirety.

TECHNICAL FIELD

The present disclosure relates to a lead frame and a manufacturing method thereof.

BACKGROUND ART

Recently, a reduction in size and thickness of a semiconductor device to be mounted onto a substrate has been demanded. In order to meet such a demand, various kinds of so-called QFN-type (Quad Flat Non-leaded package) semiconductor device have been proposed. In a QFN-type semiconductor device, a semiconductor element mounted on a mount surface of a lead frame is sealed with molding resin, and leads are partially exposed at a back surface side.

A flip-chip-type semiconductor device is known in the art (see PTL 1). In a flip-chip-type semiconductor device, when a semiconductor element is mounted onto a mount substrate, the semiconductor element and the mount substrate are connected to each other via bumps.

CITATION LIST

Patent Literature

PTL 1: Japanese Unexamined Patent Application Publication No. 2002-110849
PTL 2: Japanese Unexamined Patent Application Publication No. 2019-40994

In general, in a flip-chip-type semiconductor device, a path which defines a distance from the outer perimeter of the semiconductor device to the electrode of the semiconductor element and through which moisture in external air (air) can enter tends to be short. For this reason, there is a risk that moisture in air might enter the electrode of the semiconductor element from the outer perimeter of the semiconductor device.

By the way, in the art, when a semiconductor package for vehicular use or high-reliability-required use is manufactured, a semiconductor element is mounted onto a die pad using a die attaching film. These days, in such a semiconductor package, a die attaching paste, which is more cost friendly, is also used when mounting a semiconductor element onto a die pad.

However, in the art, when heat for curing is applied after applying a die attaching paste to a die pad and then mounting a semiconductor element, a phenomenon (bleed out) of the leaching out of epoxy-resin ingredients in the die attaching paste due to capillary action occurs (see PTL 2).

The present embodiment provides a lead frame by means of which it is possible to manufacture a semiconductor device capable of suppressing the entry of moisture in air to the electrode of a semiconductor element, and a manufacturing method thereof.

The present embodiment provides a lead frame that achieves good connection between bumps and the lead frame and makes it possible to suppress the entry of moisture toward the electrode of a semiconductor element from the outer perimeter of a semiconductor device, and a manufacturing method thereof.

The present embodiment provides a lead frame and a manufacturing method thereof that makes it possible to manufacture the lead frame in which a rough surface is formed at low cost.

The present embodiment provides a lead frame that makes it possible to suppress the entry of moisture toward the electrode of a semiconductor element from the outer perimeter of a semiconductor device, and a manufacturing method thereof.

The present embodiment provides a lead frame that makes it possible to suppress bleed out and suppress the entry of moisture toward the electrode of a semiconductor element from the outer perimeter of a semiconductor device, and a manufacturing method thereof.

SUMMARY OF INVENTION

The embodiments of the present disclosure relate to [1] to [51] stated below.

[1] A lead frame, comprising: a plurality of lead portions, wherein at least a part of an upper surface of the lead portion and a sidewall surface of the lead portion is a rough surface having been subjected to roughening treatment, and a value of a* in a CIELab color space of the rough surface is within a range from 12 to 19, and a value of b* is within a range from 12 to 17.

[2] A lead frame, comprising: a plurality of lead portions, wherein at least a part of an upper surface of the lead portion and a sidewall surface of the lead portion is a rough surface having been subjected to roughening treatment, and an arithmetic mean peak curvature Spc of peaks of the rough surface is 700 mm$^{-1}$ or greater.

[3] The lead frame according to [2], wherein an arithmetic mean height Sa of the rough surface is 0.12 μm or greater.

[4] The lead frame according to any one of [1] to [3], wherein a part of the upper surface of the lead portion and the sidewall surface of the lead portion is the rough surface, and a metal plating layer is provided on, of the upper surface of the lead portion, a part that is not the rough surface.

[5] The lead frame according to [4], wherein the metal plating layer includes at least one of an Ag plating layer, an Ni plating layer, a Pd plating layer, or an Au plating layer.

[6] The lead frame according to any one of [1] to [5], wherein the lead portion includes an inner lead portion thinned from a lower surface side of the lead portion, and a lower surface of the inner lead portion is the rough surface.

[7] The lead frame according to any one of [1] to [5], further comprising: a die pad portion on which a semiconductor element is mountable, wherein the plurality of lead portions is disposed around the die pad portion, and an upper surface of the die pad portion and a sidewall surface of the die pad portion is the rough surface.

[8] The lead frame according to any one of [1] to [7] to be used for manufacturing a semiconductor device that includes a molding portion that seals at least the plurality of lead portions, wherein an upper surface of the lead portion in contact with the molding portion and a sidewall surface of the lead portion in contact with the molding portion is a rough surface having been subjected to roughening treatment.

[9] A method of manufacturing a lead frame, comprising: a metal substrate preparation step of preparing a metal substrate that has a first surface and a second surface that is an opposite of the first surface; a metal substrate processing step of forming a plurality of lead portions by processing the metal substrate; and a rough surface forming step of forming a rough surface by roughening at least a part of an upper surface of the lead portion and a sidewall surface of the lead portion, wherein in the rough surface forming step, the roughening is performed such that a value of a* in a CIELab color space of the rough surface is within a range from 12 to 19, and a value of b* is within a range from 12 to 17.

[10] A method of manufacturing a lead frame, comprising: a metal substrate preparation step of preparing a metal substrate that has a first surface and a second surface that is an opposite of the first surface; a metal substrate processing step of forming a plurality of lead portions by processing the metal substrate; and a rough surface forming step of forming a rough surface by roughening at least a part of an upper surface of the lead portion and a sidewall surface of the lead portion, wherein in the rough surface forming step, the roughening is performed such that an arithmetic mean peak curvature Spc of peaks of the rough surface is 700 $mm^{-1}$ or greater.

[11] The method of manufacturing the lead frame according to [10], wherein in the rough surface forming step, the roughening is performed such that an arithmetic mean height Sa of the rough surface is 0.12 μm or greater.

[12] The method of manufacturing the lead frame according to any one of [9] to [11], wherein alkaline treatment is applied to the lead portion after the rough surface forming step.

[13] The method of manufacturing the lead frame according to any one of [9] to [12], wherein a metal plating layer is provided on a part of the upper surface of the lead portion, and, in the rough surface forming step, a part of the upper surface of the lead portion where the metal plating layer is not provided and the sidewall surface thereof are roughened.

[14] The method of manufacturing the lead frame according to [13], wherein the metal plating layer includes at least one of an Ag plating layer, an Ni plating layer, a Pd plating layer, or an Au plating layer.

[15] The method of manufacturing the lead frame according to any one of [9] to [14], wherein, in the metal substrate processing step, the lead portion that includes an inner lead portion thinned from a lower surface side of the lead portion is formed, and, in the rough surface forming step, the rough surface is formed at a lower surface of the inner lead portion.

[16] The method of manufacturing the lead frame according to any one of [9] to [15], wherein, in the metal substrate processing step, a die pad portion on which a semiconductor element is mountable is formed such that the plurality of lead portions is disposed around the die pad portion, and in the rough surface forming step, the rough surface is formed by roughening an upper surface of the die pad portion and a sidewall surface of the die pad portion and at least a part of an upper surface of the lead portion and a sidewall surface of the lead portion.

[17] A lead frame, comprising: a die pad on which a semiconductor element is mountable; and a lead portion located around the die pad, wherein an area of a smooth surface is formed in a front surface of the die pad or a front surface of the lead portion, and an area of a rough surface exists in such a way as to surround an entire perimeter of the area of the smooth surface.

[18] The lead frame according to [17], wherein an area of the rough surface is formed along an entirety of a peripheral edge of the die pad or along an entirety of a peripheral edge of the lead portion in a plan view.

[19] The lead frame according to [17] or [18], wherein the lead portion includes an inner lead thinned from a back surface side, an inner lead front surface is formed at a front surface side of the inner lead, an inner lead back surface is formed at a back surface side of the inner lead, and an inner lead tip surface is formed at, of the inner lead, a surface oriented toward the die pad, an external terminal is formed at a non-thinned part of the back surface of the lead portion, the inner lead back surface and the inner lead tip surface is a rough surface, and the external terminal is a smooth surface.

[20] The lead frame according to any one of [17] to [19], wherein a back surface of the die pad is a smooth surface, and a side surface of the die pad is a rough surface.

[21] The lead frame according to any one of [17] to [20], wherein the area of the smooth surface has a circular, elliptical, or oblong shape in a plan view.

[22] The lead frame according to any one of [17] to [20], wherein the area of the smooth surface has a square or rectangular shape in a plan view.

[23] The lead frame according to any one of [17] to [20], wherein the area of the smooth surface has a shape of a closed figure that includes a curve and a line segment in a plan view.

[24] The lead frame according to any one of [17] to [23], wherein a minimum distance between the area of the smooth surface and a peripheral edge of the die pad or the lead portion is 0.025 mm or longer and 1.0 mm or shorter.

[25] The lead frame according to any one of [17] to [24], wherein an S ratio of the rough surface is 1.30 or higher, and an S ratio of the smooth surface is lower than 1.30.

[26] A method of manufacturing a lead frame, comprising: a step of preparing a metal substrate; a step of forming a die pad and a lead portion located around the die pad by etching the metal substrate; a step of forming a plating layer on a part of the metal substrate; a step of forming a rough surface at, of the metal substrate, a part that is not covered by the plating layer; and a step of removing the plating layer, wherein an area of a smooth surface is formed in a front surface of the die pad or a front surface of the lead portion, and an area of the rough surface exists in such a way as to surround an entire perimeter of the area of the smooth surface.

[27] A method of manufacturing a lead frame, comprising: a step of preparing a metal substrate that includes a die pad and a lead portion located around the die pad; a step of forming a plating layer on an outer perimeter of the metal substrate except for at least a part of a front surface; a step of, with a plating layer existing on at least a back surface of the metal substrate left unremoved, removing another part of the plating layer; a step of forming a rough surface at, of the metal substrate, a part that is not covered by the plating layer; and a step of removing the plating layer.

[28] The method of manufacturing the lead frame according to [27], wherein, in the step of forming the plating layer, the plating layer is not formed throughout an entire area of the front surface of the metal substrate.

[29] The method of manufacturing the lead frame according to [27], wherein, in the step of forming the plating layer, the plating layer is formed at a part of the front surface of the lead portion, and, in the step of removing said another part of the plating layer, the plating layer existing at a part of the front surface of the lead portion is left unremoved.

[30] The method of manufacturing the lead frame according to [29], further comprising: a step of, after removing the plating layer, forming a metal layer on a part of the front surface of the metal substrate.

[31] The method of manufacturing the lead frame according to any one of [27] to [30], wherein an S ratio of the rough surface is 1.30 or higher.

[32] A lead frame, comprising: a die pad on which a semiconductor element is mountable; and a lead portion located around the die pad, wherein the lead portion includes an inner lead thinned from a back surface side, an inner lead front surface is formed at a front surface side of the inner lead, an inner lead back surface is formed at a back surface side of the inner lead, and an inner lead tip surface is formed at, of the inner lead, a surface oriented toward the die pad, an external terminal is formed at a non-thinned part of the back surface of the lead portion, at least a part of the inner lead front surface, the inner lead back surface, and the inner lead tip surface is a rough surface, and the external terminal is a smooth surface.

[33] The lead frame according to [32], wherein a whole of the inner lead front surface is a rough surface.

[34] The lead frame according to [32], wherein a metal layer is formed on the inner lead front surface, and, of the inner lead front surface, a part where the metal layer is formed is a smooth surface.

[35] A lead frame, comprising: a die pad on which a semiconductor element is mountable; and a lead portion located around the die pad, wherein the lead portion is partially thinned from a back surface side, a thinned part of the back surface of the lead portion is a rough surface, and a non-thinned part thereof is a smooth surface.

[36] The lead frame according to [35], wherein a metal layer is located on a front surface of the lead portion, and, of the front surface of the lead portion, a first front surface portion located outward of and next to the metal layer is a smooth surface, and a second front surface portion located outward of and next to the first front surface portion is a rough surface.

[37] The lead frame according to [35], wherein a metal layer is located on a front surface of the lead portion, a recessed portion is formed in the front surface of the lead portion outward of the metal layer, a third front surface portion located outward of and next to the recessed portion is a rough surface, and an inner surface of the recessed portion is a smooth surface.

[38] The lead frame according to [35], wherein a metal layer is located on a front surface of the lead portion, a recessed portion is formed in the front surface of the lead portion outward of the metal layer, a third front surface portion located outward of and next to the recessed portion is a rough surface, and an inner surface of the recessed portion is a rough surface.

[39] The lead frame according to any one of [35] to [38], wherein each of a front surface and a back surface of the die pad is a smooth surface, and a side surface of the die pad is a rough surface.

[40] The lead frame according to any one of [35] to [39], wherein the lead portion includes an inner lead thinned from a back surface side, an inner lead tip surface is formed at, of the inner lead, a surface oriented toward the die pad, and the inner lead tip surface is a rough surface.

[41] The lead frame according to any one of [35] to [40], wherein an S ratio of the rough surface is 1.30 or higher, and an S ratio of the smooth surface is lower than 1.30.

[42] A method of manufacturing a lead frame, comprising: a step of preparing a metal substrate; a step of, by etching the metal substrate, forming a die pad and a lead portion located around the die pad and partially thinned from a back surface side; a step of forming a plating layer around the metal substrate; a step of removing a part of a plating layer existing at an area where a rough surface is to be formed; a step of forming a rough surface at, of the metal substrate, a part that is not covered by the plating layer; and a step of removing the plating layer, wherein a thinned part of the back surface of the lead portion becomes a rough surface, and a non-thinned part thereof becomes a smooth surface.

[43] A lead frame, comprising: a die pad on which a semiconductor element is mountable; and a lead portion located around the die pad, wherein a first rough surface is formed at, at least, a part of a front surface of the die pad, a second rough surface is formed at, at least, a part of a front surface of the lead portion, and the second rough surface of the lead portion is rougher than the first rough surface of the die pad.

[44] The lead frame according to [43], wherein a third rough surface is formed at a side surface of the die pad, and the third rough surface of the die pad is rougher than the first rough surface of the die pad.

[45] The lead frame according to [43] or [44], wherein the lead portion includes an inner lead thinned from a back surface side, an inner lead back surface is formed at a back surface side of the inner lead, a fourth rough surface is formed at the inner lead back surface, and the fourth rough surface of the lead portion is rougher than the first rough surface of the die pad.

[46] The lead frame according to any one of [43] to [45], wherein the lead portion includes an inner lead thinned from a back surface side, an inner lead tip surface is formed at, of the inner lead, a surface oriented toward the die pad, a fifth rough surface is formed at the inner lead tip surface, and the fifth rough surface of the lead portion is rougher than the first rough surface of the die pad.

[47] The lead frame according to any one of [43] to [46], wherein an area of a smooth surface is formed in the front surface of the lead portion.

[48] The lead frame according to [47], wherein a metal layer is formed on the area of the smooth surface.

[49] The lead frame according to [47], wherein the area of the smooth surface is exposed to outside.

[50] The lead frame according to any one of [43] to [49], wherein an S ratio of the first rough surface is 1.10 or higher but lower than 1.30, and an S ratio of the second rough surface is 1.30 or higher and 2.30 or lower.

[51] A method of manufacturing a lead frame, comprising: a step of preparing a metal substrate; a step of forming a die pad and a lead portion located around the die pad by etching the metal substrate; a step of forming a coating layer on the die pad and the lead portion; a step of removing the coating layer existing on at least a part of a front surface of the die pad; a step of forming a first rough surface at, of the die pad, a part that is not covered by the coating layer; a step of removing the coating layer existing on at least a part of a front surface of the lead portion; and a step of forming a second rough surface at, of the lead portion, a part that is not covered by the coating layer, wherein the second rough surface of the lead portion is rougher than the first rough surface of the die pad.

With the present embodiment, it is possible to manufacture a semiconductor device capable of suppressing the entry of moisture in air to the electrode of a semiconductor element.

With the present embodiment, it is possible to achieve good connection between bumps and a lead frame and makes it possible to suppress the entry of moisture toward the electrode of a semiconductor element from the outer perimeter of a semiconductor device.

With the present embodiment, it is possible to manufacture a lead frame in which a rough surface is formed at low cost.

With the present embodiment, it is possible to suppress the entry of moisture toward the electrode of a semiconductor element from the outer perimeter of a semiconductor device.

With the present embodiment, it is possible to suppress bleed out and suppress the entry of moisture toward the electrode of a semiconductor element from the outer perimeter of a semiconductor device.

Figure 13A:
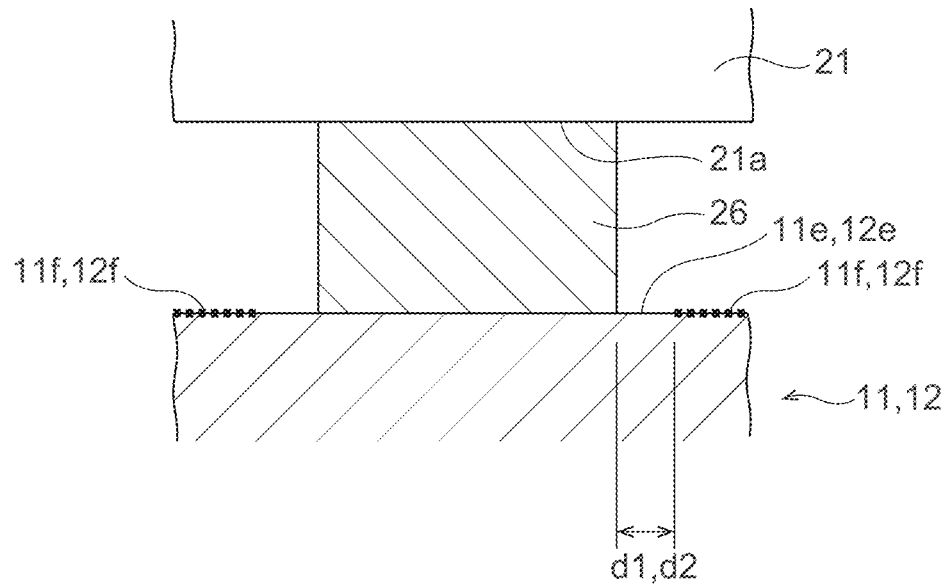
Figure 13B:
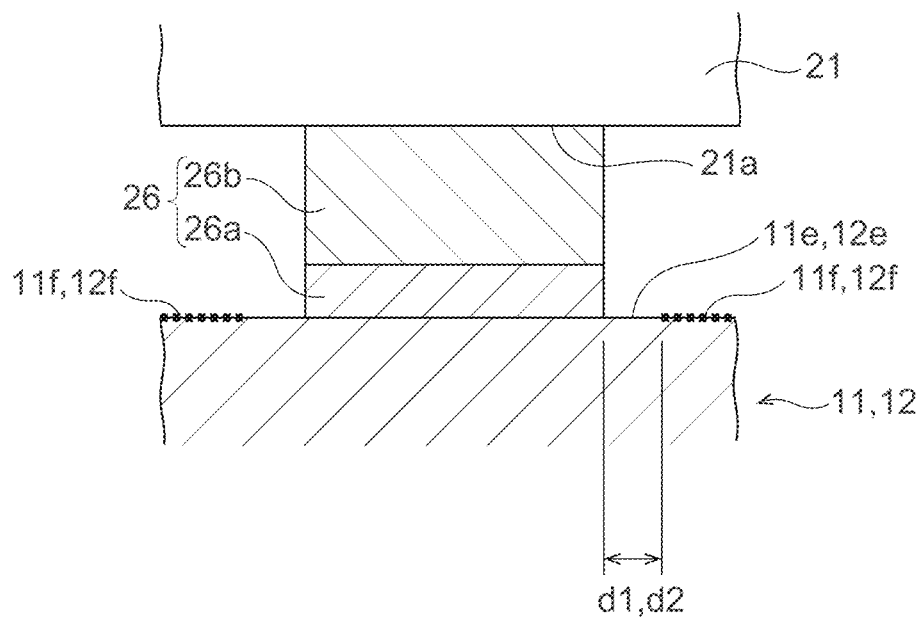

Each of FIGS. 13A and 13B is an enlarged cross-sectional view of a bump serving as a connecting portion.

FIGS. 14A to 14I are cross-sectional views of a method of manufacturing a lead frame according to the second embodiment.

FIGS. 15A to 15D are cross-sectional views of a method of manufacturing a semiconductor device according to the second embodiment.

Figure 16:
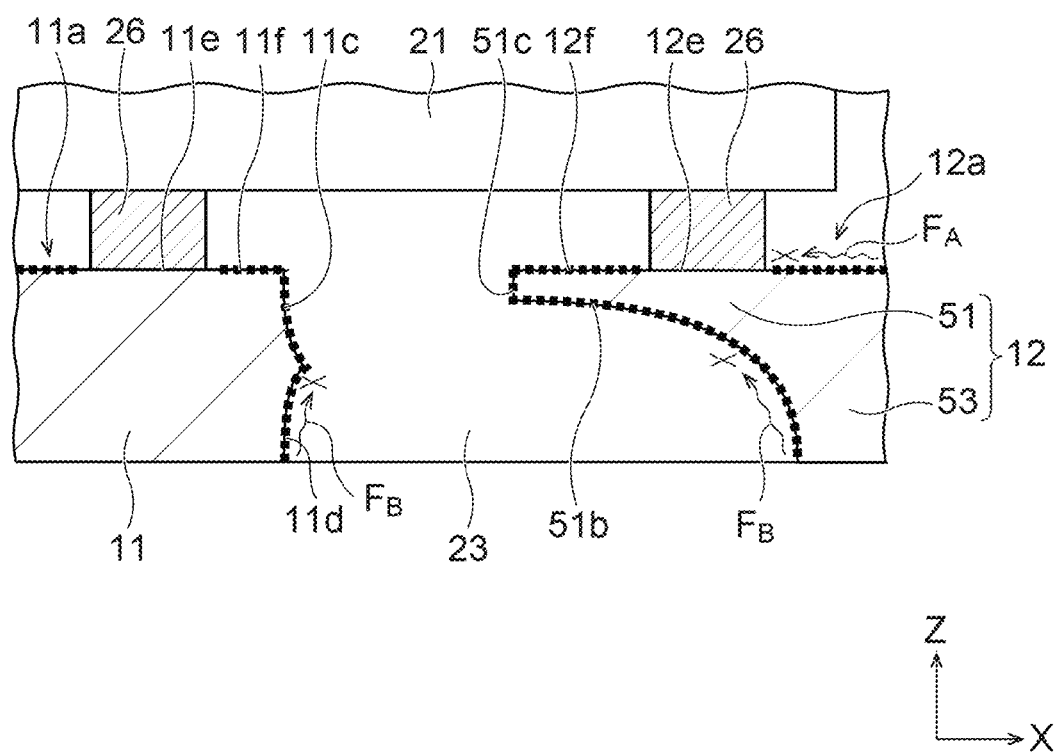

FIG. 16 is a partial enlarged cross-sectional view of a semiconductor device according to the second embodiment.

Figure 17A:
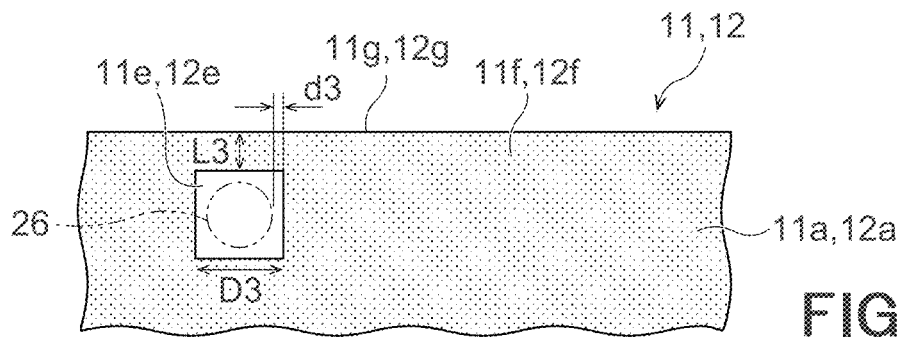
Figure 17B:
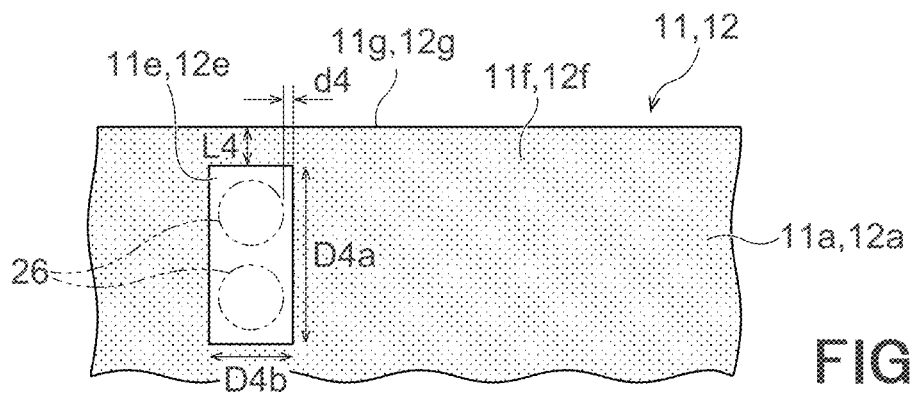
Figure 17C:
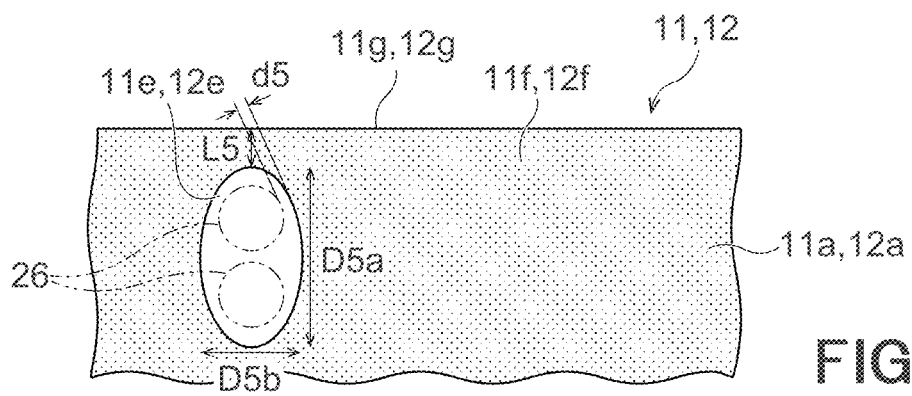
Figure 17D:
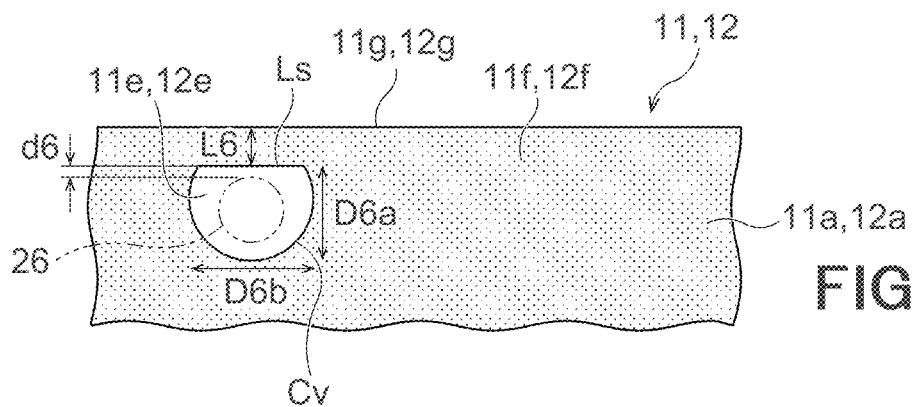

Each of FIGS. 17A and 17D is an enlarged plan view of a front surface of a die pad and a front surface of a lead portion according to a variation example of the second embodiment.

Figure 18:
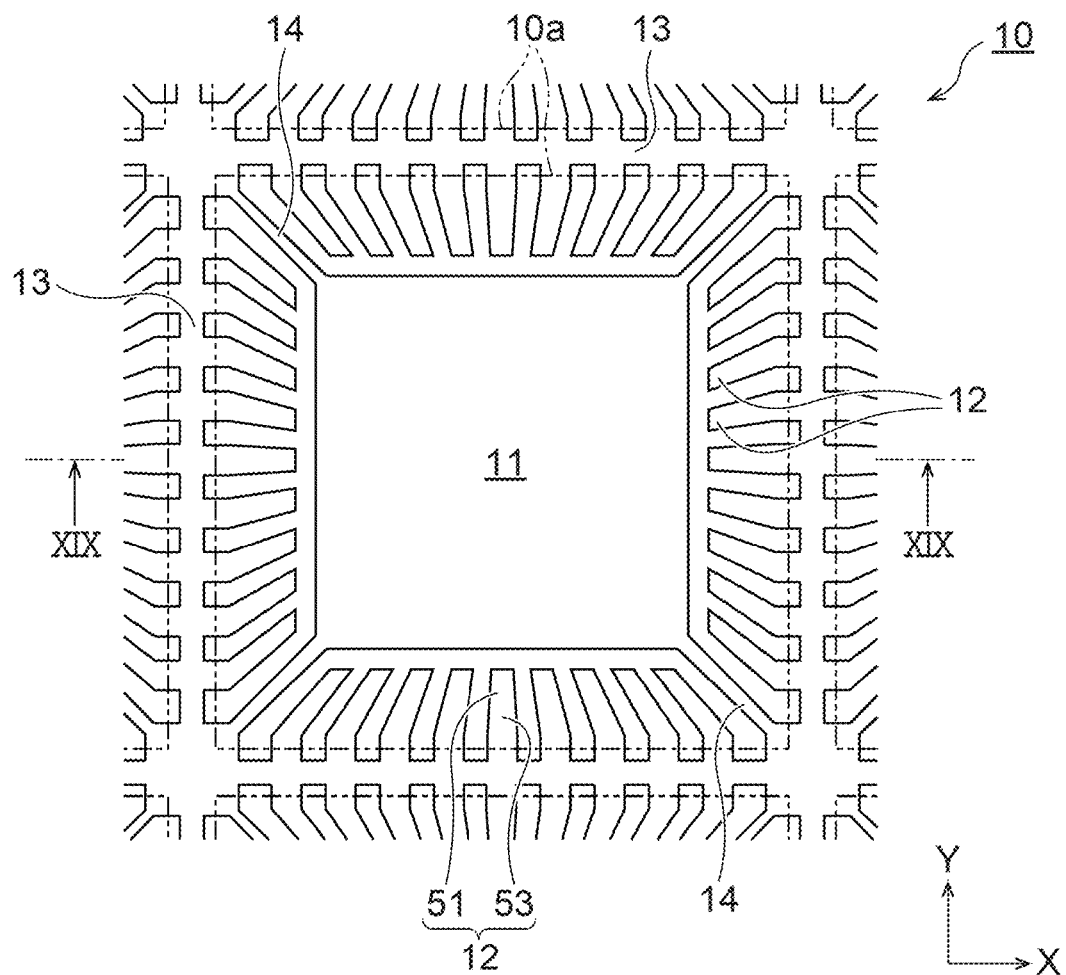

FIG. 18 is a plan view of a lead frame according to a third embodiment.

Figure 19:
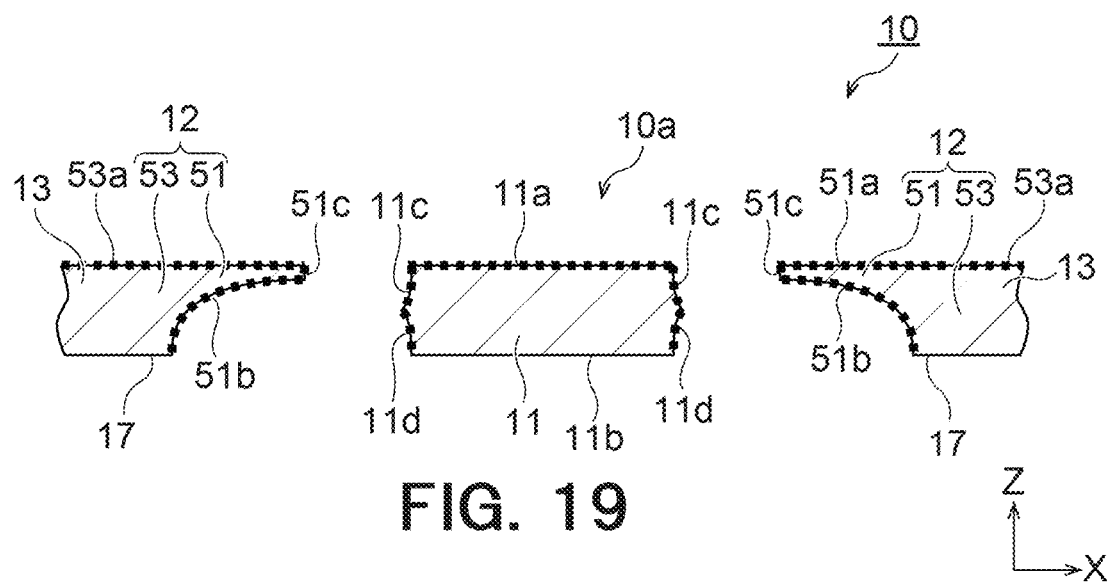

FIG. 19 is a cross-sectional view (taken along XIX-XIX of FIG. 18) of a lead frame according to the third embodiment.

Figure 20:
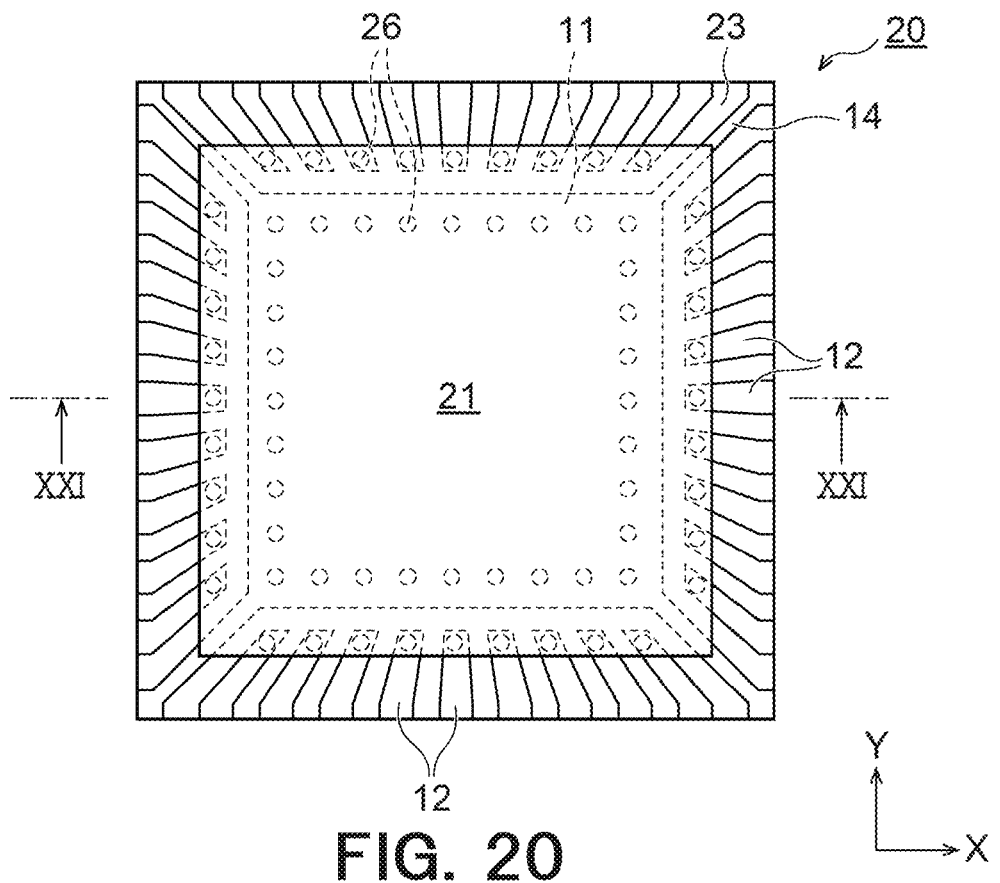

FIG. 20 is a plan view of a semiconductor device according to the third embodiment.

Figure 21:
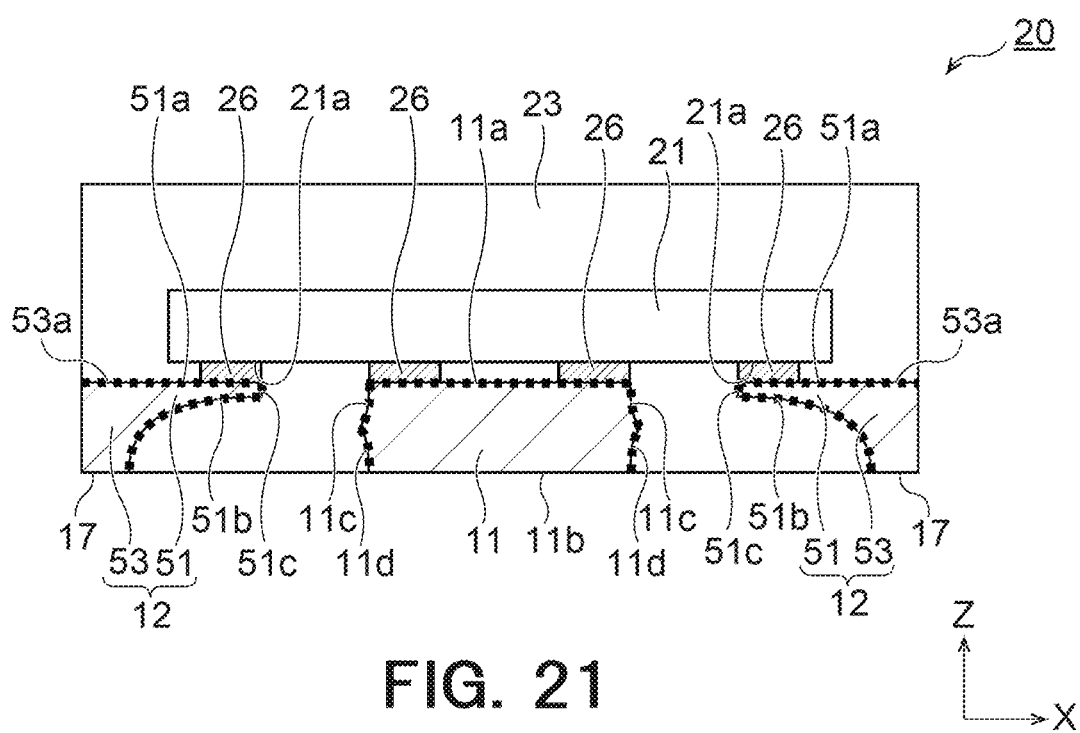

FIG. 21 is a cross-sectional view (taken along XXI-XXI of FIG. 20) of a semiconductor device according to the third embodiment.

Figure 22:
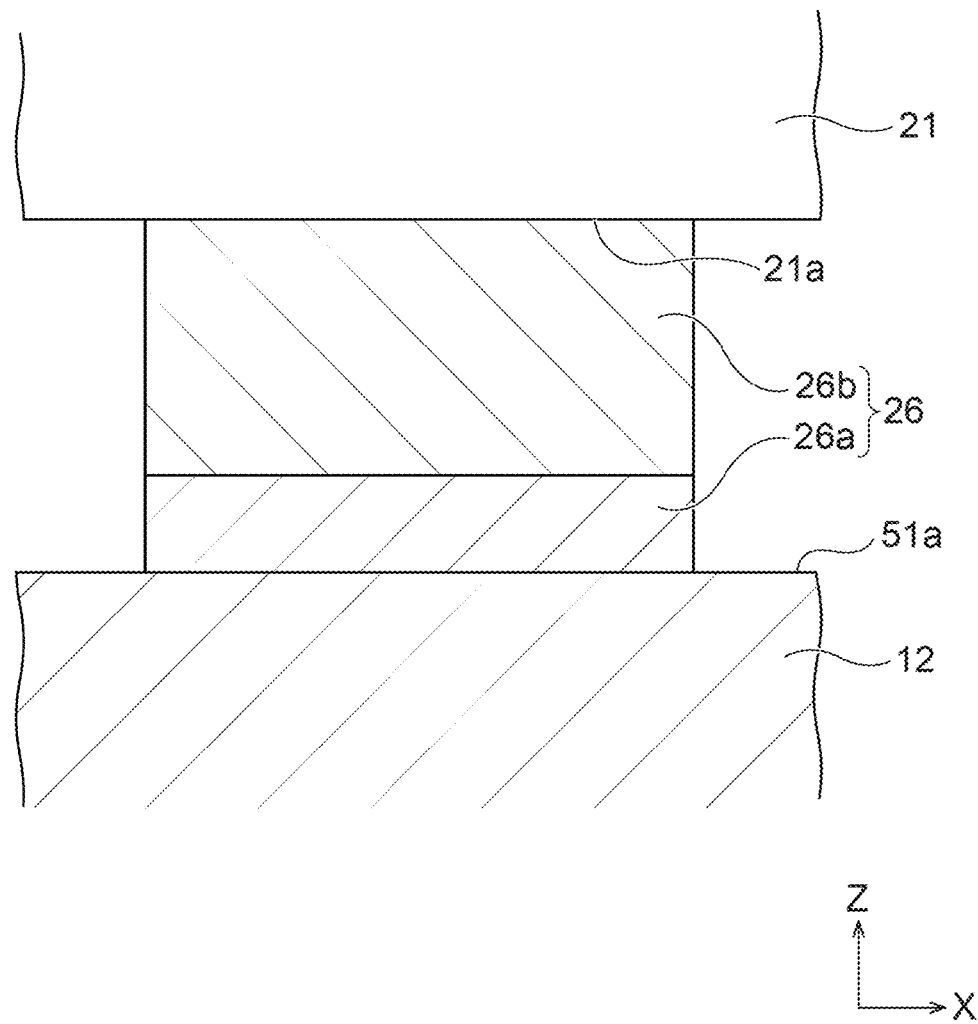
Figure 24A:
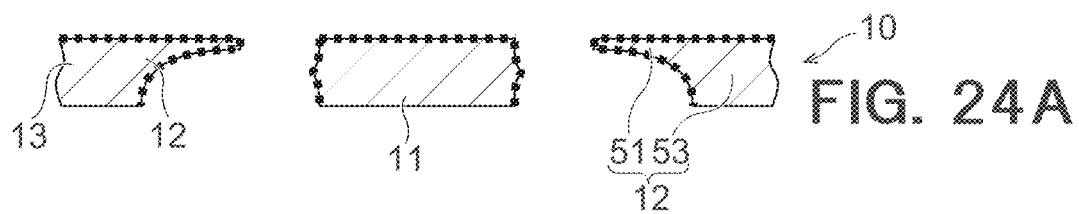
Figure 24B:
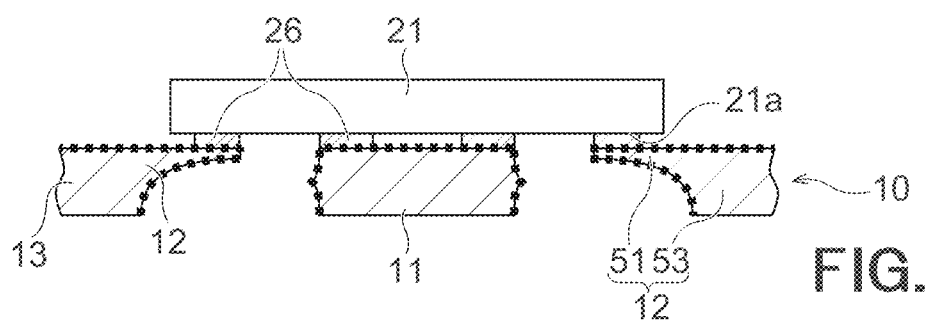
Figure 24C:
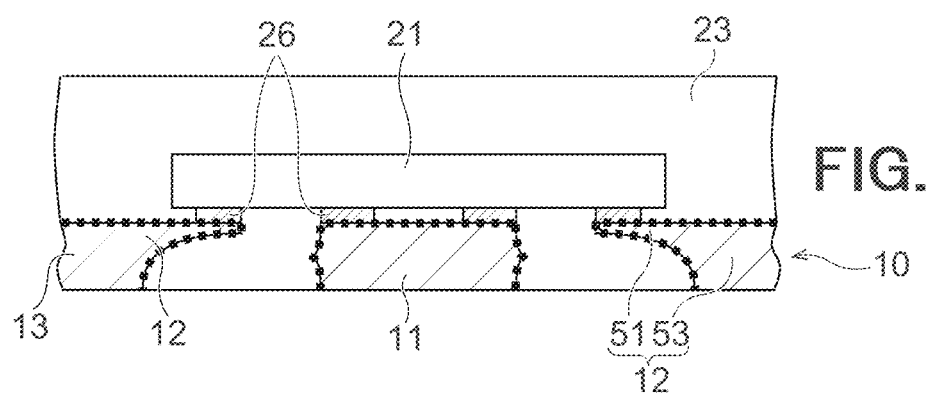
Figure 24D:
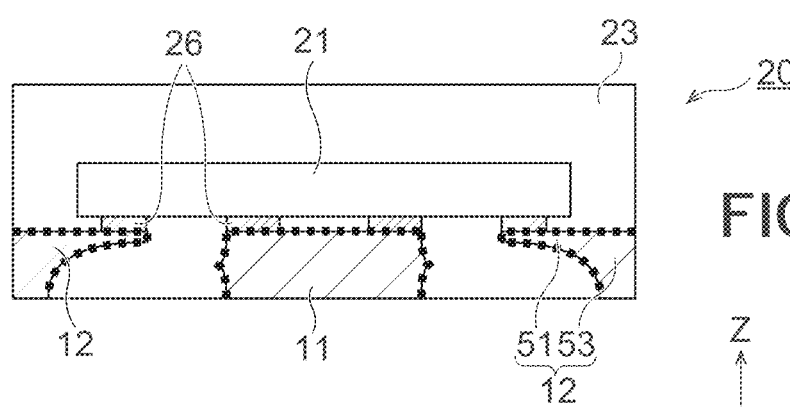

FIG. 22 is an enlarged cross-sectional view of a bump serving as a connecting portion.

FIGS. 23A to 23I are cross-sectional views of a method of manufacturing a lead frame according to the third embodiment.

FIGS. 24A to 24D are cross-sectional views of a method of manufacturing a semiconductor device according to the third embodiment.

Figure 25:
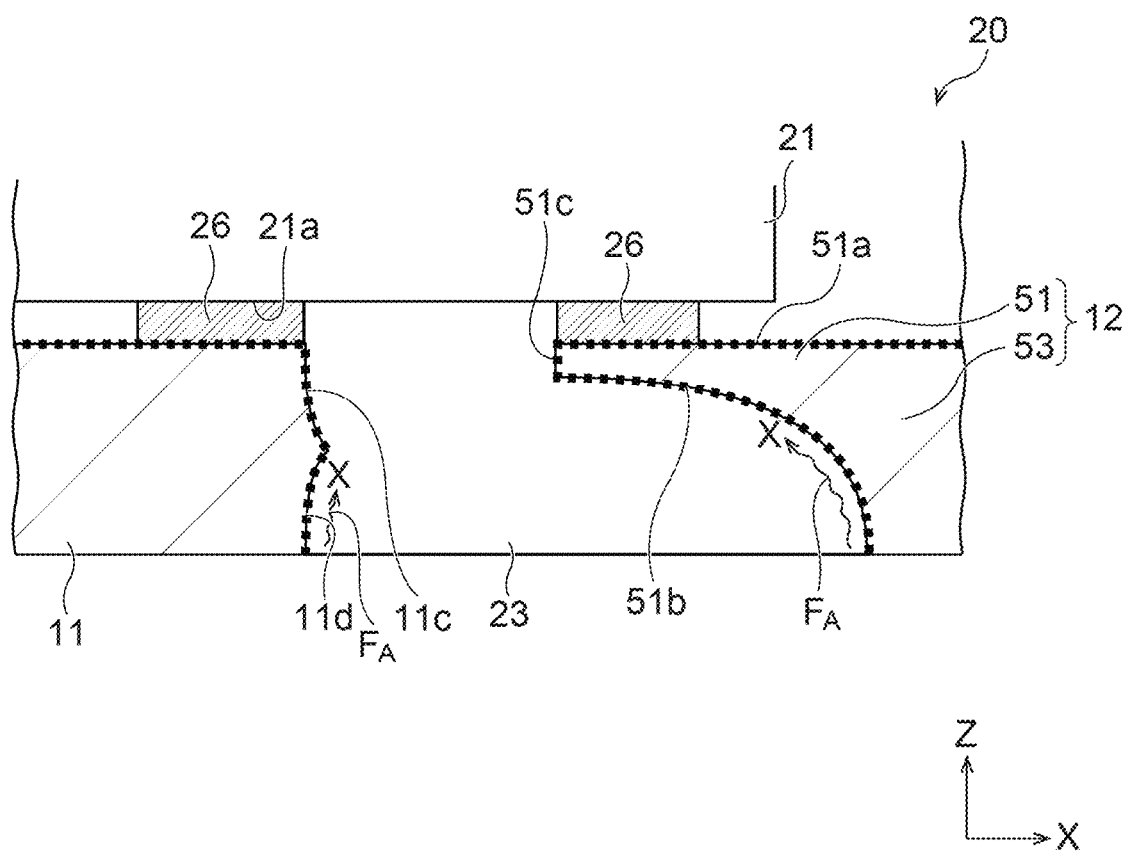

FIG. 25 is a partial enlarged cross-sectional view of a semiconductor device according to the third embodiment.

Figure 26:
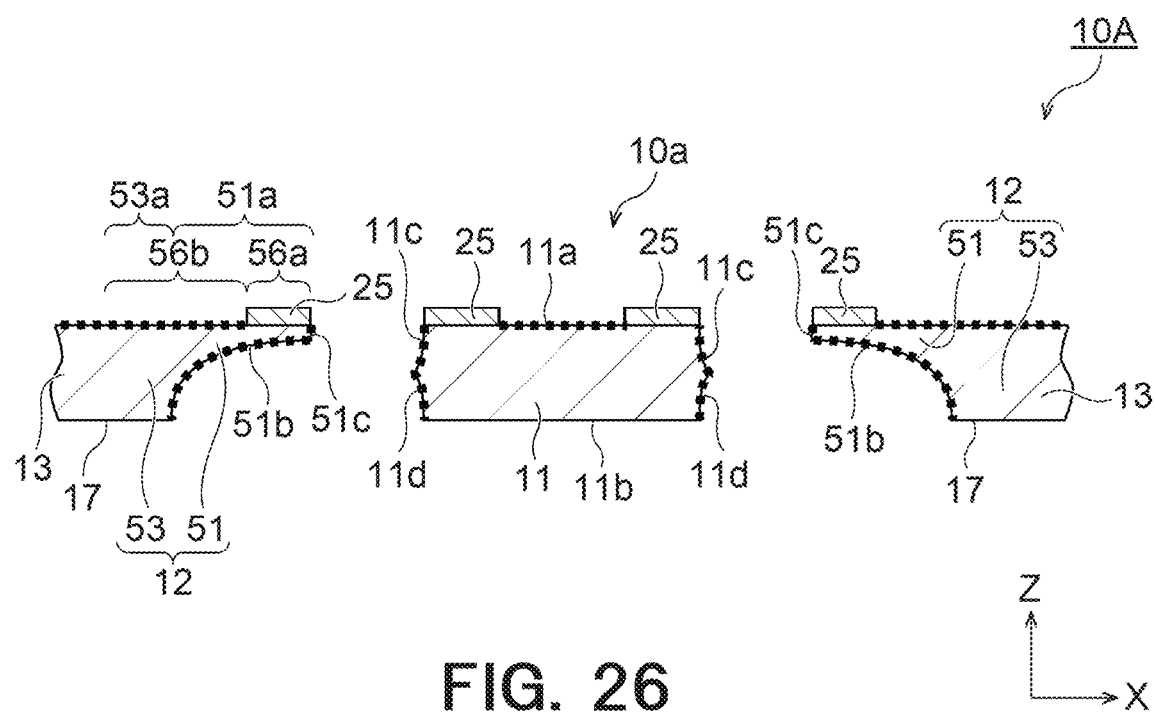

FIG. 26 is a cross-sectional view of a lead frame according to a fourth embodiment.

Figure 27:
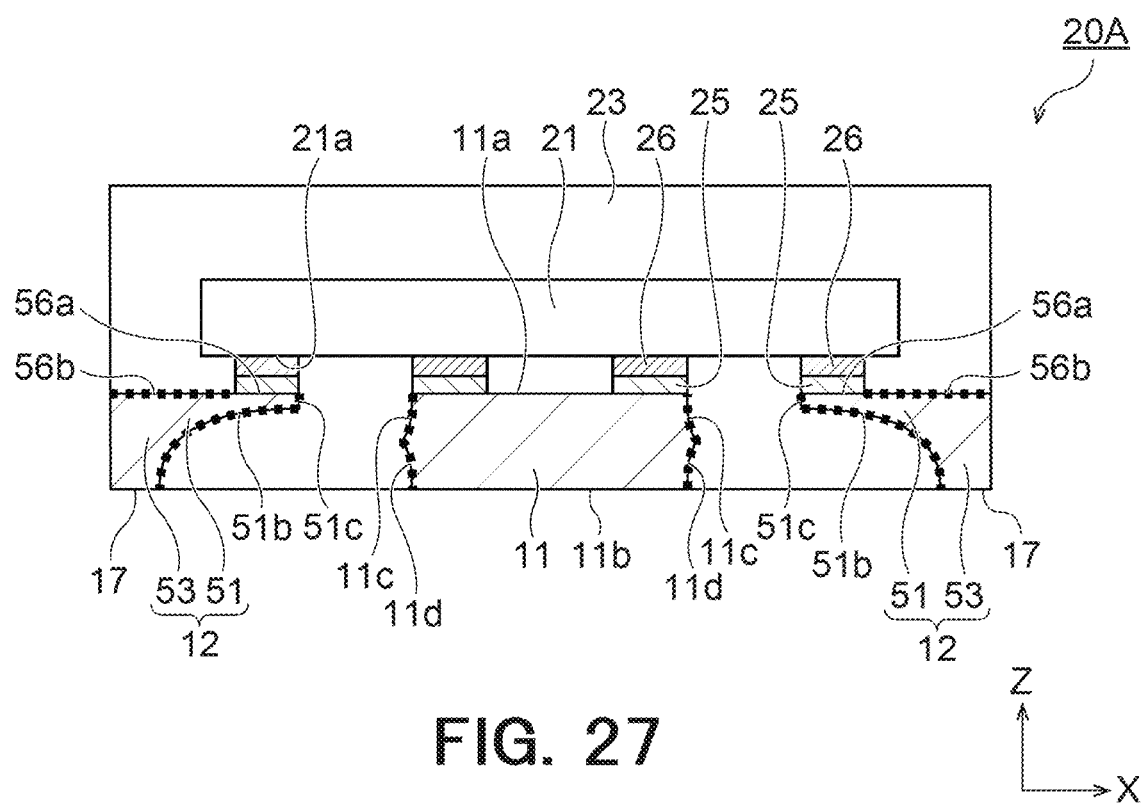

FIG. 27 is a cross-sectional view of a semiconductor device according to the fourth embodiment.

FIGS. 28A to 28J are cross-sectional views of a method of manufacturing a lead frame according to the fourth embodiment.

Figure 29:
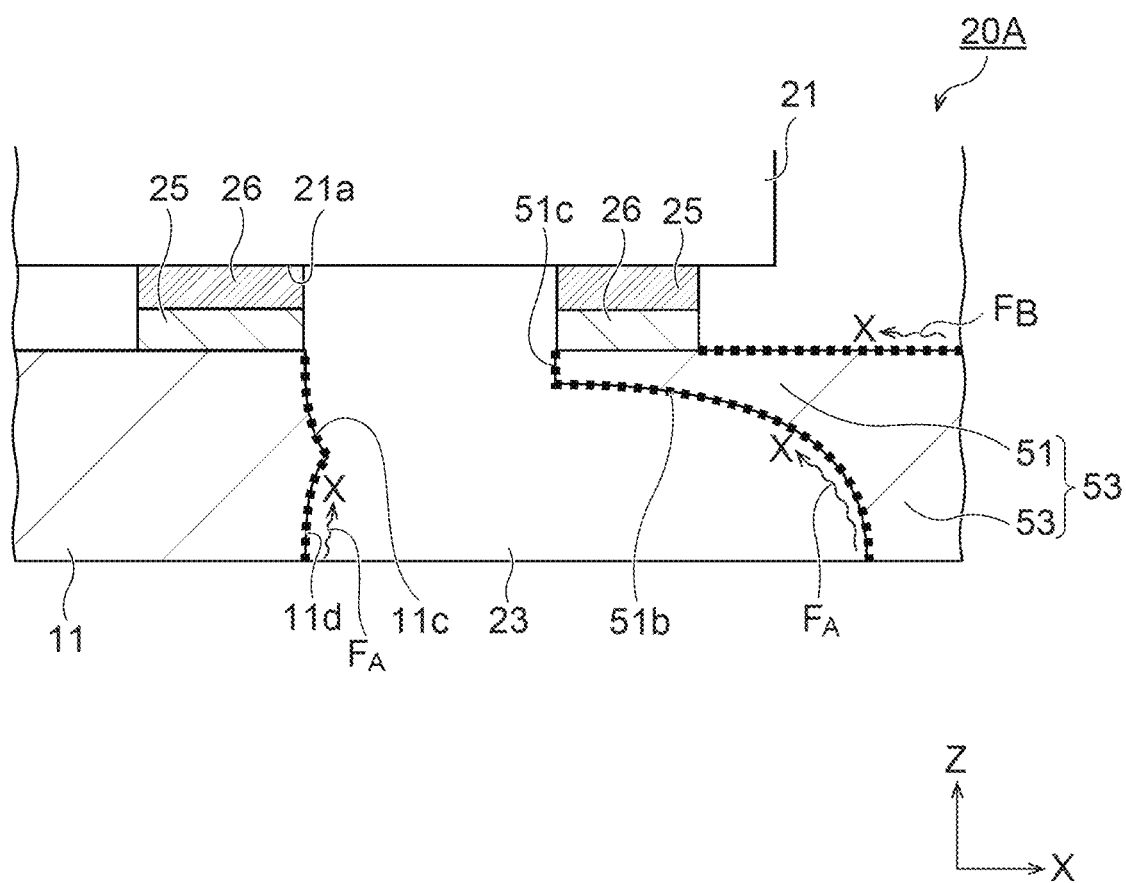

FIG. 29 is a partial enlarged cross-sectional view of a semiconductor device according to the fourth embodiment.

Figure 30:
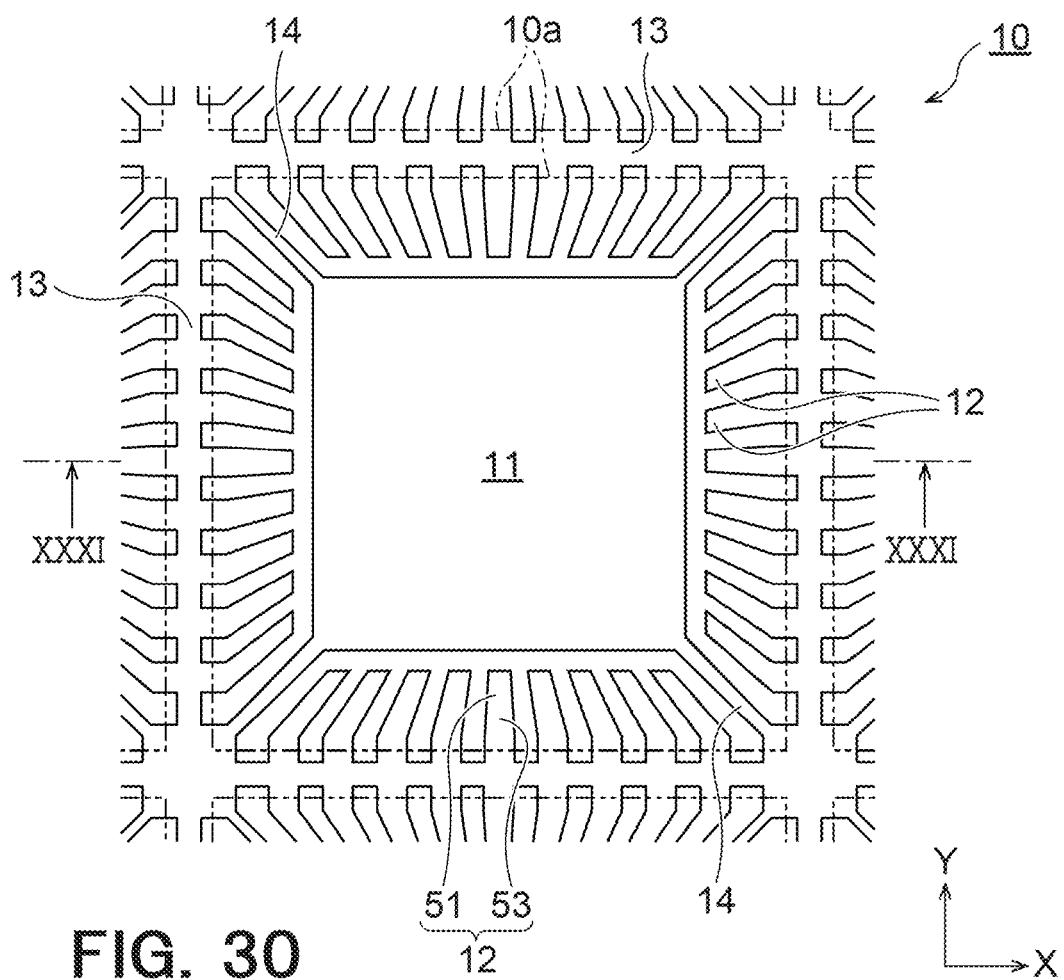

FIG. 30 is a plan view of a lead frame according to a fifth embodiment.

Figure 31:
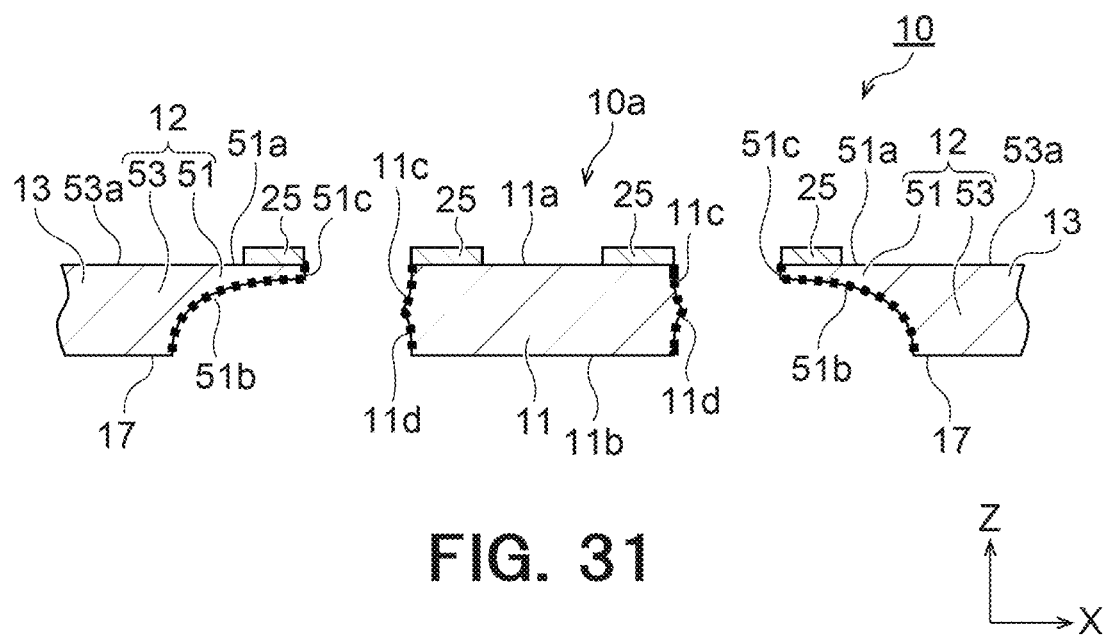

FIG. 31 is a cross-sectional view (taken along XXXI-XXXI of FIG. 30) of a lead frame according to the fifth embodiment.

Figure 32:
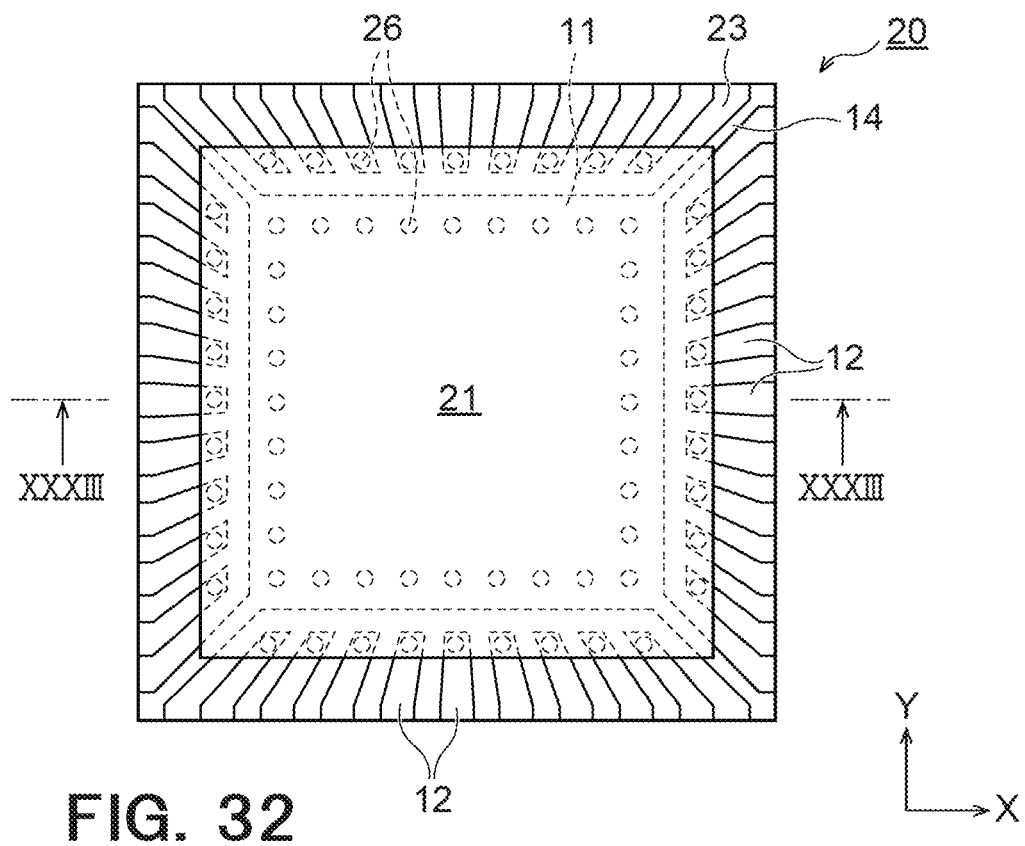

FIG. 32 is a plan view of a semiconductor device according to the fifth embodiment.

Figure 33:
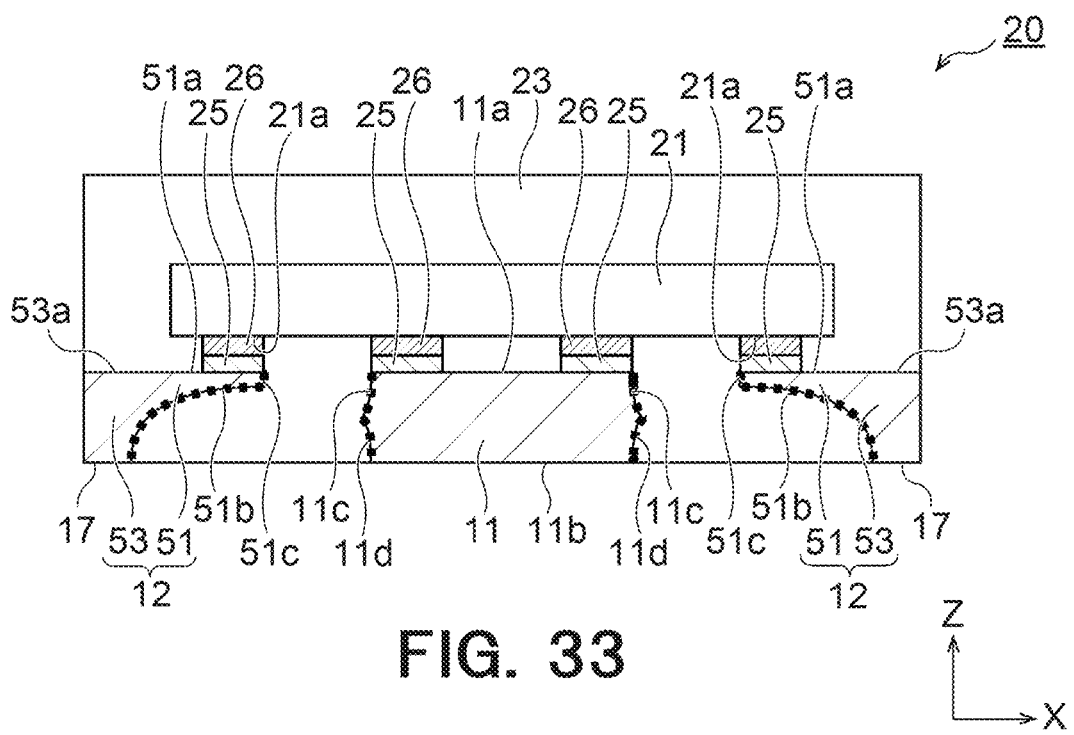

FIG. 33 is a cross-sectional view (taken along XXXIII-XXXIII of FIG. 32) of a semiconductor device according to the fifth embodiment.

Figure 34:
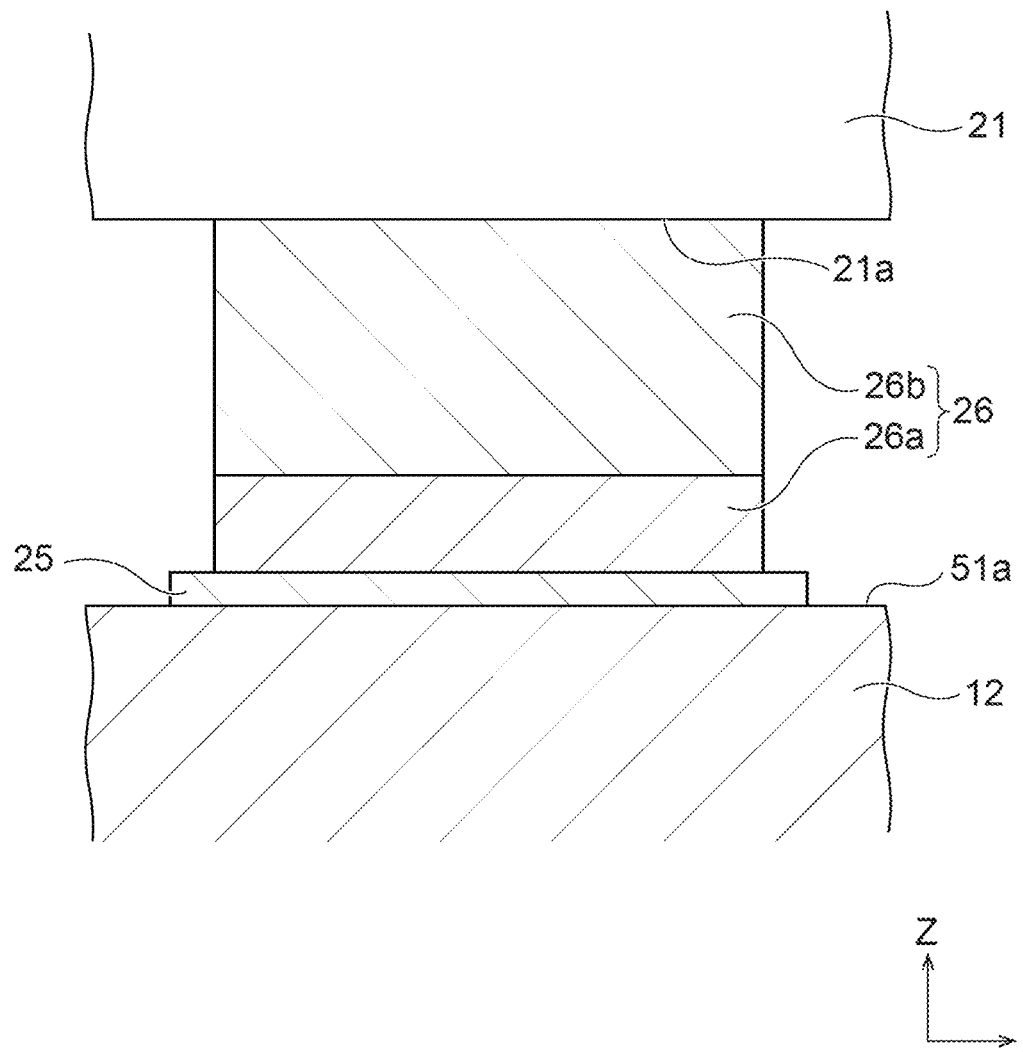

FIG. 34 is an enlarged cross-sectional view of a bump serving as a connecting portion.

FIGS. 35A to 35J are cross-sectional views of a method of manufacturing a lead frame according to the fifth embodiment.

FIGS. 36A to 36D are cross-sectional views of a method of manufacturing a semiconductor device according to the fifth embodiment.

Figure 37:
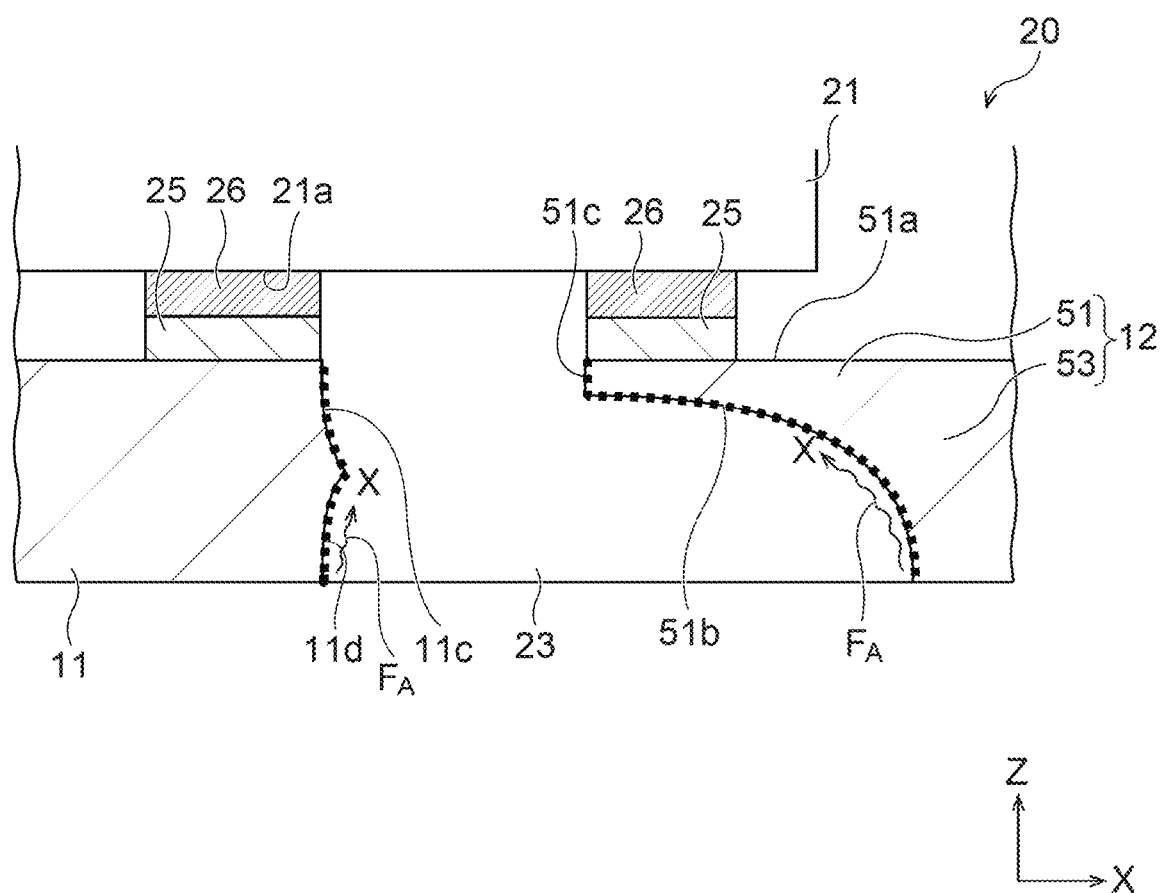

FIG. 37 is a partial enlarged cross-sectional view of a semiconductor device according to the fifth embodiment.

Figure 38:
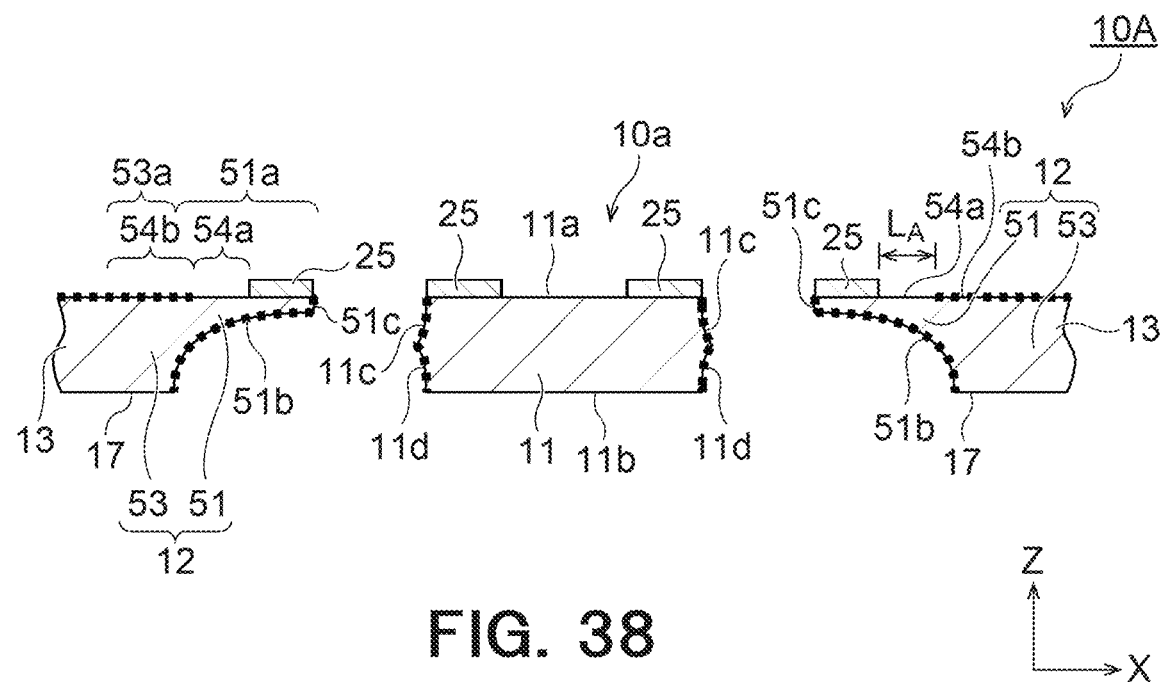

FIG. 38 is a cross-sectional view of a lead frame according to a sixth embodiment.

Figure 39:
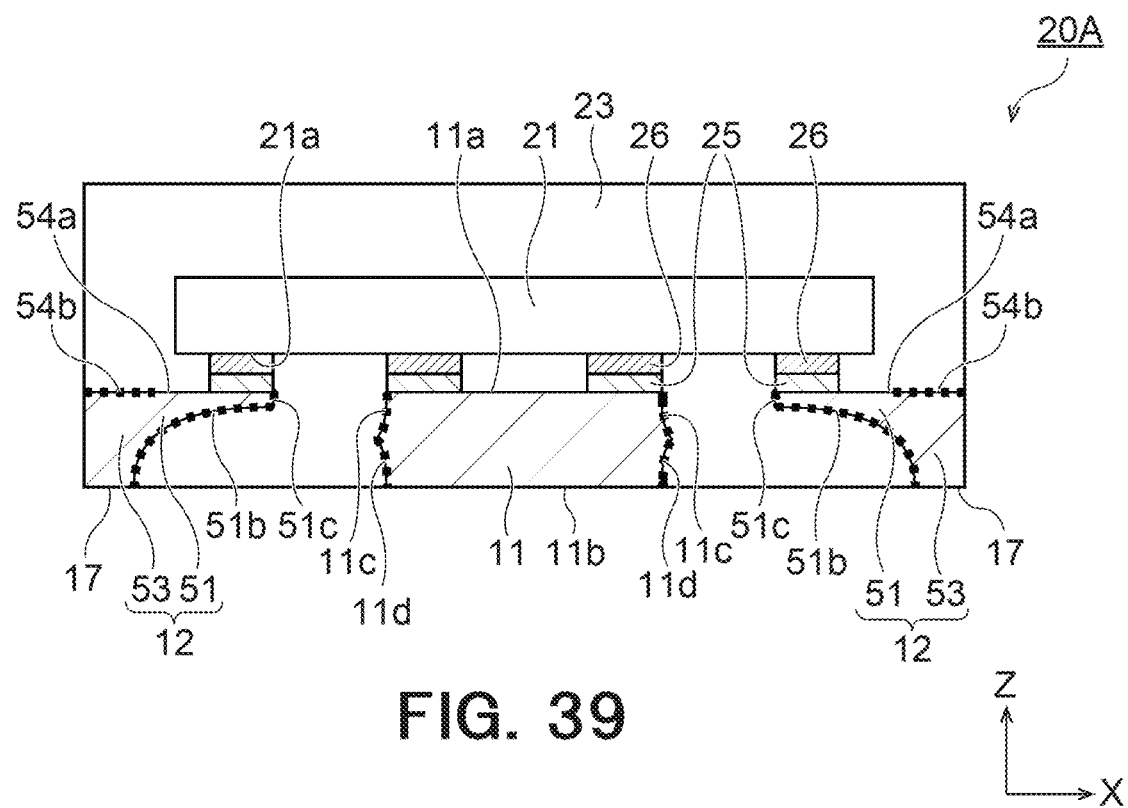
Figure 40A:
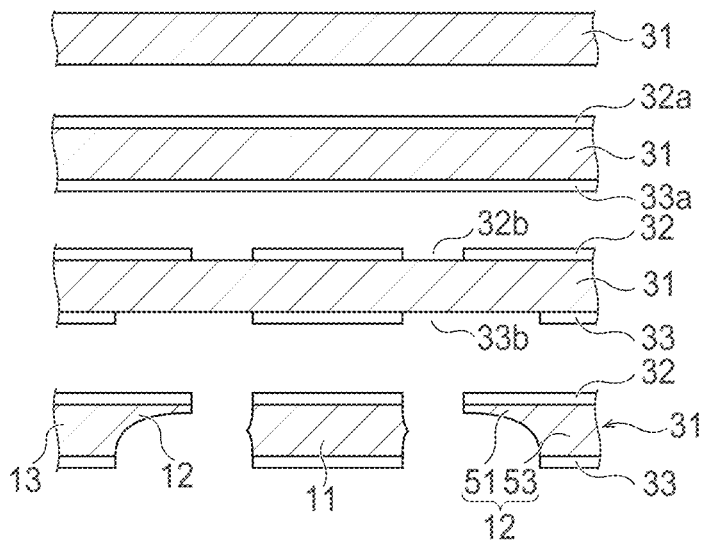

FIG. 39 is a cross-sectional view of a semiconductor device according to the sixth embodiment.

FIGS. 40A to 40J are cross-sectional views of a method of manufacturing a lead frame according to the sixth embodiment.

Figure 41:
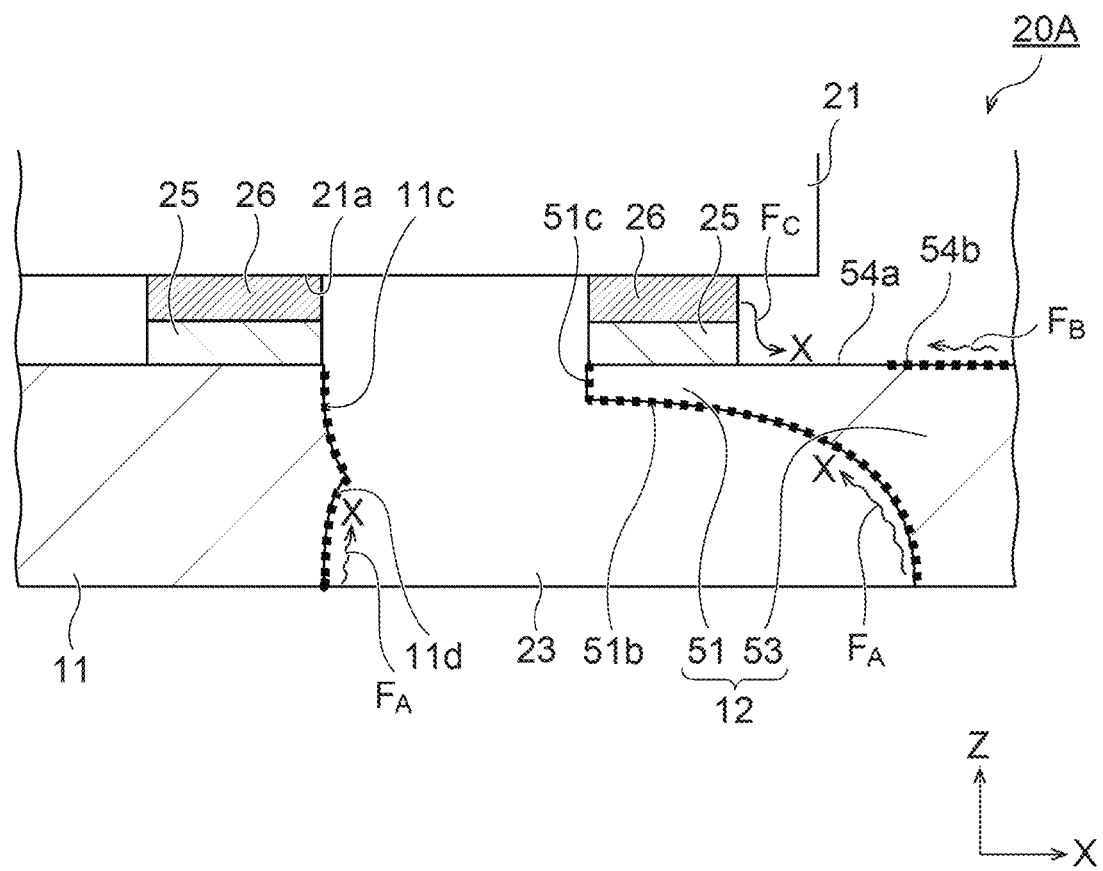

FIG. 41 is a partial enlarged cross-sectional view of a semiconductor device according to the sixth embodiment.

Figure 42:
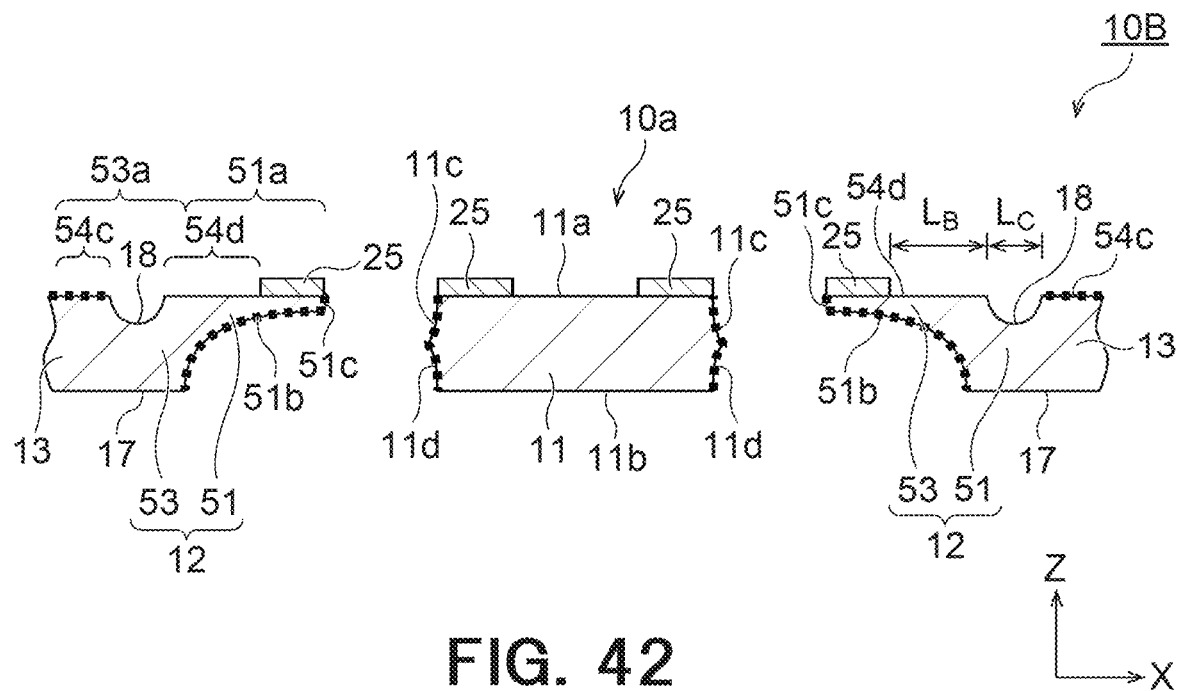

FIG. 42 is a cross-sectional view of a lead frame according to a seventh embodiment.

Figure 43:
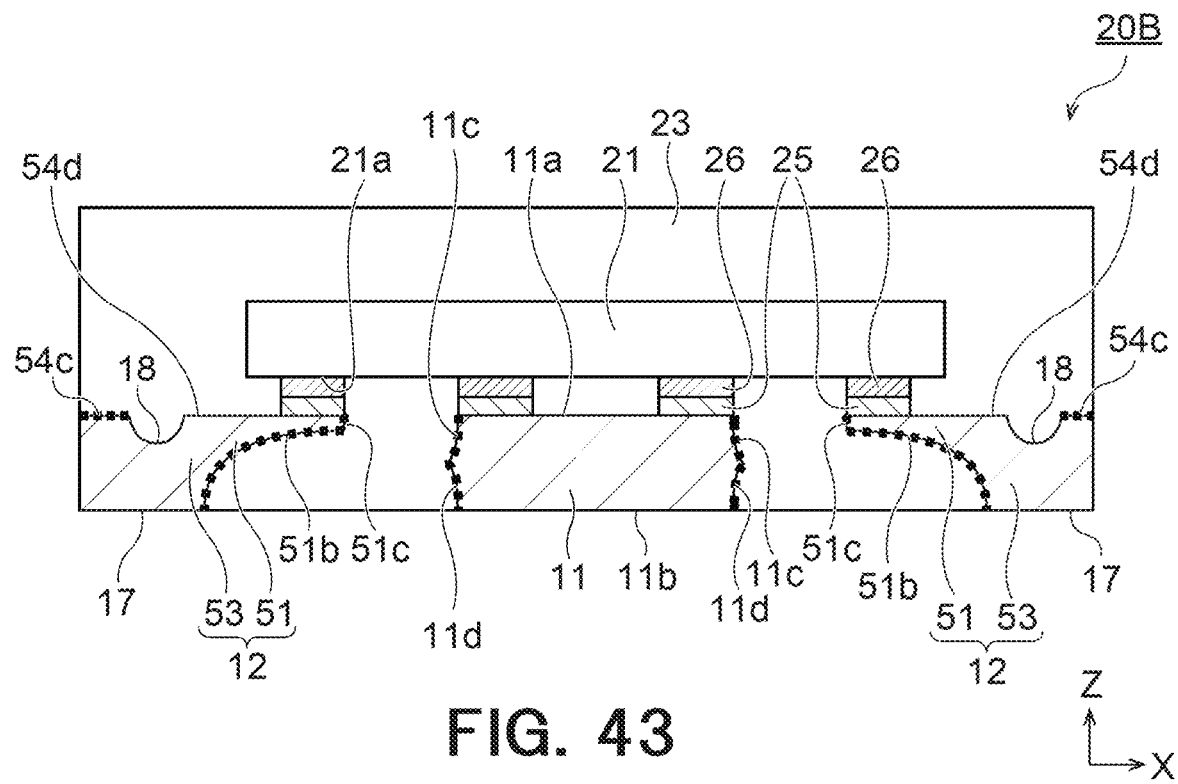
Figure 44:
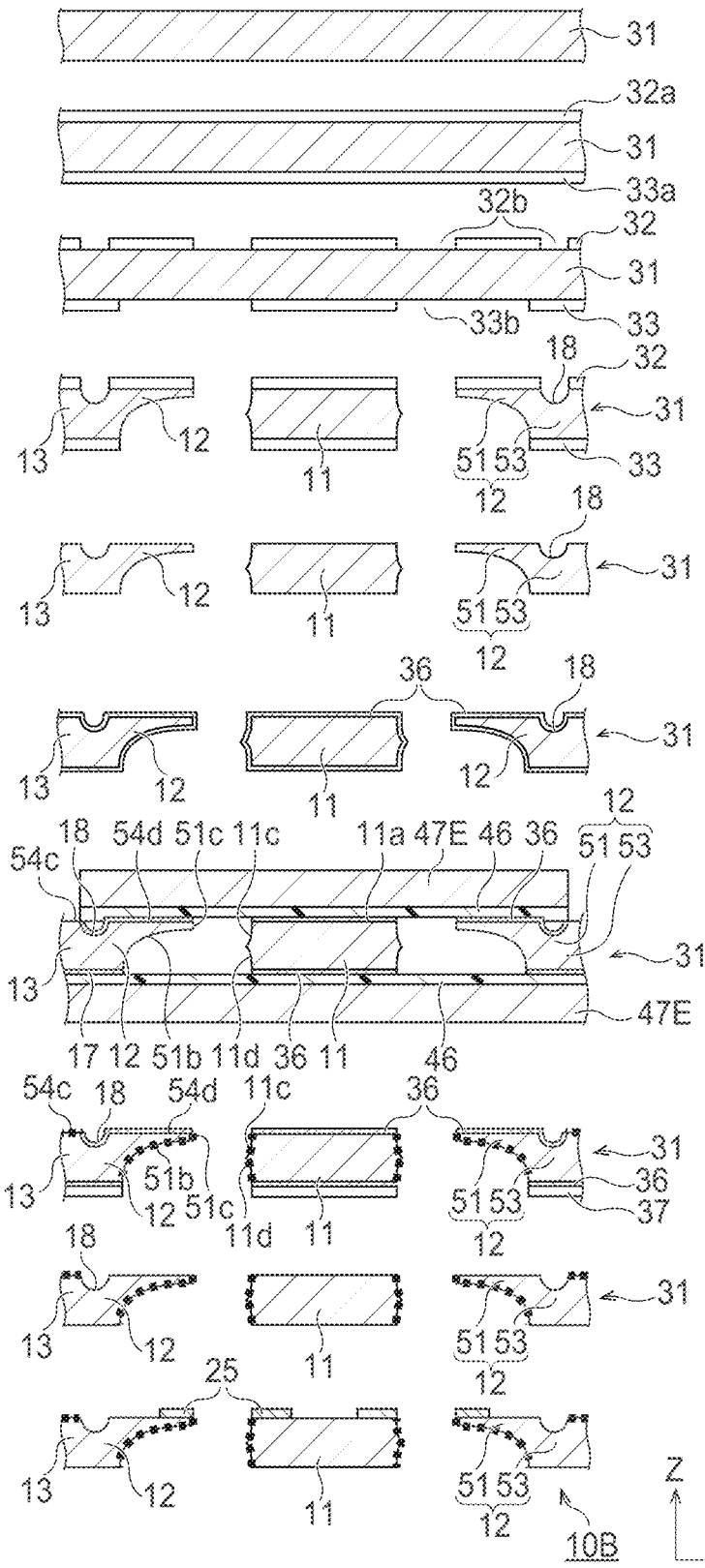

FIG. 43 is a cross-sectional view of a semiconductor device according to the seventh embodiment.

FIGS. 44A to 44J are cross-sectional views of a method of manufacturing a lead frame according to the seventh embodiment.

Figure 45:
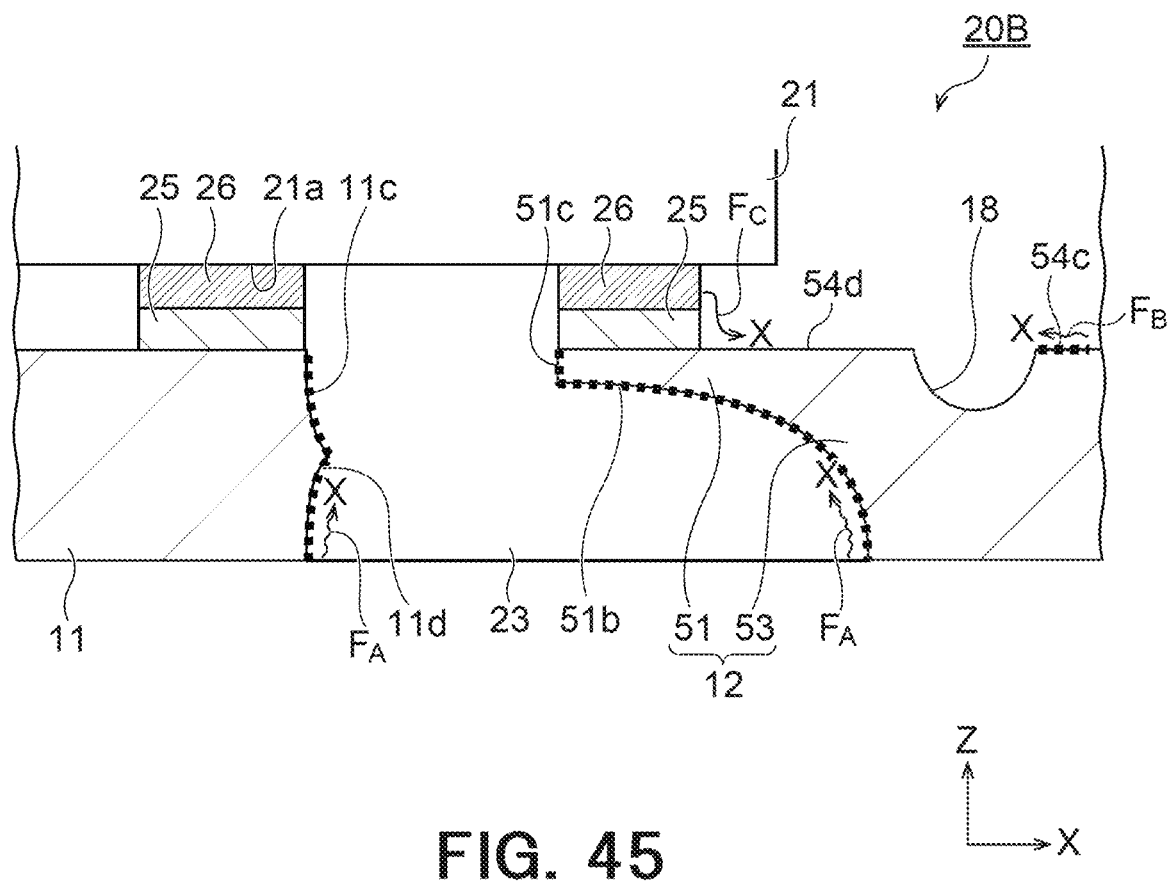

FIG. 45 is a partial enlarged cross-sectional view of a semiconductor device according to the seventh embodiment.

Figure 46:
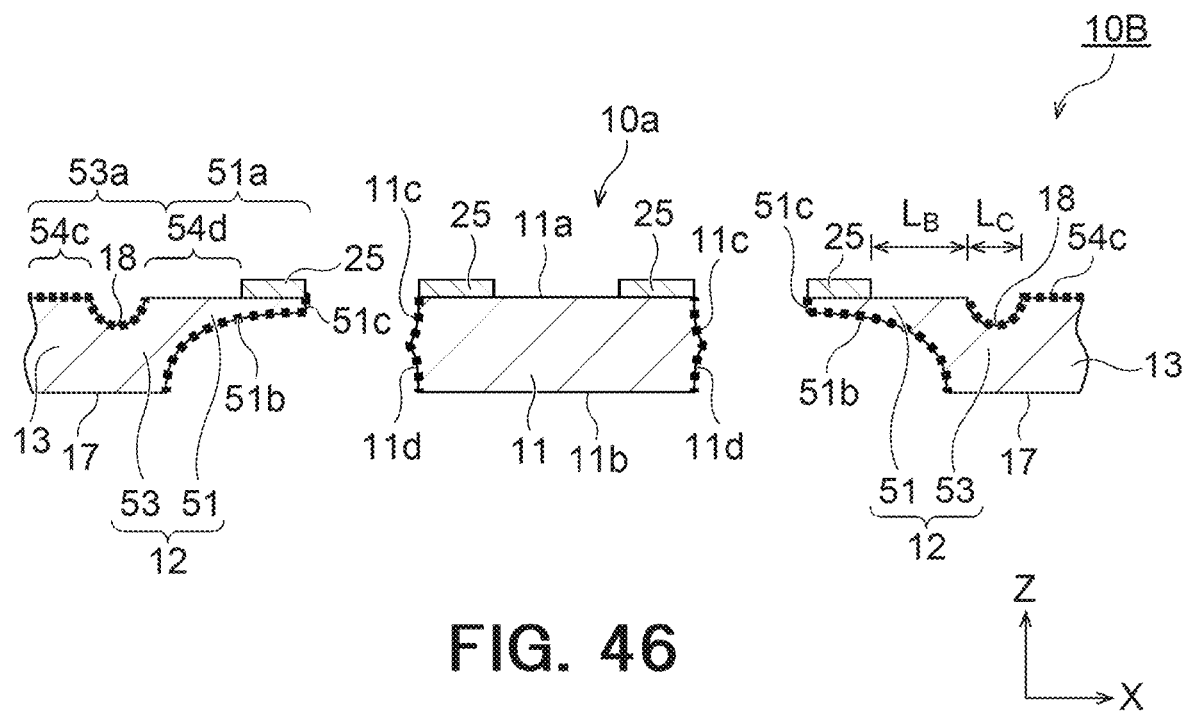

FIG. 46 is a cross-sectional view of a lead frame according to an eighth embodiment.

Figure 47:
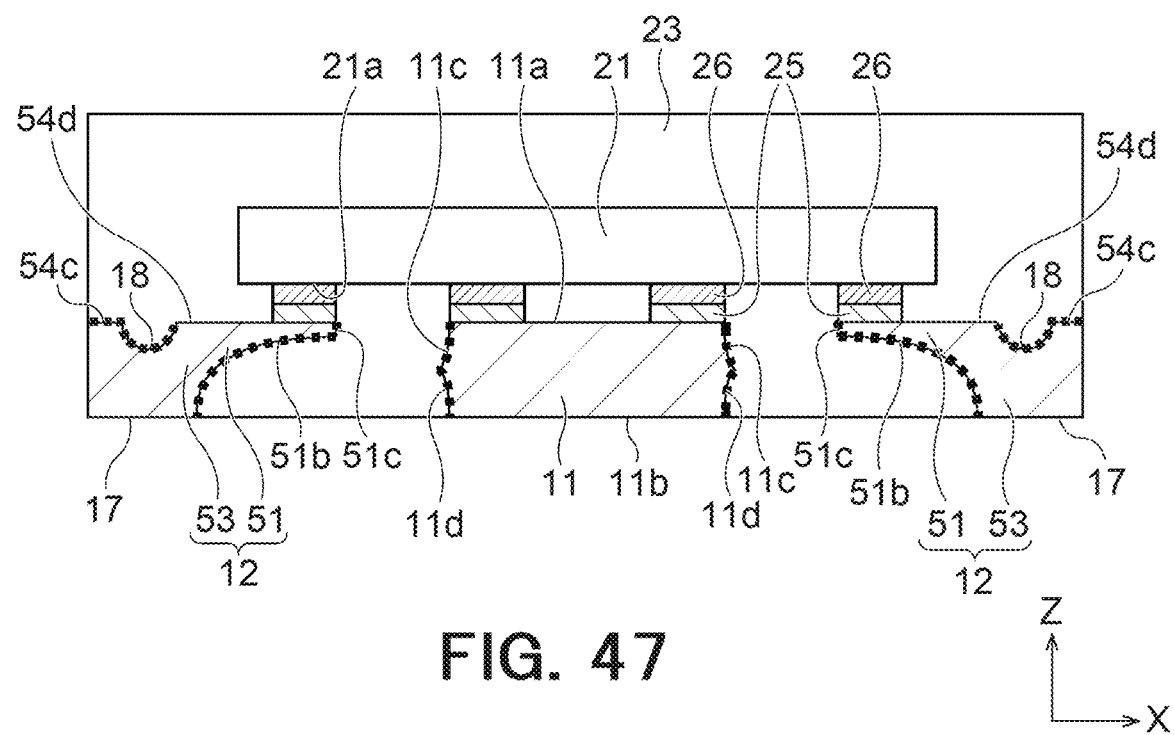
Figure 48:
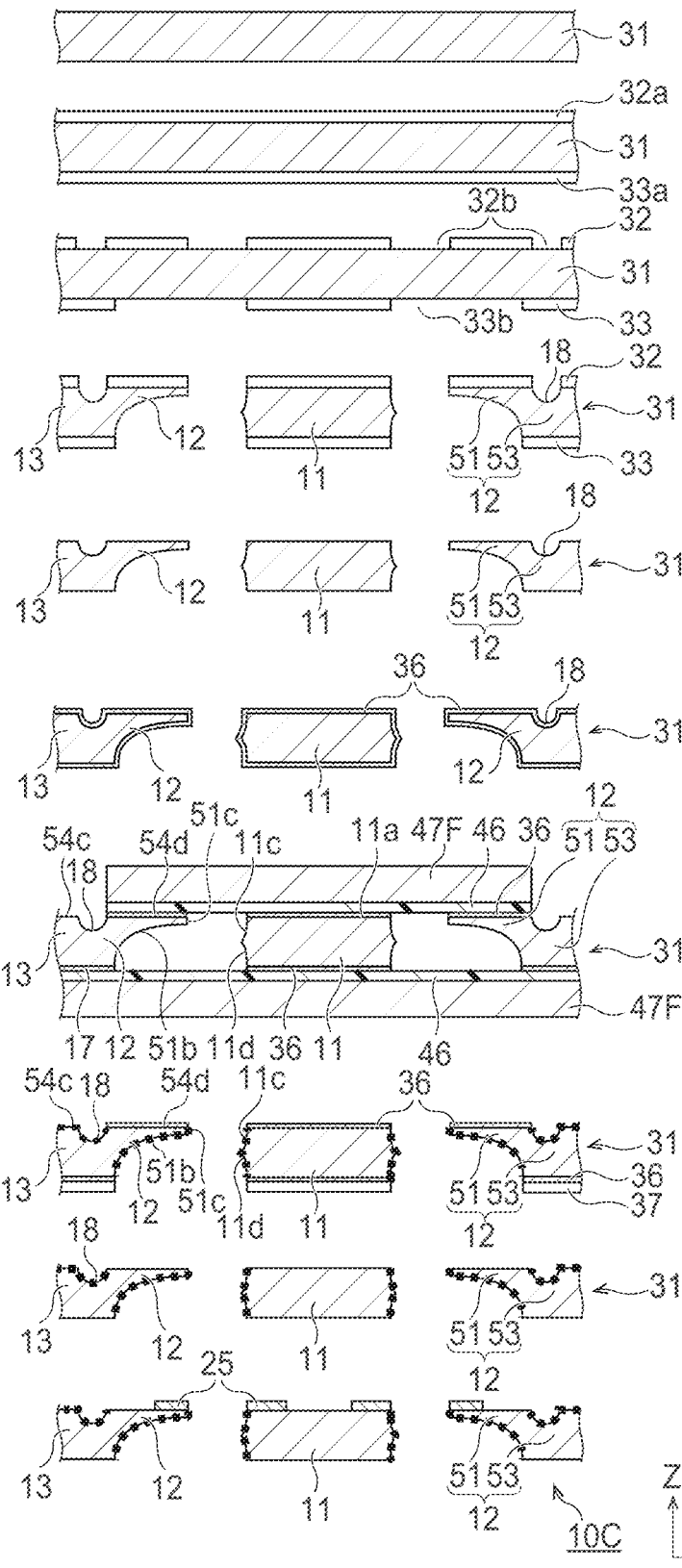

FIG. 47 is a cross-sectional view of a semiconductor device according to the eighth embodiment.

FIGS. 48A to 48J are cross-sectional views of a method of manufacturing a lead frame according to the eighth embodiment.

Figure 49:
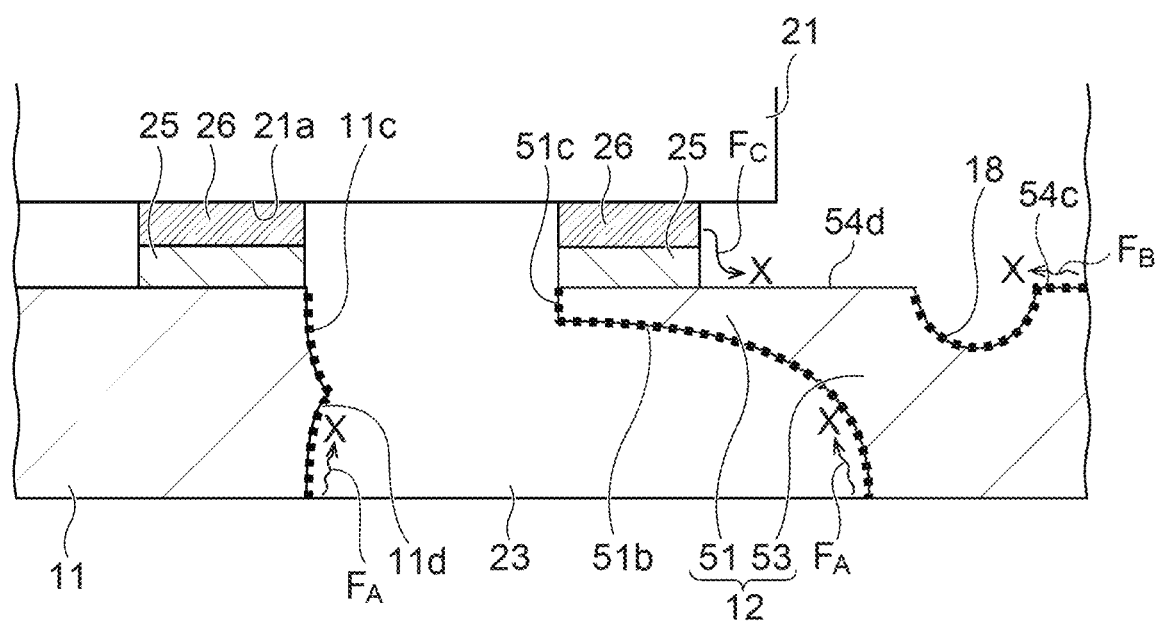

FIG. 49 is a partial enlarged cross-sectional view of a semiconductor device according to the eighth embodiment.

Figure 50:
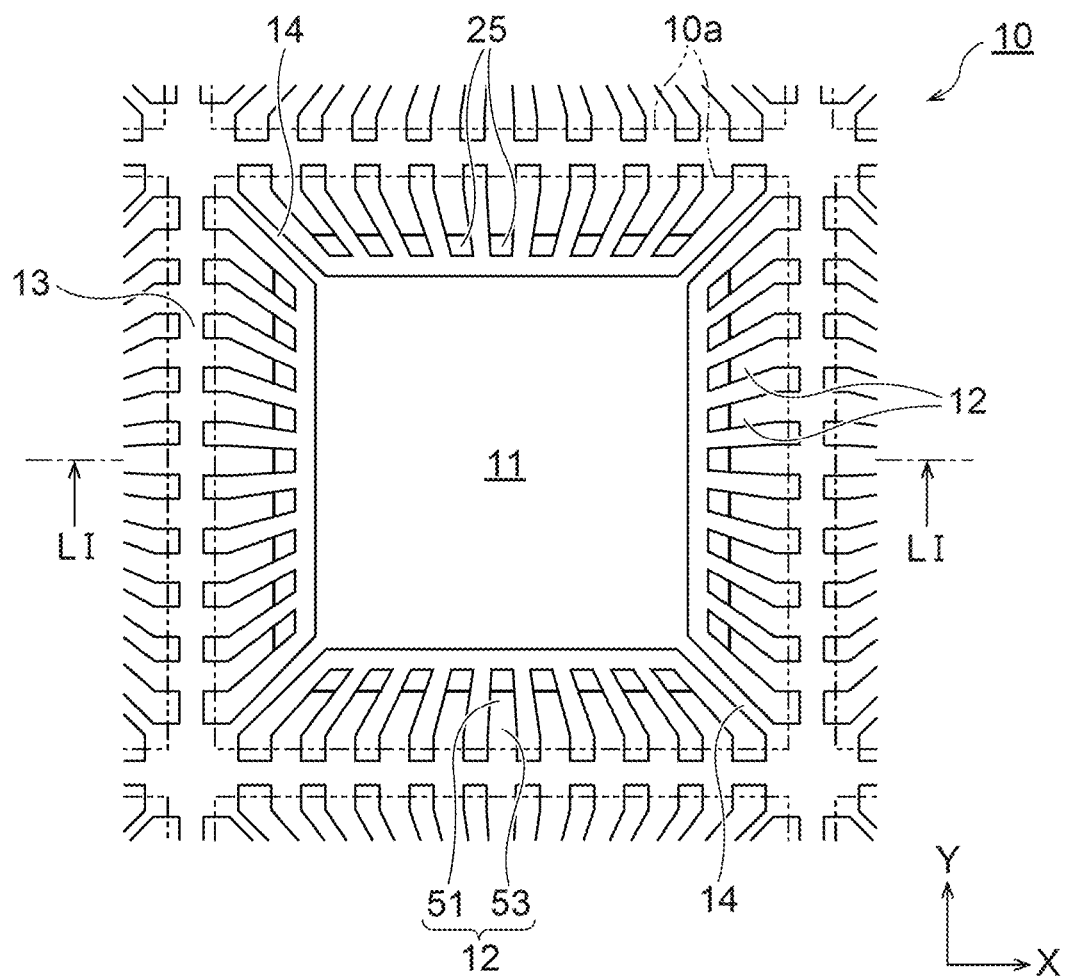

FIG. 50 is a plan view of a lead frame according to a ninth embodiment.

Figure 51:
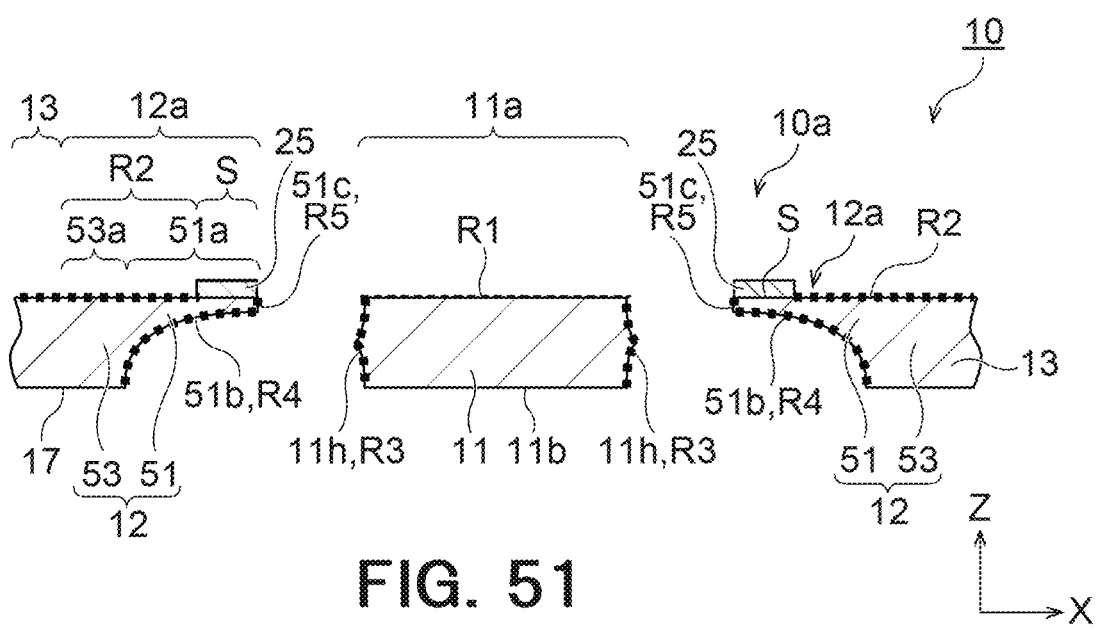

FIG. 51 is a cross-sectional view (taken along LI-LI of FIG. 50) of a lead frame according to the ninth embodiment.

Figure 52:
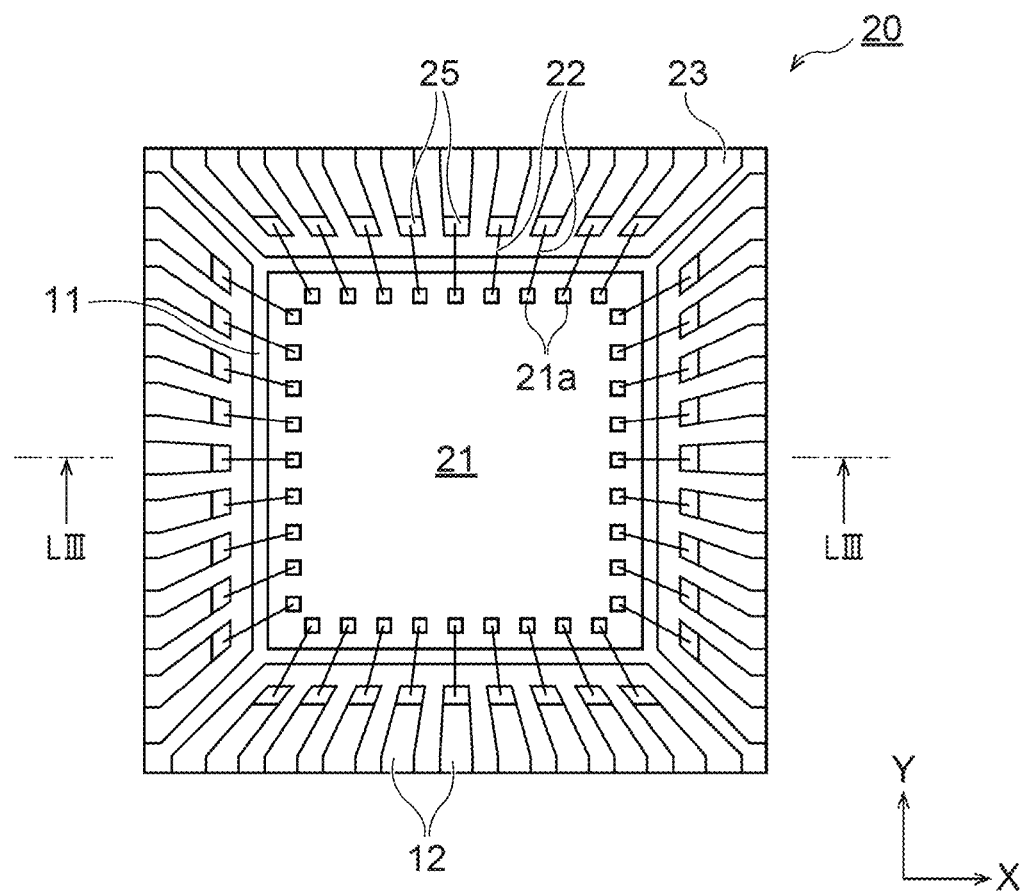

FIG. 52 is a plan view of a semiconductor device according to the ninth embodiment.

Figure 53:
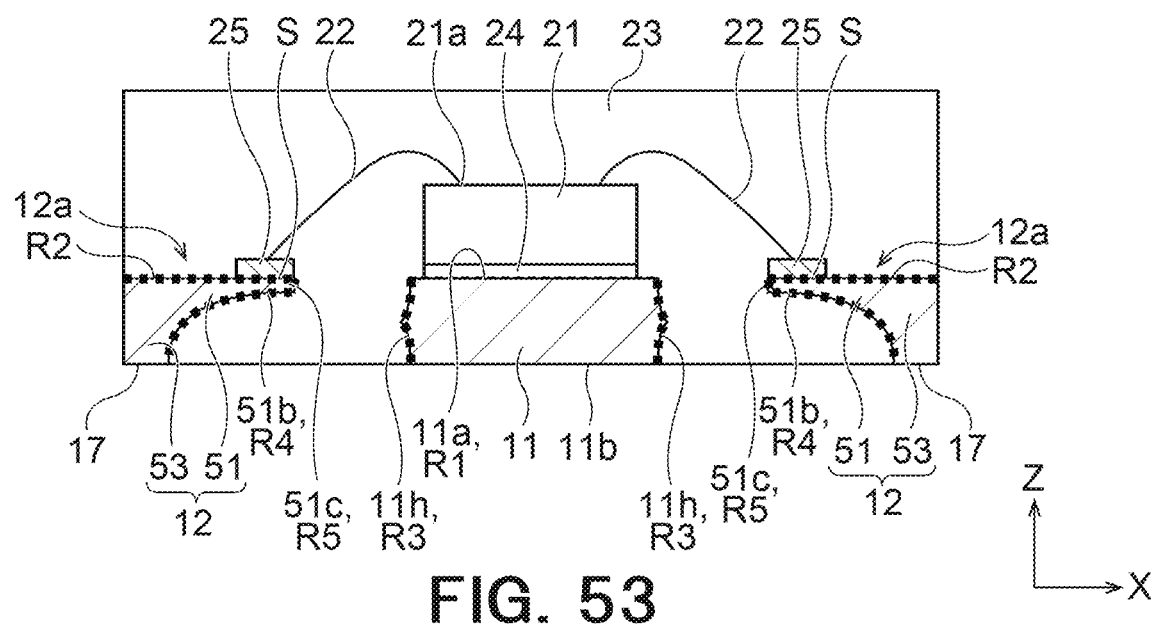

FIG. 53 is a cross-sectional view (taken along LIII-LIII of FIG. 52) of a semiconductor device according to the ninth embodiment.

FIGS. 54A to 54E are cross-sectional views of a method of manufacturing a lead frame according to the ninth embodiment.

FIGS. 55A to 55H are cross-sectional views of a method of manufacturing a lead frame according to the ninth embodiment.

FIGS. 56A to 56E are cross-sectional views of a method of manufacturing a semiconductor device according to the ninth embodiment.

Figure 57:
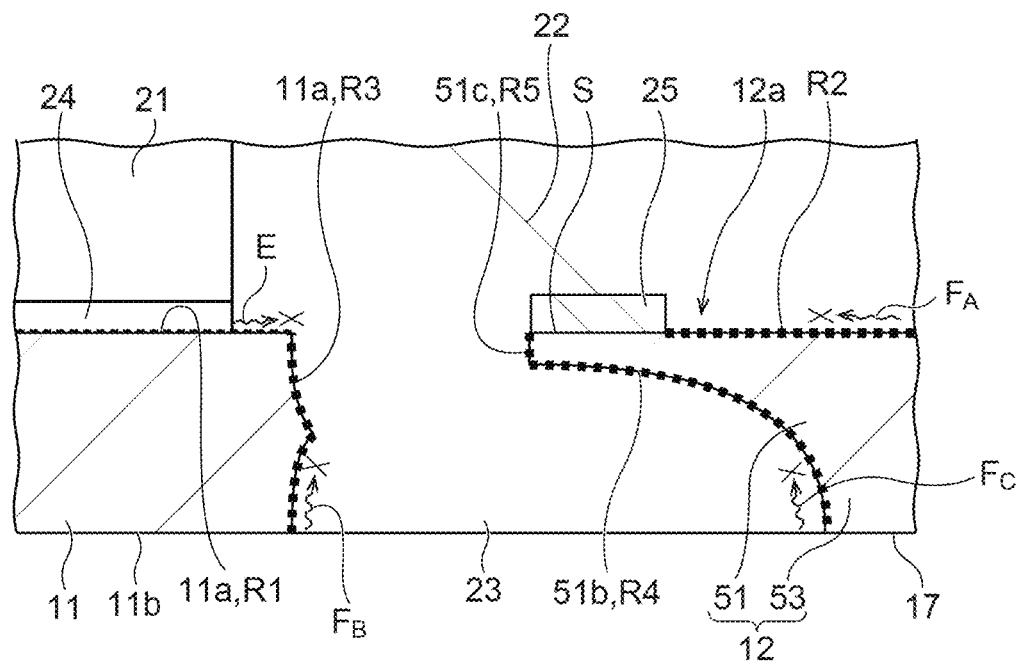

FIG. 57 is a partial enlarged cross-sectional view of a semiconductor device according to the ninth embodiment.

Figure 58:
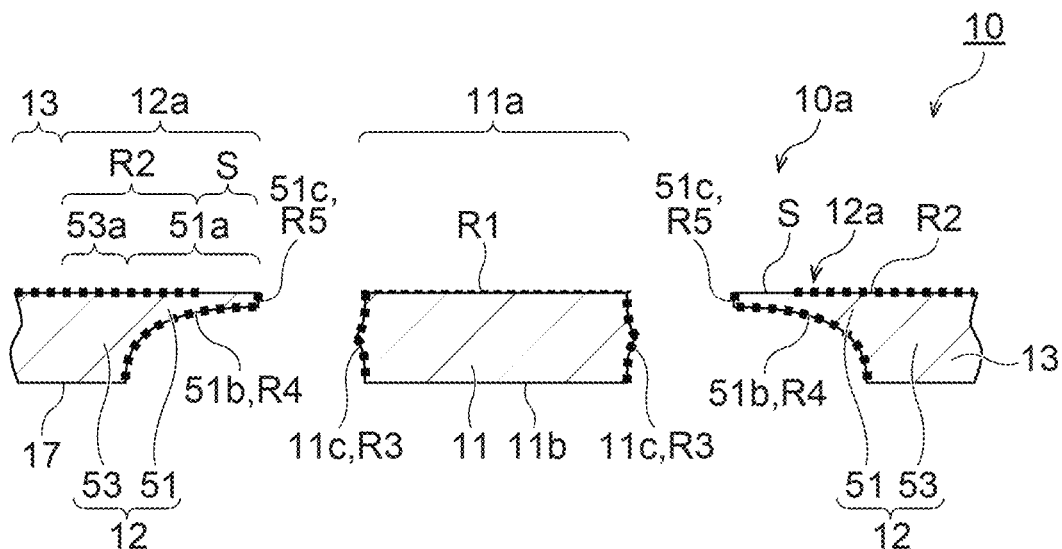

FIG. 58 is a cross-sectional view of a lead frame according to a variation example of the ninth embodiment.

DESCRIPTION OF EMBODIMENTS

First Embodiment

With reference to FIGS. 1 to 7D, a first embodiment will be described below. Embodiments of the present disclosure will be described below while referring to the drawings. The drawings are schematic or conceptual, and the illustrated size of each member, the illustrated ratio in size between members, and the like are not necessarily limited to an actual size, an actual ratio in size, and the like. Even for the same member, etc., the illustrated size or the illustrated ratio may differ from a certain drawing to another, in the drawings attached to this description, for easier understanding, the shape, scale, vertical/horizontal size ratio, etc. of each portion may be altered from an actual shape, etc. or may be exaggerated.

Each numerical range expressed using a word "to" in this description, etc., means a range that includes a numerical value preceding the word "to" as its lower limit value and includes a numerical value succeeding the word "to" as its upper limit value. Furthermore, terms such as "film", "sheet", and "plate" in this description, etc. are not distinguished from one another based on differences in nominal designation. For example, "plate" shall be construed as a concept that encompasses members that are commonly termed as "sheet" or "film".

[Lead Frame]

Figure 1:
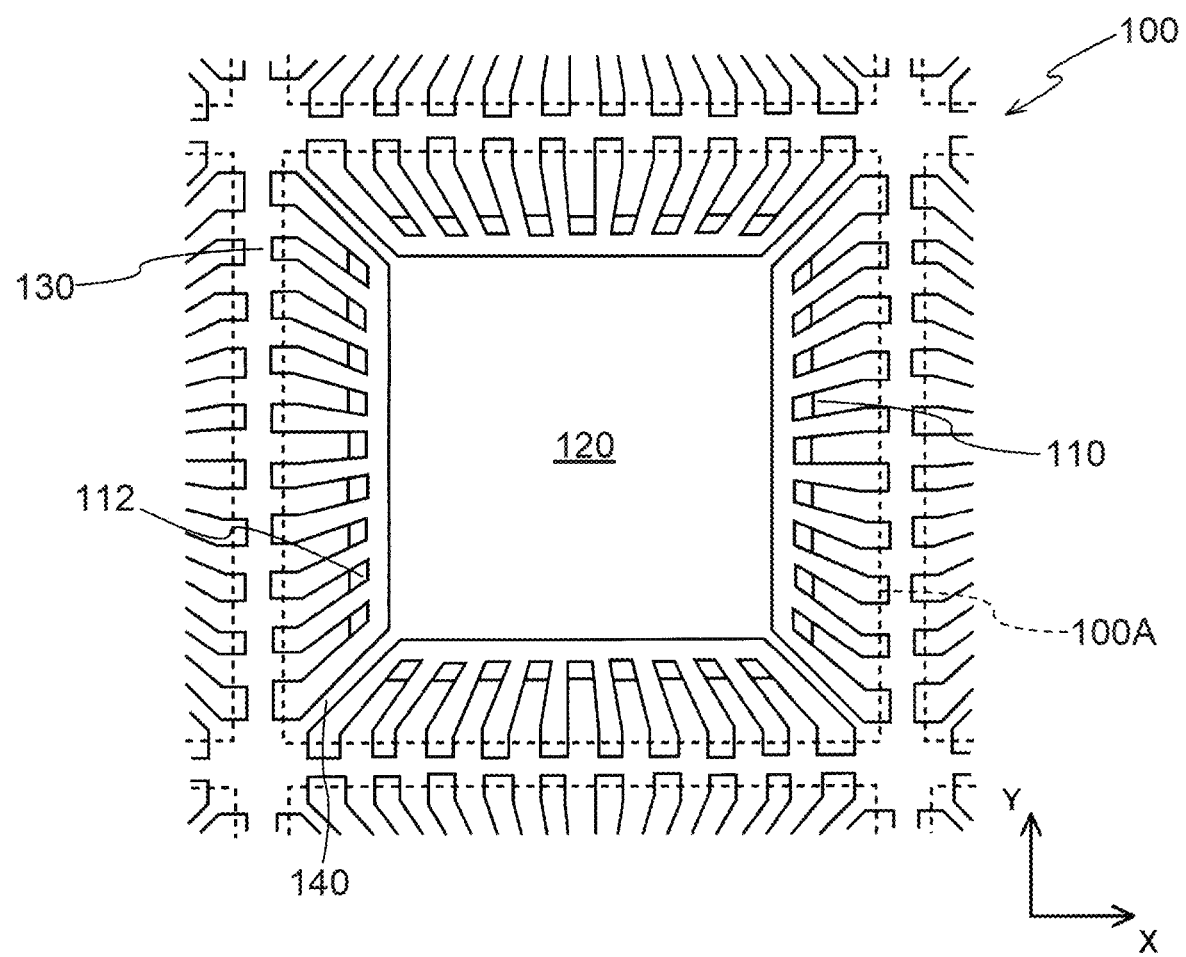
FIG. 1 is a plan view of a lead frame according to a first embodiment.

A lead frame according to an embodiment of the present disclosure will now be described. A lead frame 100 according to the present embodiment is used for manufacturing a semiconductor device 200 (see FIGS. 3 and 4). The lead frame 100 includes a plurality of package areas 100A. The plurality of package areas 100A is in a multi-column-and-multi-row (matrix pattern) layout. Note that only a part of the lead frame 100 is illustrated in FIG. 1, focusing on one package area 100A.

The package area 100A (see FIG. 1) is an area corresponding to the semiconductor device 200, which will be described later, and surrounded by virtual lines forming a quadrangular shape (broken lines in FIG. 1). Though an example of a lead frame that includes the plurality of package areas 100A is disclosed as the lead frame 100 in the present embodiment, its mode of configuration is not limited thereto; the lead frame 100 may include a single package area 100A only.

In this description, etc., the terms "inward" and "inner side" refer to a directional side of coming toward the center of each package area 100A, and the terms "outward" and "outer side" refer to a directional side of going away from the center of each package area 100A (toward a connecting bar 130). The term "upper surface" refers to a surface on which a semiconductor element 210 is mounted.

The term "lower surface" refers to a surface that is the opposite of the upper surface and that is to be connected to an external mounting board (not illustrated). The term "sidewall surface" refers to a surface that is located between the upper surface and the lower surface and constitutes a thickness of the lead frame 100 (metal substrate 310).

In this description, etc., the term "half etching" refers to etching an etching target material halfway through it in its thickness direction. The thickness of the etching target material after half etching is 30 to 70% of the thickness of the etching target material before half etching, preferably, 40 to 60% thereof.

Figure 2:
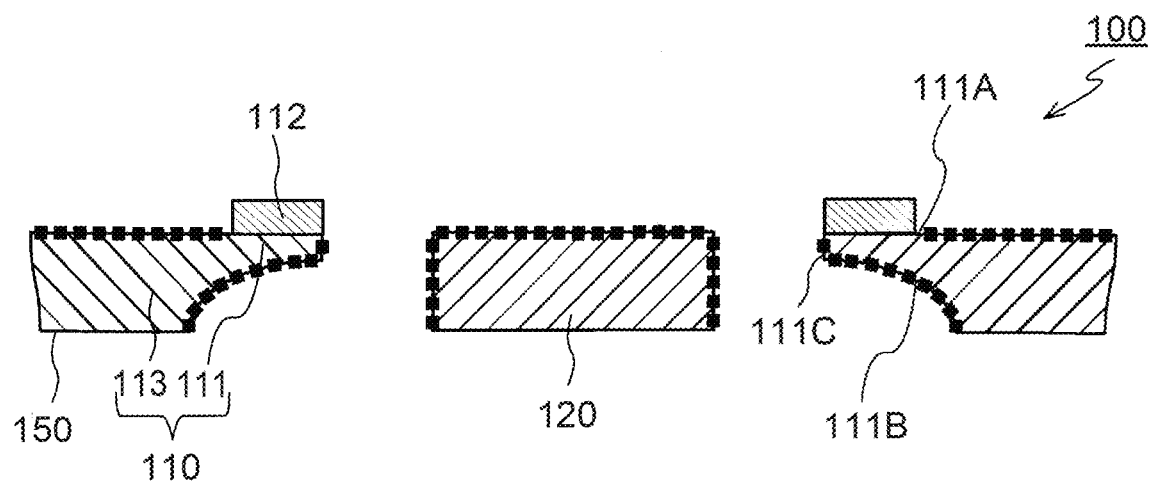
FIG. 2 is a partial cut end face view of a lead frame according to the first embodiment.

As illustrated in FIGS. 1 and 2, each package area 100A of the lead frame 100 includes a plurality of lead portions 110, a die pad portion 120, and the connecting bar 130 for connection of the lead portions 110. The lead portion 110 may include an inner lead portion 111 and a terminal portion 113.

The inner lead portion 111 is a portion thinned from its lower surface side, and is located at an inner side (die pad portion 120 side) in each package area 100A. The terminal portion 113 is located at an outer side (connecting bar 130 side) in each package area 100A. The inner lead portion 111 extends from the terminal portion 113 toward the die pad portion 120. An internal terminal is formed on an upper surface of the inner lead portion 111. The internal terminal is an area that is to be electrically connected to the semiconductor element 210 via a connection member 220 as will be described later. A metal plating layer 112 is provided on the internal terminal for the purpose of improving the property of close contact with the connection member 220.

Each lead portion 110 is configured to be connected to the semiconductor element 210 via the connection member 220 as will be described later, and is disposed with a space from the die pad portion 120 (see FIGS. 4 and 5). The lead portions 110 are spaced apart from one another in the length direction of the connecting bar 130. Each lead portion 110 extends from the connecting bar 130.

The lead portions 110 are disposed around the die pad portion 120. The lead portion 110 is partially thinned from its lower surface side. This part thinned from the lower surface side is the inner lead portion 111. A part, of the lead portion 110, that is not thinned from its lower surface side is the terminal portion 113. An external terminal 150 is formed on the lower surface of the terminal portion 113. The external terminal 150 is a portion to be electrically connected to an external mounting board (not illustrated). The external terminal 150 is a portion exposed to the outside of the semiconductor device 200, which will be described later.

The inner lead portion 111 is thinned from its lower surface side by, for example, half etching. The inner lead portion 111 has an inner lead portion upper surface 111A, an inner lead portion lower surface 111B that is the opposite of the inner lead portion upper surface 111A, and an inner lead portion sidewall surface. The inner lead portion upper surface 111A is a part of the upper surface of the lead portion 110. The inner lead portion sidewall surface includes a die-pad-portion facing surface 111C, which is oriented toward the die pad portion 120, and surfaces facing adjacent lead portions 110. The inner lead portion lower surface 111B is located at a lower surface side of the lead portion 110.

The terminal portion 113 is located at the connecting bar 130 side. The terminal portion 113 is connected to the connecting bar 130. The lower surface of the terminal portion 113 constitutes the above-described external terminal 150. Not being half-etched, the terminal portion 113 has the same thickness as that of the die pad portion 120. The lower surface side of a part, of the terminal portion 113, located at the connecting bar 130 side may be thinned so as to constitute a portion for connection to the connecting bar 130.

At least a part of the upper surface of the lead portion 110 and the sidewall surface thereof are rough surfaces having been subjected to roughening treatment. The lower surface of the lead portion 110 (terminal portion 113) is a non-rough surface not having been subjected to roughening treatment. The inner lead portion lower surface 111B is a rough surface having been subjected to roughening treatment. In FIG. 1, etc., a rough surface having been subjected to roughening treatment is indicated by a thick broken line.

In the present embodiment, when simply referred to as a "roughened surface", the term means a rough surface having been subjected to roughening treatment, preferably a rough surface having been roughened by micro etching or the like.

The lower surface of the lead portion 110 at its thinned part is a rough surface having been subjected to roughening treatment. Specifically, the inner lead portion lower surface 111B is a roughened surface throughout the entire area thereof. On the other hand, the lower surface of the lead portion 110 at its non-thinned part is a non-roughened surface. Specifically, the terminal portion 113 is not thinned from its lower surface side, and the external terminal 150, which is located at the lower surface side of the terminal portion 113, is a non-roughened surface throughout the entire area thereof.

The inner lead portion sidewall surface including the die-pad-portion facing surface 111C is a rough surface having been subjected to roughening treatment throughout the entire area thereof.

It is sufficient as long as, of the upper surface of the lead portion 110 (inner lead portion 111), a partial area located at the die pad portion 120 side is a non-roughened surface. The metal plating layer 112 may be provided on this non-roughened surface. The metal plating layer 112 may be formed using, for example, an electrolytic plating method. It is sufficient as long as the thickness of the metal plating layer 112 is within a range from 1 μm to 10 μm. The metal plating layer 112 suffices to be, for example, an Ag plating layer, an Ag alloy plating layer, an Au plating layer, an Au alloy plating layer, a Pt plating layer, a Cu plating layer, a Cu alloy plating layer, a Pd plating layer, an Ni plating layer, etc., and may include one or more of them. Preferably, the metal plating layer 112 should include at least one of an Ag plating layer, an Ni plating layer, a Pd plating layer, or an Au plating layer. If ground plating is required depending on the constituent(s) of the metal plating layer 112, using a known material for ground plating suffices. For example, an Ni plating layer, a Cu plating layer or the like can be used for ground plating.

As will be described later, the semiconductor element 210 is mountable on the upper surface of the die pad portion 120. It is sufficient as long as the plurality of lead portions 110 is disposed around the die pad portion 120. The upper surface of the die pad portion 120 and the sidewall surface thereof suffice to be rough surfaces having been subjected to roughening treatment, and the lower surface of the die pad portion 120 suffices to be a non-rough surface not having been subjected to roughening treatment (see FIG. 2).

The upper surface of the die pad portion 120 is an area (internal terminal) for bonding to the semiconductor element 210 by means of an adhesive 240 such as a die attaching paste as will be described later. The lower surface of the die pad portion 120 is not thinned by, for example, half etching, and is a non-rough surface not having been subjected to roughening treatment, similarly to the surface of a before-treatment metal substrate 310 to be described later. The lower surface of the die pad portion 120 is exposed to the outside of the semiconductor device 200 to be described later.

The package areas 100A are connected to one another via the connecting bars 130. The connecting bars 130 extend in X and Y directions respectively. The X and Y directions are two directions parallel to the sides of the package area 100A in a plane of the lead frame 100. The X and Y directions are orthogonal to each other.

The connecting bars 130 are disposed around the package area 100A outward of the package area 100A. Each connecting bar 130 has an elongated rod shape in a plan view. The width W of each connecting bar 130 (distance in a direction orthogonal to the length direction of the connecting bar 130) can be set as appropriate within a range from, for example, 95 m to 250 μm, though not specifically limited thereto. To each connecting bar 130, a plurality of lead portions 110 is connected at predetermined intervals in the length direction of the connecting bar 130. The die pad portion 120 is supported via suspension leads 140 by the connecting bars 130. The connecting bar 130 according to the present embodiment is not thinned; however, its configuration is not limited to this mode. For example, the connecting bar 130 may be thinned from its lower surface side by half etching. The thickness of the connecting bar 130 in this case can be set while taking the structure of the semiconductor device 200, etc. into consideration. For example, the thickness of the connecting bar 130 can be set as appropriate within a range from 80 μm to 200 μm.

The lead frame 100 according to the present embodiment is used for manufacturing the semiconductor device 200 that includes a molding portion 230 to be described later. The upper surface of the lead portion 110 and the sidewall surface of the lead portion 110 that are configured to be in contact with the molding portion 230 may be rough surfaces having been subjected to roughening treatment. The upper surface of the lead portion 110 and the sidewall surface of the lead portion 110 that are located outward of the package area 100A, and the surface of the connecting bar 130, may be rough surfaces having been subjected to roughening treatment or non-rough surfaces not having been subjected to roughening treatment. When the semiconductor device 200 is manufactured using the lead frame 100, dicing is performed along the connecting bar 130. In this process, when each package area 100A is individually molded and diced, if the upper surface of the connecting bar 130 is a rough surface having been subjected to roughening treatment, there is a risk that a foreign object might be produced during the dicing of the lead frame 100. Therefore, configuring the upper surface of the connecting bar 130 as a non-rough surface not having been subjected to roughening treatment makes it possible to prevent a foreign object from being produced when the semiconductor device 200 is manufactured.

In a roughened surface of the lead frame 100 according to the present embodiment, the value of a* in the CIELab color space is within a range from 12 to 19, and the value of b* is within a range from 12 to 17. Preferably, the value of a* should be within a range from 13 to 18, and the value of b* should be within a range from 12 to 16. As is clear from Examples to be described later, if the value of a* and the value of b* in the CIELab color space of a roughened surface of the lead frame 100 according to the present embodiment are within predetermined ranges, a surface area ratio increases. Therefore, in a semiconductor device that can be manufactured using the lead frame 100, the strength of adhesion to mold resin increases. By this means, it is possible to suppress the entry of moisture in air to an electrode of a semiconductor element. That is, since the value of a* and the value of b* in the CIELab color space of a roughened surface of the lead frame 100 according to the present embodiment are within the above ranges, it is possible to manufacture a semiconductor device capable of suppressing the entry of moisture in air to the electrode of the semiconductor element. In the present embodiment, the value of a* and the value of b* in the CIELab color space are measured using a spectral density meter/colorimeter "eXact" (manufactured by X-Rite, Incorporated).

The CIELab color space (L*a*b* color space) will now be described. The L*a*b* color space is expressed by a chromaticity diagram referred to as CIELab recommended by CIE, in which L* denotes lightness, a* denotes a degree of red/magenta or green, and b* denotes a degree of yellow or blue. As the value of a* goes toward the negative side, it becomes closer to green. As the value of a* goes toward the positive side, it becomes closer to red. As the value of b* goes toward the negative side, it becomes closer to blue. As the value of b* goes toward the positive side, it becomes closer to yellow.

The value of L*, when at 100, represents white (total reflection). The value of L*, when at 0, represents black (total absorption). The center of these three values is a neutral color (gray). That is, a movement in the L*-axis direction represents a change in lightness, and a movement on an a*b* plane represents a change in hue. It can be said that a distance in the L*a*b* color space corresponds to closeness between colors. The shorter the distance is, the greater the color closeness is. In a roughened surface of the lead frame 100 according to the present embodiment, it can be said that the predetermined ranges described above are met for the value of a* in the CIELab color space between red/magenta and green and for the value of b* between yellow and blue.

In the lead frame 100 according to the present embodiment, an arithmetic mean peak curvature Spc of peaks of a roughened surface is 700 mm$^{-1}$ or greater, preferably, within a range from 1,000 mm$^{-1}$ to 5,000 mm$^{-1}$, or more preferably, within a range from 2,000 mm$^{-1}$ to 4,000 mm$^{-1}$. As is clear from Examples to be described later, when the arithmetic mean peak curvature Spc of peaks of a roughened surface of the lead frame 100 according to the present embodiment is within a predetermined range, it indicates that the point of contact with a contact target object is sharp-pointed. In this case, in a semiconductor device manufactured using the lead frame 100, the strength of adhesion to mold resin increases, which makes it possible to suppress the entry of moisture in air to the electrode of the semiconductor element. That is, since the arithmetic mean peak curvature Spc of peaks of a roughened surface of the lead frame 100 according to the present embodiment is within the above range, it is possible to manufacture a semiconductor device capable of suppressing the entry of moisture in air to the electrode of the semiconductor element. In addition, an arithmetic mean height Sa of the roughened surface should preferably be 0.12 µm or greater, or more preferably, within a range from 0.12 µm to 0.34 µm. Configuring the arithmetic mean peak curvature Spc of peaks of a roughened surface to be 700 mm$^{-1}$ or greater and the arithmetic mean height Sa of the roughened surface to be within the predetermined range makes it possible to manufacture a semiconductor device capable of suppressing the entry of moisture in air to the electrode of the semiconductor element. The arithmetic mean peak curvature Spc of peaks means an average of principal curvature of peaks that exist in an object. The sharper the peaks are, the greater the value of the arithmetic mean peak curvature Spc of the peaks is. The arithmetic mean height Sa is a parameter obtained by extending an arithmetic mean height Ra of lines to three dimensions, namely, a plane, and is a numerical value that indicates an average of absolute values of differences in height of respective points in relation to an average plane of the surface. In the present embodiment, the arithmetic mean peak curvature Spc of peaks and the arithmetic mean height Sa are measured using a laser microscope VK-X260 (manufactured by Keyence Corporation, a measurement unit) and a laser microscope VK-X250 (manufactured by Keyence Corporation, a controller unit).

In general, lead frames to be used in QFN-type (Quad Flat Non-leaded package) semiconductor devices have recently been demanded to achieve a reduction in device size and device thickness. In such a semiconductor device, a path which defines a distance from the outer perimeter to the electrode of the semiconductor element and through which moisture in external air (air) can enter tends to be short and, therefore, there is a risk that moisture in air might enter the electrode of the semiconductor element, resulting in damaging the semiconductor device.

In view of the above, the inventors of the present application have discovered that, in lead frames to be used in semiconductor devices, a state of a rough surface of a lead frame having been subjected to roughening treatment is important. Moreover, in terms of reliability required for semiconductor devices, the inventors of the present application have discovered that, as an index that indicates a state of a roughened surface, attention should be focused on the CIELab color space or the arithmetic mean peak curvature Spc of peaks and the arithmetic mean height Sa. Then, the inventors of the present application have completed conceptualizing the present invention by discovering that a lead frame offering high reliability required for semiconductor devices can be obtained when the value of a* in the CIELab color space is within a range from 12 to 19 and the value of b* is within a range from 12 to 17 or when the arithmetic mean peak curvature Spc of peaks of a roughened surface is 700 mm or greater and the arithmetic mean height Sa of the roughened surface is 0.12 µm or greater.

A roughened surface according to the present embodiment may be formed by, for example, performing a surface roughening treatment of the metal substrate 310 to be described later by means of a micro etching fluid. Examples of the micro etching fluid that can be used in the present embodiment are: an etchant that contains sulfuric acid or hydrochloric acid as a principal component, an etchant that contains hydrogen peroxide and sulfuric acid as principal components, and the like.

In a roughened surface according to the present embodiment, the value of a* in the CIELab color space is within a range from 12 to 19, and the value of b* is within a range from 12 to 17.

Moreover, the arithmetic mean peak curvature Spc of peaks of the roughened surface is 700 mm$^{-1}$ or greater and the arithmetic mean height Sa of the roughened surface is 0.12 µm or greater. Having a roughened surface falling within these predetermined ranges makes it possible to manufacture a semiconductor device capable of suppressing the entry of moisture in air to the electrode of the semiconductor element.

The lead frame 100 having been described above is made of metal such as copper, copper alloy, Ni alloy, or the like. The thickness of the lead frame 100 can be set while taking the structure of the semiconductor device 200, etc. into consideration. For example, the thickness of the lead frame 100 can be set as appropriate within a range from 80 µm to 300 µm.

The lead portions 110 according to the present embodiment are arranged along all of the four sides of the package area 100A but are not limited thereto. For example, they may be arranged along two mutually-opposite sides only of the package area 100A.

The lead frame 100 illustrated in FIGS. 1 and 2 has been described in a mode of including the die pad portion 120 but is not limited thereto. The die pad portion 120 may be omitted. For example, each lead portion 110 may be connected to the semiconductor element 210 via a bump serving as the connection member 220 as will be described later (see FIG. 5).

Figure 3:
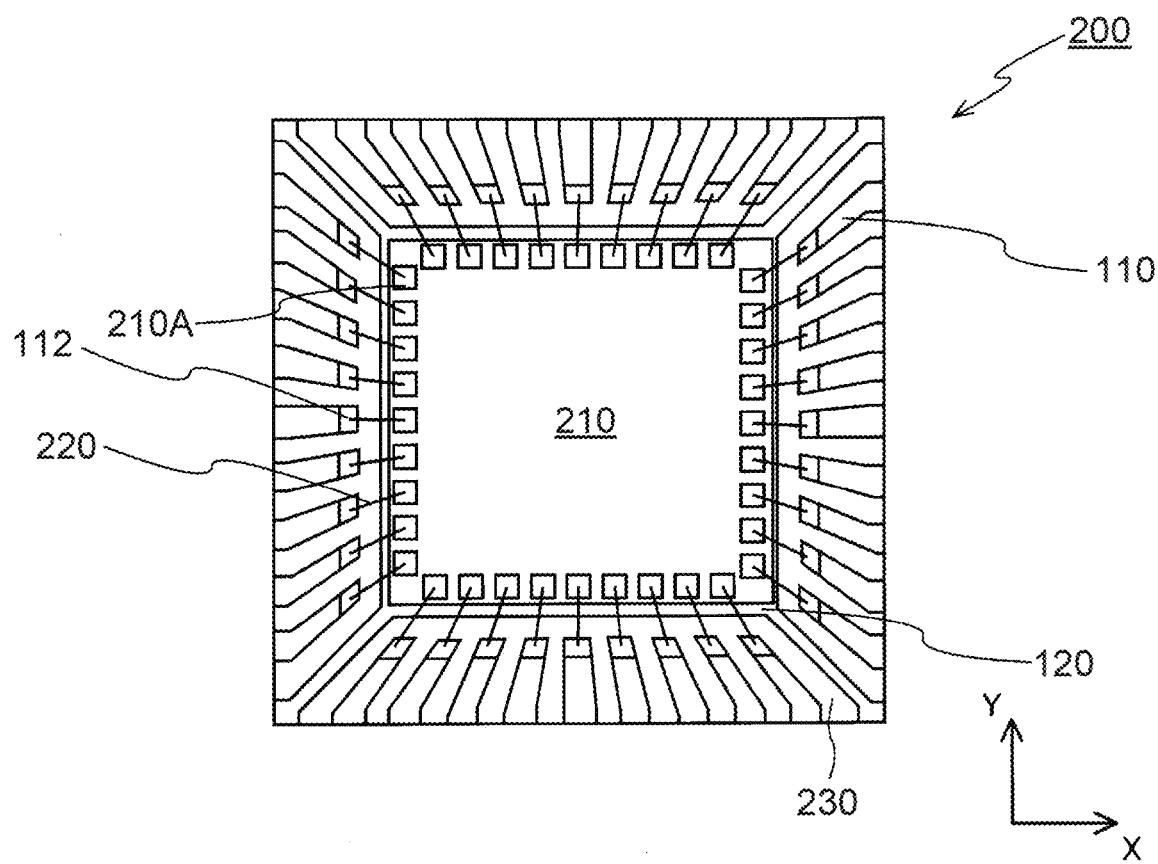
FIG. 3 is a plan view of a semiconductor device according to the first embodiment.

[Semiconductor Device] A semiconductor device according to an embodiment of the present disclosure will now be described. As illustrated in FIGS. 3 and 4, the semiconductor device 200 includes the plurality of lead portions 110, the die pad portion 120, the semiconductor element 210, the connection members 220, and the molding portion 230.

The semiconductor device 200 according to the present embodiment is manufactured using the above-described lead frame 100. Therefore, the lead portions 110 and the die pad portion 120 in the semiconductor device 200 are provided in the above-described lead frame 100. For this reason, the part, of the upper surface of the lead portion 110, located outward of the metal plating layer 112 (the side farther from the die pad portion 120), and the sidewall surface of the lead portion 110, are rough surfaces having been subjected to roughening treatment. The upper surface of the die pad portion 120 and the sidewall surface of the die pad portion 120 are also rough surfaces having been subjected to roughening treatment. As illustrated in FIG. 4, the lead portion 110 includes the inner lead portion 111 thinned from the lower surface side of the lead portion 110, and the inner lead portion lower surface 111B is a roughened surface. The molding portion 230 is closely adhered to the inner lead portion lower surface 111B. The terminal portion 113 of the lead portion 110 is not thinned from its lower surface side. The external terminal 150, which is located on the lower surface of the terminal portion 113, has a non-roughened surface. The external terminal 150 is exposed from the molding portion 230.

In the roughened surface described above, the value of a* in the CIELab color space is within a range from 12 to 19, and the value of b* is within a range from 12 to 17. Configuring the value of a* and the value of b* in the CIElab color space of the roughened surface to be within the above ranges makes it possible to suppress the entry of moisture in air to the electrode of the semiconductor element 210.

The arithmetic mean peak curvature Spc of peaks of the roughened surface described above is 700 mm$^{-1}$ or greater. Configuring the arithmetic mean peak curvature Spc of peaks to be 700 mm$^{-1}$ or greater makes it possible to suppress the entry of moisture in air to the electrode of the semiconductor element 210. In addition, the arithmetic mean height Sa of the roughened surface described above should preferably be 0.12 μm or greater, or more preferably, within a range from 0.12 μm to 0.34 μm.

Configuring the arithmetic mean peak curvature Spc of peaks of the roughened surface to be 700 mm$^{-1}$ or greater and the arithmetic mean height Sa of the roughened surface to be within the predetermined range makes it possible to suppress the entry of moisture in air to the electrode of the semiconductor element 210 more effectively.

The semiconductor element 210 is not specifically limited, and various kinds of semiconductor element commonly used in the art can be used. For example, an integrated circuit, a large-scale integrated circuit, a transistor, a thyristor, a diode, or the like can be used. The semiconductor element 210 includes a plurality of electrodes 210A to which the connection members 220 are attached respectively.

Each of the connection members 220 is made of a metal material having good conductive property such as copper or gold. One end of each of them is electrically connected to the electrode 210A of the semiconductor element 210, and the opposite end thereof is electrically connected to the metal plating layer 112 located on each lead portion 110. A conductor, etc. such as a bonding wire or a bump can be used as the connection member 220.

The molding portion 230 seals at least the lead portions 110, the die pad portion 120, the semiconductor element 210, and the connection members 220. The molding portion 230 may be made of resin such as, for example, thermosetting resin such as silicone resin or epoxy resin, thermoplastic resin such as PPS resin, etc. The thickness of the molding portion 230 as a whole can be set as appropriate within a range from, for example, 300 μm to 1,500 μm or so, though not specifically limited thereto. In a plan view of the semiconductor device 200, the length of one side of the molding portion 230 (one side of the semiconductor device 200) can be set as appropriate within a range from, for example, 0.2 mm to 20 mm, though not specifically limited thereto.

Figure 4:
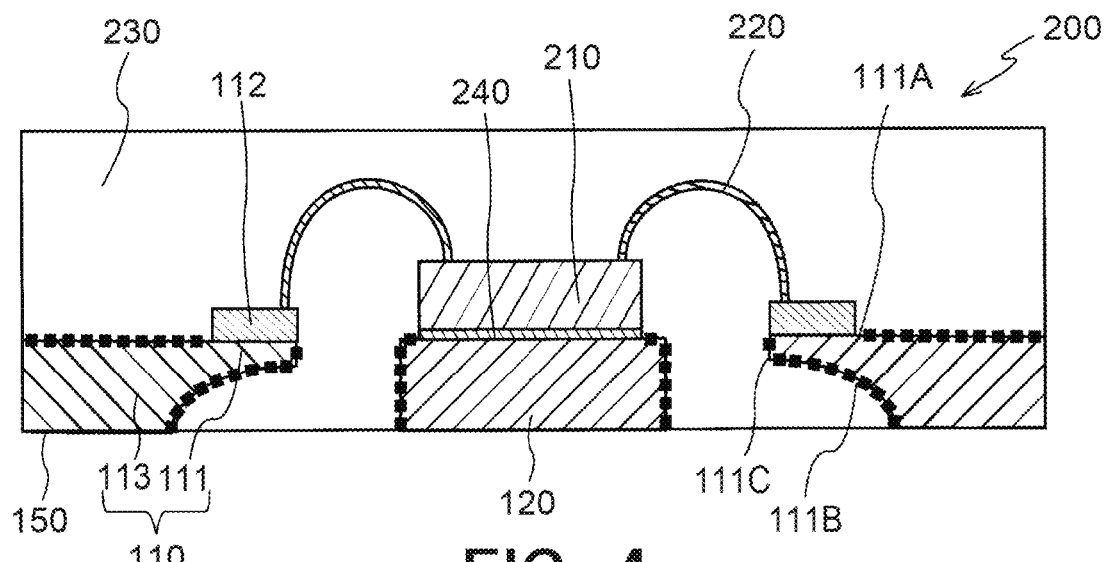
FIG. 4 is a partial cut end face view of a semiconductor device according to the first embodiment.
Figure 5:
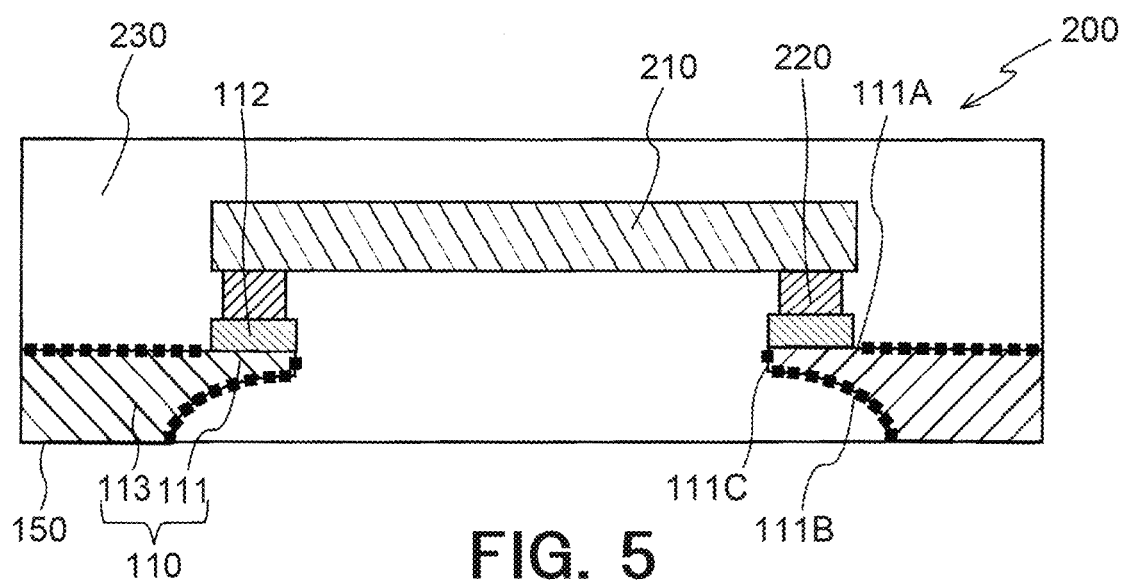
FIG. 5 is a partial cut end face view of a semiconductor device according to a variation example of the first embodiment.

The semiconductor device 200 illustrated in FIGS. 3 and 4 has been described in a mode of including the die pad portion 120 but is not limited thereto. The die pad portion 120 may be omitted. For example, each lead portion 110 may be connected to the electrode 210A of the semiconductor element 210 via a bump serving as the connection member 220 (see FIG. 5).

[Method of Manufacturing Lead Frame] A method of manufacturing the lead frame 100 illustrated in FIGS. 1 and 2 will now be described as an example. FIGS. 6A to 6H are step diagrams for explaining a method of manufacturing a lead frame according to the present embodiment.

<Metal Substrate Preparation Step>

Figure 6A:
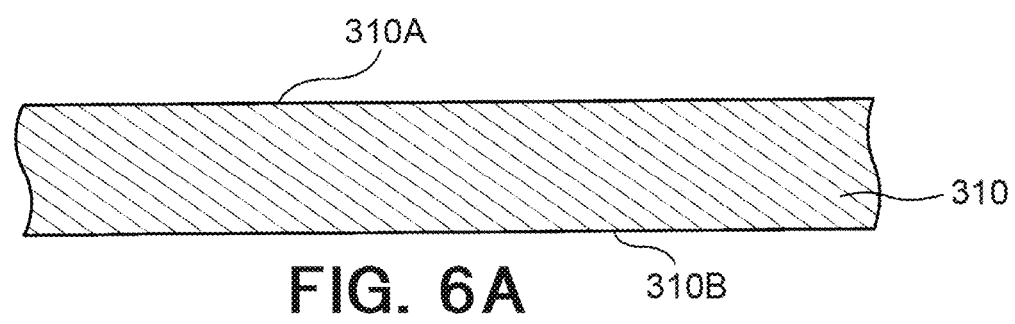
FIG. 6A is a step diagram for explaining a method of manufacturing a lead frame according to the first embodiment.
Figure 6B:
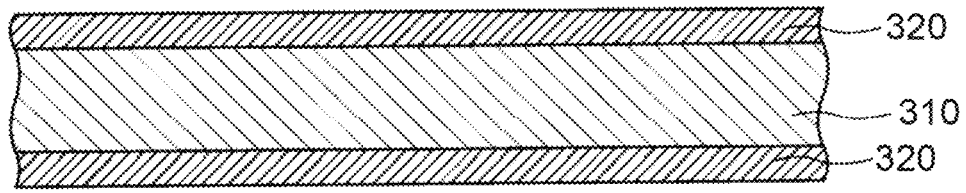
FIG. 6B is a step diagram continued from FIG. 6A for explaining a method of manufacturing a lead frame according to the first embodiment.

As illustrated in FIGS. 6A and 6B, a metal substrate 310 that has a first surface 310A and a second surface 310B that is the opposite of the first surface 310A is prepared (see FIG. 6A). Examples of the metal substrate 310 that can be used in the present embodiment are: a pure copper substrate, a pure copper alloy substrate, a 42 alloy (42%-nickel-content Fe alloy) substrate, and the like. Preferably, it should be a pure copper substrate or a pure copper alloy substrate. A metal substrate whose first surface 310A and second surface 310B have been degreased and cleansed may be used as the metal substrate 310.

<Metal Substrate Processing Step>

Next, a photoresist 320 is applied to each of the first surface 310A and the second surface 310B of the metal substrate 310 and is then dried (see FIG. 6B). A photoresist known in the art can be used as the photoresist 320 in the present embodiment.

Figure 6C:
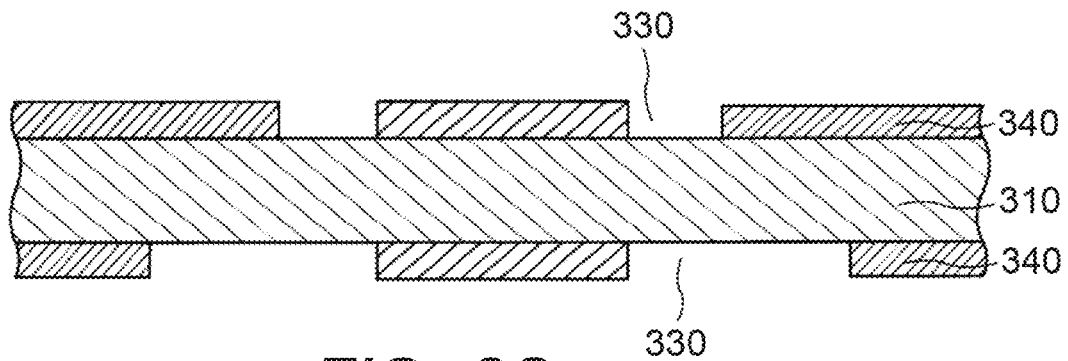
FIG. 6C is a step diagram continued from FIG. 6B for explaining a method of manufacturing a lead frame according to the first embodiment.

Next, exposure light is applied to the metal substrate 310 through a photomask to perform development, thereby forming each resist layer 340 having a desired opening portion 330 (see FIG. 6C).

Figure 6D:
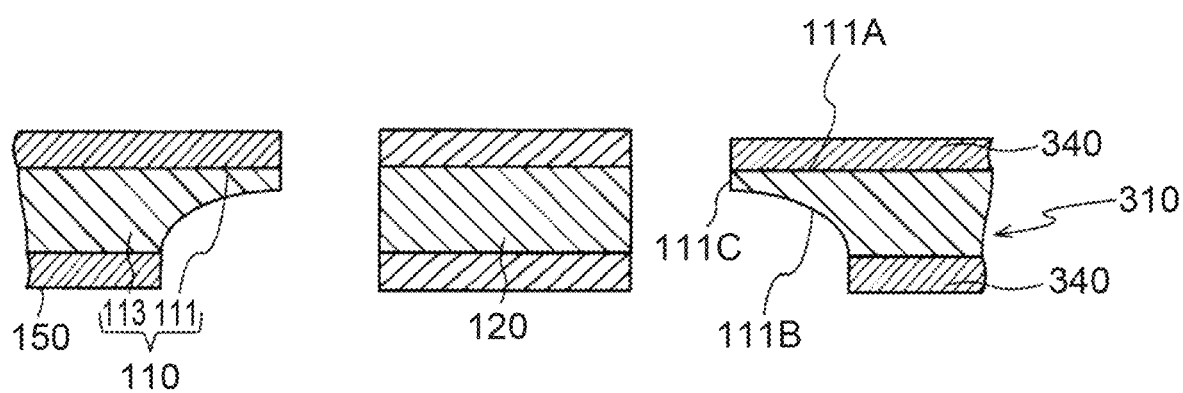
FIG. 6D is a step diagram continued from FIG. 6C for explaining a method of manufacturing a lead frame according to the first embodiment.

Next, an etching treatment is applied to the metal substrate 310 by means of a corrosive fluid while using the resist layer 340 as anti-etching coating (see FIG. 6D). The corrosive fluid can be selected as appropriate depending on the material of the metal substrate 310 that is used. For example, in a case where a pure copper substrate is used as the metal substrate 310, an aqueous ferric chloride is commonly used as the corrosive fluid, and spray etching may be performed on both of the first surface 310A and the second surface 310B of the metal substrate 310. By this means, the outer shape of the lead portions 110, the die pad portion 120, and the connecting bars 130 is formed. In this process, the lower surface of a part of the lead portion 110 may be thinned by half etching to form the inner lead portion 111 and the terminal portion 113.

Figure 6E:
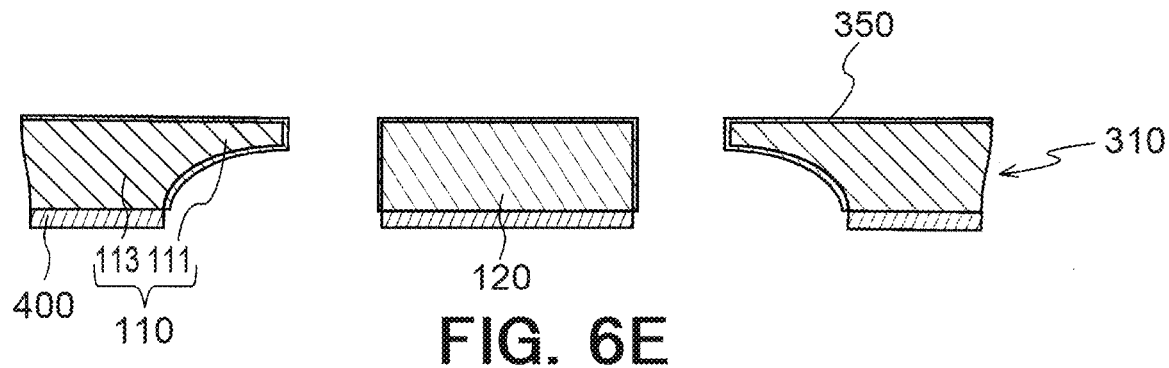
FIG. 6E is a step diagram continued from FIG. 6D for explaining a method of manufacturing a lead frame according to the first embodiment.

Next, the resist layer 340 is taken away, and a coating layer 350 is formed on the etched surface of the metal substrate 310 (see FIG. 6E). By this means, the coating layer 350 is formed entirely around the lead portions 110, the die pad portion 120, and the connecting bars 130. Though the thickness of the coating layer 350 is not specifically limited, for example, a thickness greater than 0 μm but not greater than 2 μm suffices. Though metal used for forming the coating layer 350 is not specifically limited, for example, silver may be used. In a case where the coating layer 350 is a silver plating layer, a silver plating fluid containing silver cyanide and potassium cyanide as principal components can be used as an electrolytic plating fluid. Note that it is preferable not to form the coating layer 350 on the external terminal 150 located on the lower surface of the lead portion 110 (terminal portion 113) nor on the lower surface of the die pad portion 120. In order not to form the coating layer 350 on the external terminal 150 located on the lower surface of the lead portion 110 (terminal portion 113) nor on the lower surface of the die pad portion 120, for example, a resist layer 400 may be formed on the external terminal 150 located on the lower surface of the lead portion 110 (terminal portion 113) and on the lower surface of the die pad portion 120, thereby avoiding the coating layer 350 from being formed (see FIG. 6E).

Figure 6F:
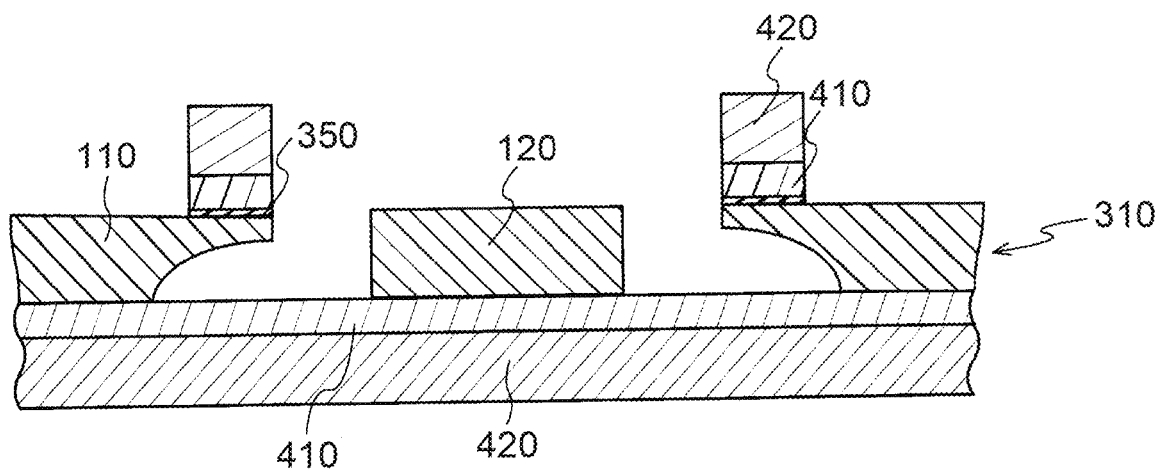
FIG. 6F is a step diagram continued from FIG. 6E for explaining a method of manufacturing a lead frame according to the first embodiment.

Next, the coating layer 350 that exists at areas where roughened surfaces are to be formed is removed. Specifically, the coating layer 350 formed on the upper surface of each lead portion 110 except for an area where the metal plating layer 112 is to be provided, the sidewall surface of the lead portion 110, the lower surface of the inner lead portion 111, the upper surface of the die pad portion 120, and the sidewall surface of the die pad portion 120 is removed (see FIG. 6F). While this is performed, as illustrated in FIG. 6F, an elastic member 410 such as a rubber gasket is disposed on each of the first surface 310A and the second surface 310B of the metal substrate 310, and the metal substrate 310 is clamped with a jig 420, with the elastic members 410 sandwiched therebetween. Next, the coating layer 350 at the part not covered by the elastic member 410 is taken away. As a result of this removal, the upper surface of each lead portion 110 except for the area where the metal plating layer 112 is to be provided, the sidewall surface of the lead portion 110, the lower surface of the inner lead portion 111, the upper surface of the die pad portion 120, and the sidewall surface of the die pad portion 120 become exposed. On the other hand, the coating layer 350 that lies on, of the upper surface of each lead portion 110, the area covered by the elastic member 410 for forming the metal plating layer 112, and on the connecting bars 130, is left unremoved.

<Roughened Surface Forming Step>

Figure 6G:
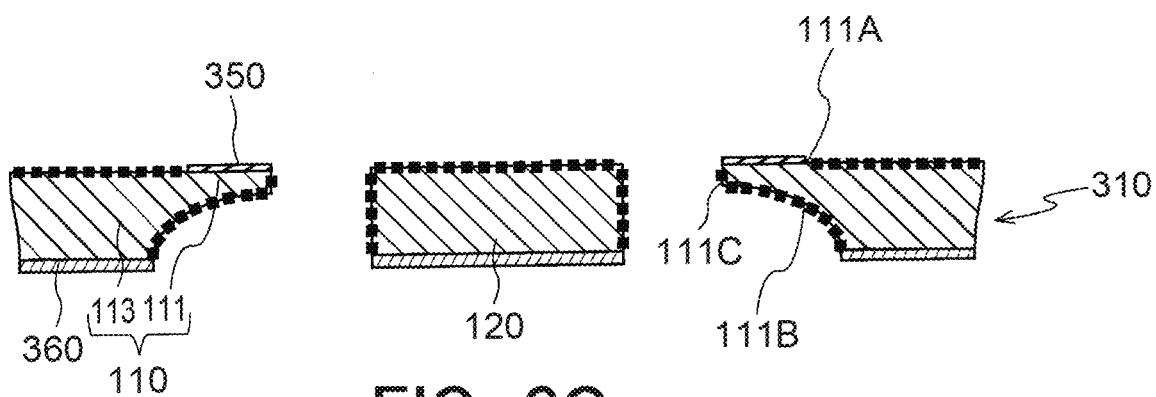
FIG. 6G is a step diagram continued from FIG. 6F for explaining a method of manufacturing a lead frame according to the first embodiment.

Next, a supporting layer 360 that supports the metal substrate is provided on the lower surface of the metal substrate 310 (see FIG. 6G). The supporting layer 360 may be, for example, a resist layer. After the supporting layer 360 is provided, roughened surfaces are formed by roughening, of the metal substrate 310, the part not covered by the coating layer 350 (see FIG. 6G). Specifically, roughened surfaces are formed at, of the upper surface of the lead portion 110, the part located outward of the area where the metal plating layer 112 is to be formed (the side farther from the die pad portion 120), the sidewall surface of the lead portion 110, the lower surface of the inner lead portion 111, the upper surface of the die pad portion 120, and the sidewall surface of the die pad portion 120. In order to form roughened surfaces, for example, a micro etching fluid is supplied to the metal substrate 310. By this means, it is possible to form roughened surfaces throughout the entire surface of the metal substrate 310 except for the part covered by the coating layer 350. The micro etching fluid is a surface treatment agent that slightly erodes a metal surface to form a fine convex-and-concave roughened surface. Examples of the micro etching fluid that can be used in the present embodiment are: an etchant that contains sulfuric acid or hydrochloric acid as a principal component, an etchant that contains hydrogen peroxide and sulfuric acid as principal components, and the like.

In the step of forming a roughened surface, roughening is performed such that the value of a* in the CIELab color space of the roughened surface is within a range from 12 to 19 and the value of b* is within a range from 12 to 17. Moreover, in the step of forming a roughened surface, roughening is performed such that the arithmetic mean peak curvature Spc of peaks of the roughened surface is 700 mm- or greater. In addition, the roughening should preferably be performed such that the arithmetic mean height Sa of the roughened surface is 0.12 μm or greater, or more preferably, within a range from 0.12 μm to 0.34 km. Forming the roughened surface in such a way as to fall within these predetermined ranges makes it possible to obtain the lead frame 100 that can be used for manufacturing a semiconductor device capable of suppressing the entry of moisture in air to the electrode of the semiconductor element.

Figure 6H:
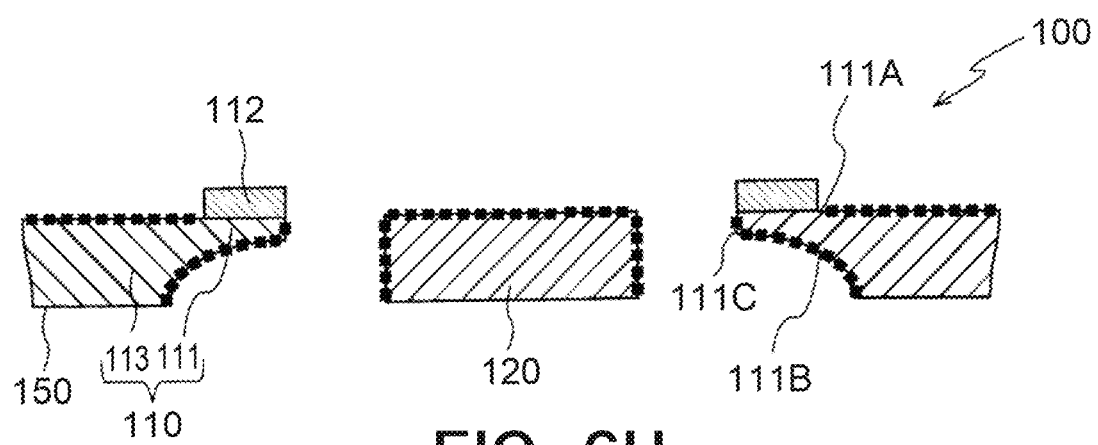
FIG. 6H is a step diagram continued from FIG. 6G for explaining a method of manufacturing a lead frame according to the first embodiment.

The supporting layer 360 and the coating layer 350 are thereafter taken away sequentially, and the metal plating layer 112 is provided at the inner end part (die pad portion 120 side) of the inner lead portion upper surface 111A, thereby obtaining the lead frame 100 illustrated in FIGS. 1 and 2 (see FIG. 6H). The metal plating layer 112 can be formed by, for example, forming a plating resist layer that has a predetermined pattern using a photolithography method and applying electrolytic plating for forming the metal plating layer 112 to the part that is not covered by the plating resist layer. Alkaline treatment may be applied to the lead frame 100 manufactured using the manufacturing method described above.

Specifically, the lead frame 100 is immersed in an alkaline water solution. Performing the alkaline treatment neutralizes acid contained in the surface treatment agent having been used in the roughened surface forming step, thereby suppressing the corrosion of the lead frame 100. The alkali used in the alkaline treatment is not specifically limited, for example, sodium hydroxide, potassium hydroxide, etc. Any one of them may be used alone, or a mixture of two or more may be used.

[Method of Manufacturing Semiconductor Device]

A method of manufacturing the semiconductor device 200 illustrated in FIGS. 3 and 4 will now be described as an example. FIGS. 7A to 7D are step diagrams for explaining a method of manufacturing a semiconductor device according to the present embodiment.

Figure 7A:
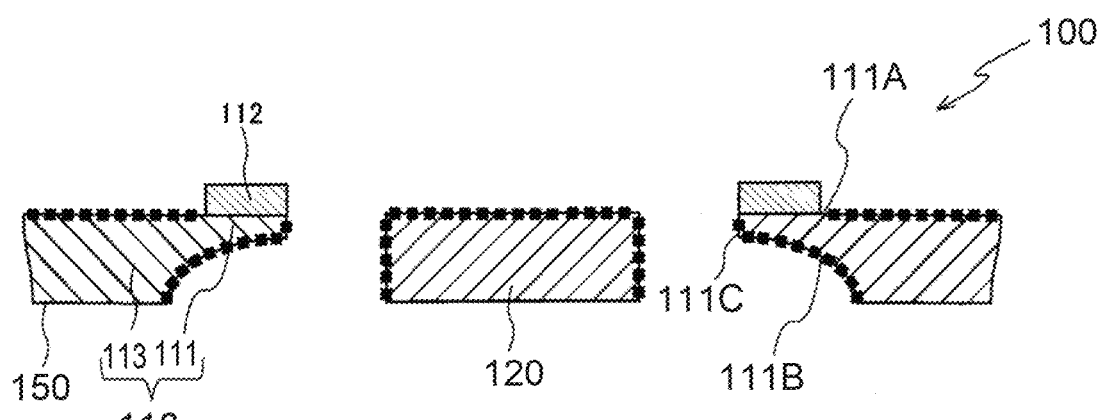
FIG. 7A is a step diagram for explaining a method of manufacturing a semiconductor device according to the first embodiment.
Figure 7B:
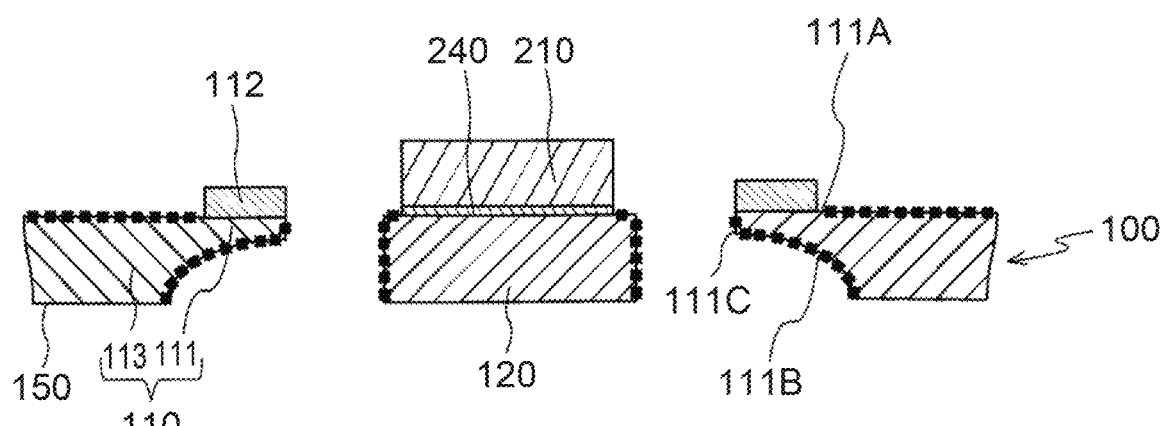
FIG. 7B is a step diagram continued from FIG. 7A for explaining a method of manufacturing a semiconductor device according to the first embodiment.

First, the lead frame 100 having been manufactured using the manufacturing method illustrated in FIGS. 6A to 6H is prepared (see FIG. 7A). Next, the semiconductor element 210 is mounted onto the die pad portion 120 of the lead frame 100. In this case, for example, the semiconductor element 210 is placed on the die pad portion 120 and is fixed thereto using the adhesive 240 such as a die attaching paste (see FIG. 7B). The adhesive 240 may be an epoxy-resin-based adhesive whose ingredients include a silver paste and epoxy resin, etc. In this process, the semiconductor element 210 is disposed on the upper surface of the die pad portion 120, which is a roughened surface, with the adhesive 240 therebetween.

Figure 7C:
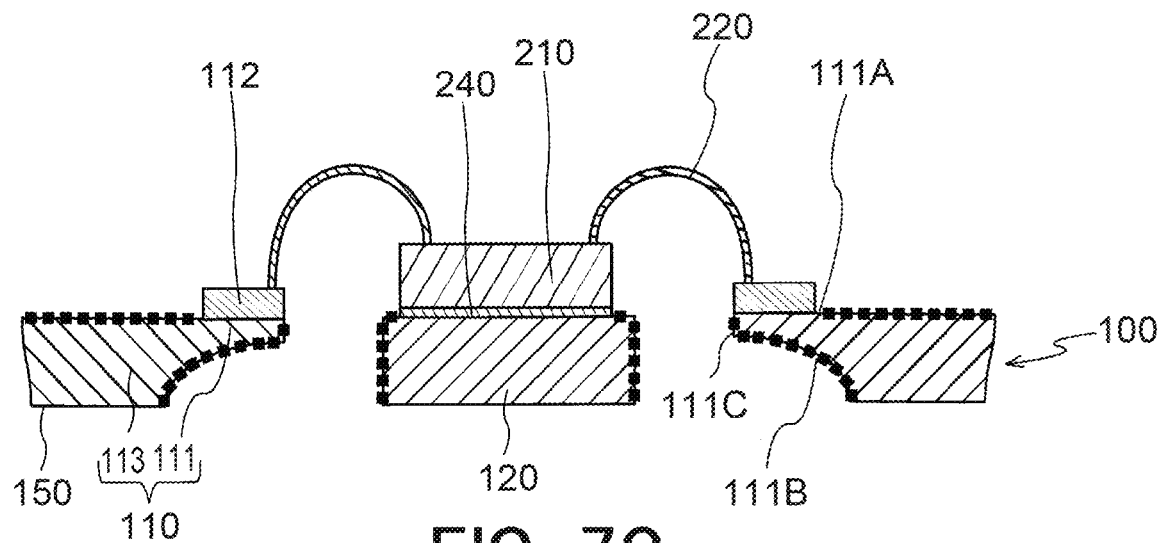
FIG. 7C is a step diagram continued from FIG. 7B for explaining a method of manufacturing a semiconductor device according to the first embodiment.

Next, each electrode 210A of the semiconductor element 210, and the metal plating layer 112 formed on each lead portion 110, are electrically connected to each other by means of the connection member 220 (see FIG. 7C).

Figure 7D:
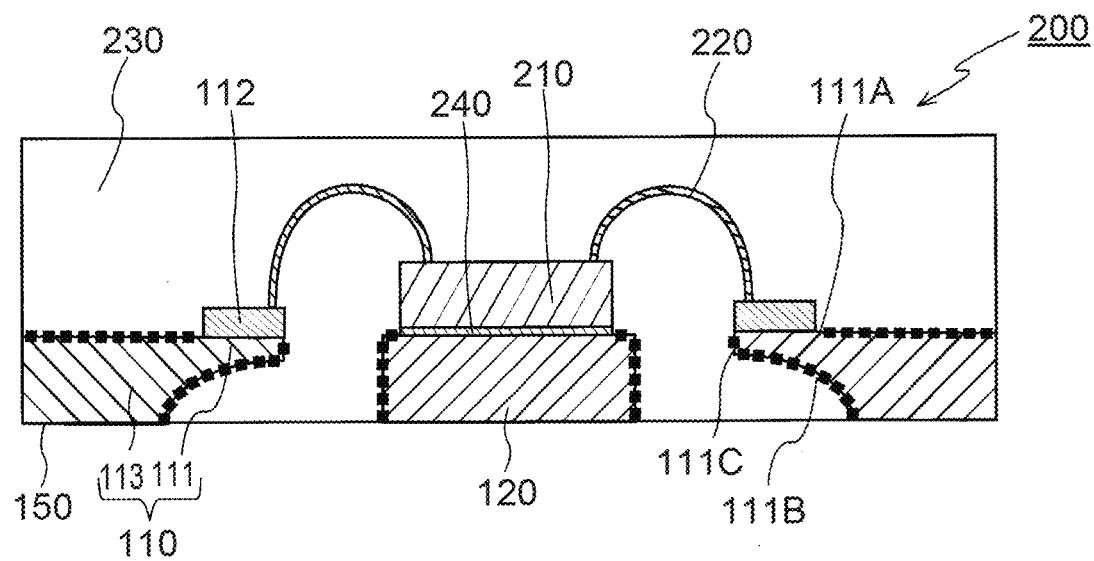
FIG. 7D is a step diagram continued from FIG. 7C for explaining a method of manufacturing a semiconductor device according to the first embodiment.

Next, the molding portion 230 is formed by performing injection molding or transfer molding of thermosetting resin or thermoplastic resin to the lead frame 100 (see FIG. 7D). By this means, it is possible to seal the lead portions 110, the die pad portion 120, the semiconductor element 210, and the connection members 220 with the resin.

The lead frame 100 is thereafter diced into the package areas 100A. In this process, since the upper surface of the connecting bar 130 where the dicing is performed is a non-roughened surface, it is possible to prevent a foreign object from being produced during the dicing. The semiconductor device 200 illustrated in FIGS. 3 and 4 can be obtained through the dicing into individual pieces, each being the semiconductor device 200, in this way.

When the semiconductor device 200 is used for a long term, there is a risk of the entry of moisture in air, etc. through the side surface or the lower surface of the semiconductor device 200. For example, there is a risk of the entry of moisture in air, etc. via an interface between the molding portion 230 and the lead portion 110 or the die pad portion 120.

To address this issue, in the present embodiment, roughened surfaces are formed at the upper surface of the lead portion 110 except where the metal plating layer 112 is provided, the sidewall surface of the lead portion 110, the upper surface of the die pad portion 120, and the sidewall surface of the die pad portion 120. The roughened surface has been subjected to roughening treatment such that, in the roughened surface, the value of a* in the CIELab color space is within a range from 12 to 19 and the value of b* is within a range from 12 to 17 or such that the arithmetic mean peak curvature Spc of peaks of the roughened surface is 700 $mm^{-1}$ or greater and the arithmetic mean height Sa of the roughened surface is 0.12 μm or greater. By this means, the distance of an entry path along which moisture enters via the interface between the molding portion 230 and the lead portion 110 or the die pad portion 120 toward the semiconductor element 210 is relatively long. For this reason, it is possible to suppress the entry of the moisture to the electrode 210A of the semiconductor element 210. Furthermore, having a roughened surface falling within the predetermined ranges described above makes it possible to increase the strength of adhesion of the die pad portion 120 or the lead portion 110 to the molding portion 230, thereby suppressing the die pad portion 120 or the lead portion 110 and the molding portion 230 from coming off from each other.

Moreover, the lead portion 110 according to the present embodiment includes the inner lead portion 111 thinned from the lower surface side of the lead portion 110. Since the lower surface of the inner lead portion 111 is a roughened surface, at the lower surface side of the semiconductor device 200, the distance of the entry path along which the moisture enters via the interface between the molding portion 230 and the lead portion 110 is long. By this means, it is possible to suppress the entry of the moisture to the electrode 210A of the semiconductor element 210 via the interface between the molding portion 230 and the lead portion 110. Furthermore, since the lower surface of the inner lead portion 111 has a roughened surface falling within the predetermined range described above, it is possible to increase the strength of adhesion of the lead portion 110 to the molding portion 230, thereby suppressing the lead portion 110 and the molding portion 230 from coming off from each other.

The embodiment having been described above is to facilitate the understanding of the present invention and thus shall not be construed to limit the present invention. Therefore, each element disclosed in the above embodiment is intended to encompass all design variations and equivalents belonging to the technical scope of the present invention.

EXAMPLES

A more detailed explanation of the present disclosure will be given below while describing Examples and Comparative Examples. However, the present disclosure shall not be construed to be limited to Examples, etc. described below.

Example 1

The lead frame 100 having a structure illustrated in FIGS. 1 and 2 was prepared. In the lead frame 100, the upper surface and the sidewall surface of the lead portion 110 and the upper surface and the sidewall surface of the die pad portion 120 were configured by roughened surfaces having the following structure: the value of a* in the CIELab color space is 17.53; the value of b* is 14.80; the arithmetic mean peak curvature Spc of peaks is 2,431.46 mm$^{-1}$; and the arithmetic mean height Sa is 0.14 μm. The value of a* and the value were measured using a spectral density meter/colorimeter "eXact" (manufactured by X-Rite, Incorporated). The arithmetic mean peak curvature Spc of peaks and the arithmetic mean height Sa were measured using a laser microscope VK-X260 (manufactured by Keyence Corporation, a measurement unit) and a laser microscope VK-X250 (manufactured by Keyence Corporation, a controller unit).

Example 2

The lead frame 100 having the same structure as that of Example 1, except that the upper surface and the sidewall surface of the lead portion 110 and the upper surface and the sidewall surface of the die pad portion 120 were configured by roughened surfaces having the following structure, was prepared: the value of a* in the CIELab color space is 16.03; the value of b* is 13.84; the arithmetic mean peak curvature Spc of peaks is 2,952.08 mm$^{-1}$; and the arithmetic mean height Sa is 0.17 μm.

Example 3

The lead frame 100 having the same structure as that of Example 1, except that the upper surface and the sidewall surface of the lead portion 110 and the upper surface and the sidewall surface of the die pad portion 120 were configured by roughened surfaces having the following structure, was prepared: the value of a* in the CIELab color space is 15.39; the value of b* is 13.16; the arithmetic mean peak curvature Spc of peaks is 3,523.76 mm$^{-1}$; and the arithmetic mean height Sa is 0.22 μm.

Example 4

The lead frame 100 having the same structure as that of Example 1, except that the upper surface and the sidewall surface of the lead portion 110 and the upper surface and the sidewall surface of the die pad portion 120 were configured by roughened surfaces having the following structure, was prepared: the value of a* in the CIELab color space is 14.65; the value of b* is 12.86; the arithmetic mean peak curvature Spc of peaks is 3,378.00 mm$^{-1}$; and the arithmetic mean height Sa is 0.21 μm.

Comparative Example 1

A lead frame having the same structure as that of Example 1, except that the upper surface and the sidewall surface of the lead portion 110 and the upper surface and the sidewall surface of the die pad portion 120 were configured by roughened surfaces having the following structure, was prepared: the value of a* in the CIELab color space is 18.59; the value of b* is 17.29; the arithmetic mean peak curvature Spc of peaks is 629.05 mm*; and the arithmetic mean height Sa is 0.11 μm.

Comparative Example 2

The lead frame having the same structure as that of Example 1, except that the upper surface and the sidewall surface of the lead portion 110 and the upper surface and the sidewall surface of the die pad portion 120 were configured by non-rough surfaces not having been subjected to roughening treatment and having the following structure, was prepared: the value of a* in the CIELab color space is 10.06; the value of b* is 7.18; the arithmetic mean peak curvature Spc of peaks is 986.96 mm$^{-1}$; and the arithmetic mean height Sa is 0.09 μm.

[Test Example] Roughened-surface State Evaluation Test

The state of the rough surface of each of the lead frames according to Examples 1 to 4 and Comparative Examples 1 and 2 was observed using the SEM and the laser microscopes, and the shear strength of each of the lead frames according to Examples 1 to 4 and Comparative Examples 1 and 2 was measured. The results are shown in Table 1. The shear strength was measured by molding mold resin on the lead frame and applying a force in a shear direction thereto as a mold resin adhesion strength test (pudding cup test). As the mold resin, EME-631 (manufactured by Sumitomo Bakelite Co., Ltd.) was used, the mold resin molding was performed for a molding time of 120 seconds at a molding temperature of 175±5° C. at a molding pressure of 10 MPa, and curing was thereafter performed at 175° C. for six hours.

The size of the molded mold resin is 4 mm in height, 4 mm in bottom-surface diameter, 3 mm in top-surface diameter, and its bottom surface side was molded on the lead frame. The lead frame was thereafter fixed to a bonding strength tester DAGE 4000 (manufactured by Nordson Corporation), and a shear strength was measured while applying a shear load of 1 kg at a speed of 0.1 mm/sec. in a lateral direction to the mold resin on the lead frame.

TABLE 1

|  | Shear Strength (kN/cm$^2$) |
| --- | --- |
| Example 1 | 1.35 |
| Example 2 | 1.40 |
| Example 3 | 1.45 |
| Example 4 | 1.50 |
| Comparative Example 1 | 1.28 |
| Comparative Example 2 | 1.20 |

As shown in Table 1, an increase in shear strength was confirmed when the value of a* in the CIELab color space of the roughened surface which the lead frame 100 has is within a range from 12 to 19 and the value of b* is within a range from 12 to 17, as compared with when the value of a* and the value of b* are not within the above ranges. Therefore, it is inferred that configuring the value of a* and the value of b* to be within the above ranges increases the strength of adhesion to the mold resin in the semiconductor device manufactured using the lead frame 100, thereby making it possible to suppress the entry of moisture in air to the electrode 210A of the semiconductor element 210.

Moreover, an increase in shear strength was confirmed when the arithmetic mean peak curvature Spc of peaks of the roughened surface of the lead frame 100 is 700 mm$^{-1}$ or greater, as compared with when the arithmetic mean peak curvature Spc of peaks is less than 700 mm.

Furthermore, the arithmetic mean height Sa of the roughened surface of each of the lead frames 100 according to Examples 1 to 4 is 0.12 μm or greater. From these results, it is inferred that configuring the arithmetic mean peak curvature Spc of peaks of the roughened surface to be 700 mm$^{-1}$ or greater and the arithmetic mean height Sa of the roughened surface to be 0.12 μm or greater increases the strength of adhesion to the mold resin in the semiconductor device manufactured using the lead frame 100, thereby making it possible to suppress the entry of moisture in air to the electrode 210A of the semiconductor element 210. Note that the arithmetic mean peak curvature Spc of peaks of the non-rough surface not having been subjected to roughening treatment according to Comparative Example 2 is 700 mm$^{-1}$ or greater. The reason why the arithmetic mean peak curvature Spc of the peaks is 700 mm$^{-1}$ or greater seems to be due to the presence of a sharp mountain of a rolling scar in the process of manufacturing the lead frame according to Comparative Example 2 by roll-machining the metal substrate. Note that the arithmetic mean peak curvature Spc of peaks of the roughened surface of the lead frame according to Comparative Example 1 is less than the arithmetic mean peak curvature Spc of peaks of the non-roughened surface according to Comparative Example 2. The reason why the value of the arithmetic mean peak curvature Spc thereof is less seems to be due to forming the roughened surface by performing roughening to an extent that the peak of a sharp mountain of a rolling scar is scraped away in the process of forming the roughened surface. The roughened surface of each of the lead frames 100 according to Examples 1 to 4 is a rough surface having been roughened more than the roughened surface of the lead frame according to Comparative Example 1. It is inferred that, for this reason, the etching goes deeper, resulting in greater values of the arithmetic mean peak curvature Spc of peaks.

Second Embodiment

Next, with reference to FIGS. 8 to 17, a second embodiment will now be described. In each drawing mentioned below, the same reference signs may be assigned to the same portions, and a detailed explanation may be partially omitted.

(Structure of Lead Frame)

Figure 8:
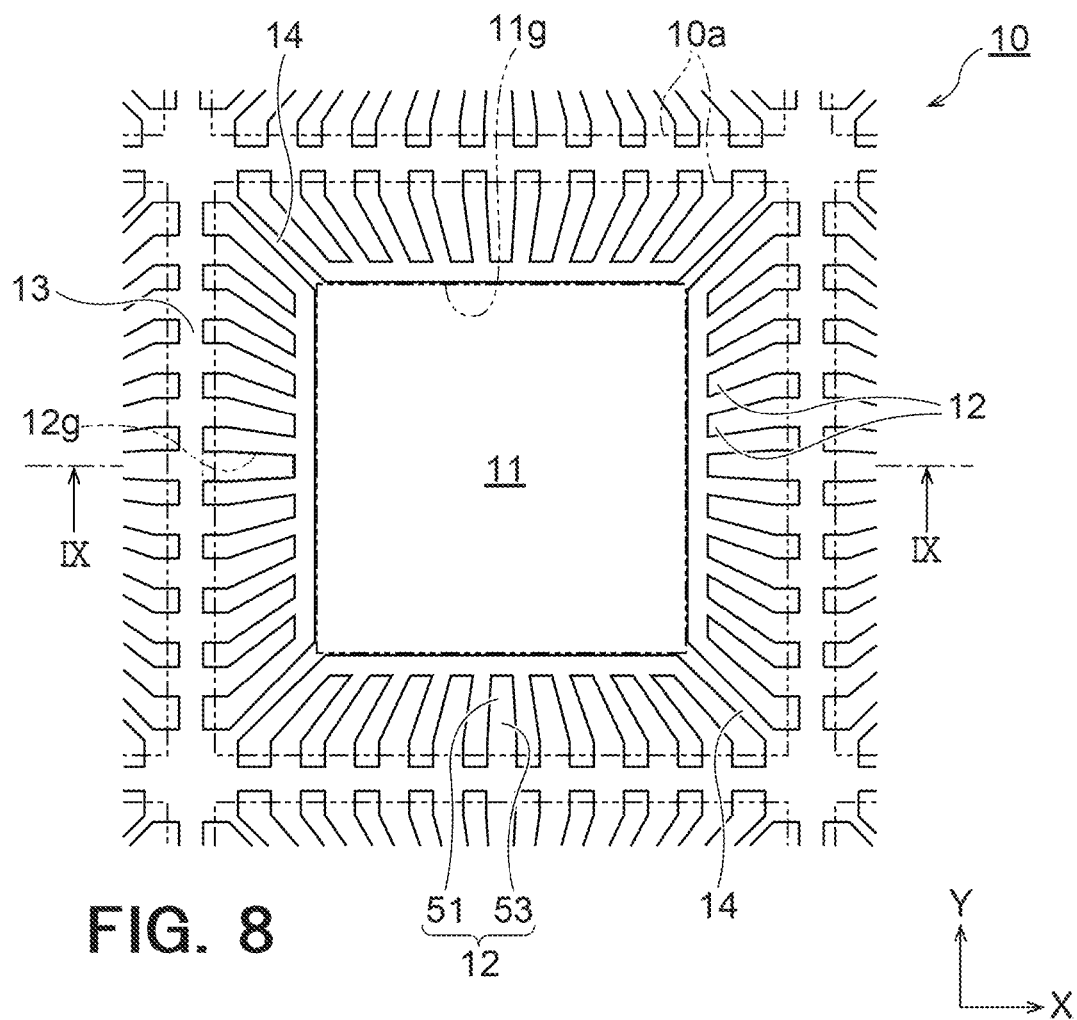
FIG. 8 is a plan view of a lead frame according to a second embodiment.
Figure 9:
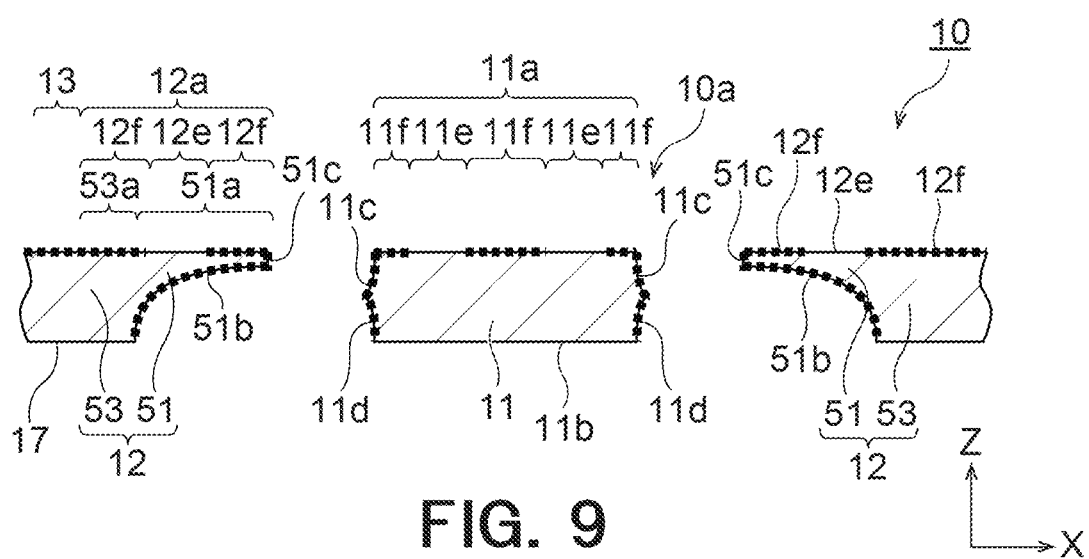
FIG. 9 is a cross-sectional view (taken along IX-IX of FIG. 8) of a lead frame according to the second embodiment.

First, with reference to FIGS. 8 to 10, an overview of a lead frame according to the present embodiment will now be given. FIGS. 8 to 10 are diagrams illustrating a lead frame according to the present embodiment.

Figure 11:
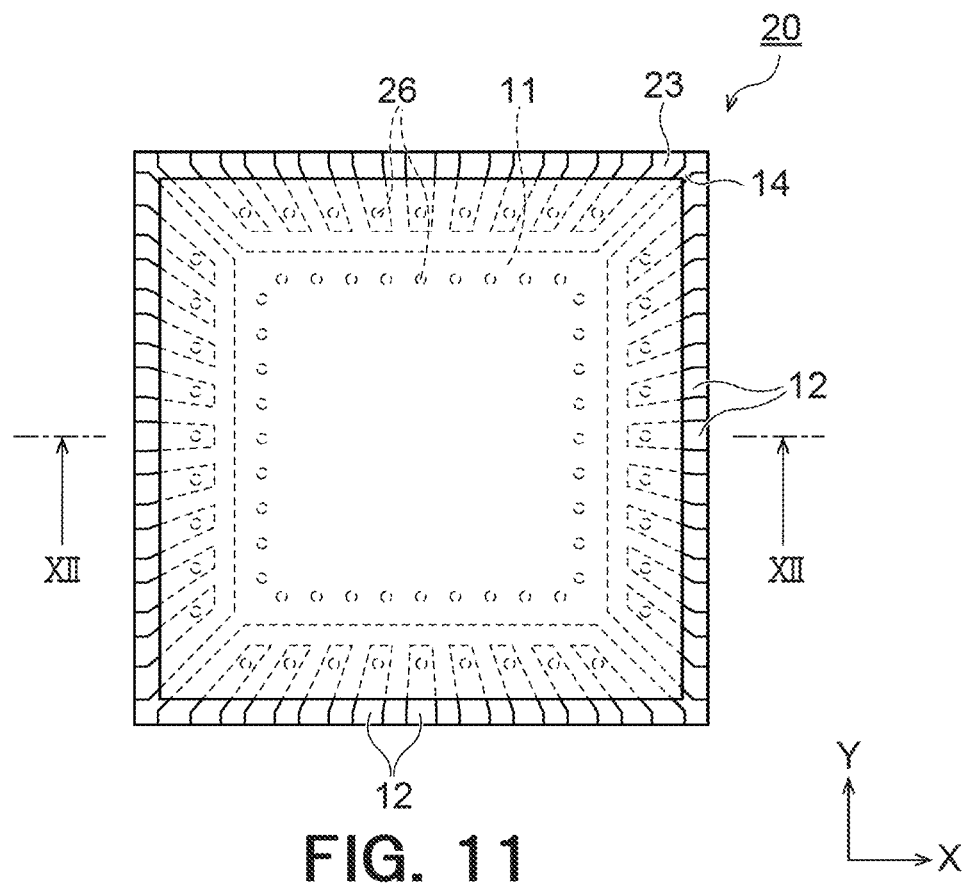
FIG. 11 is a plan view of a semiconductor device according to the second embodiment.
Figure 12:
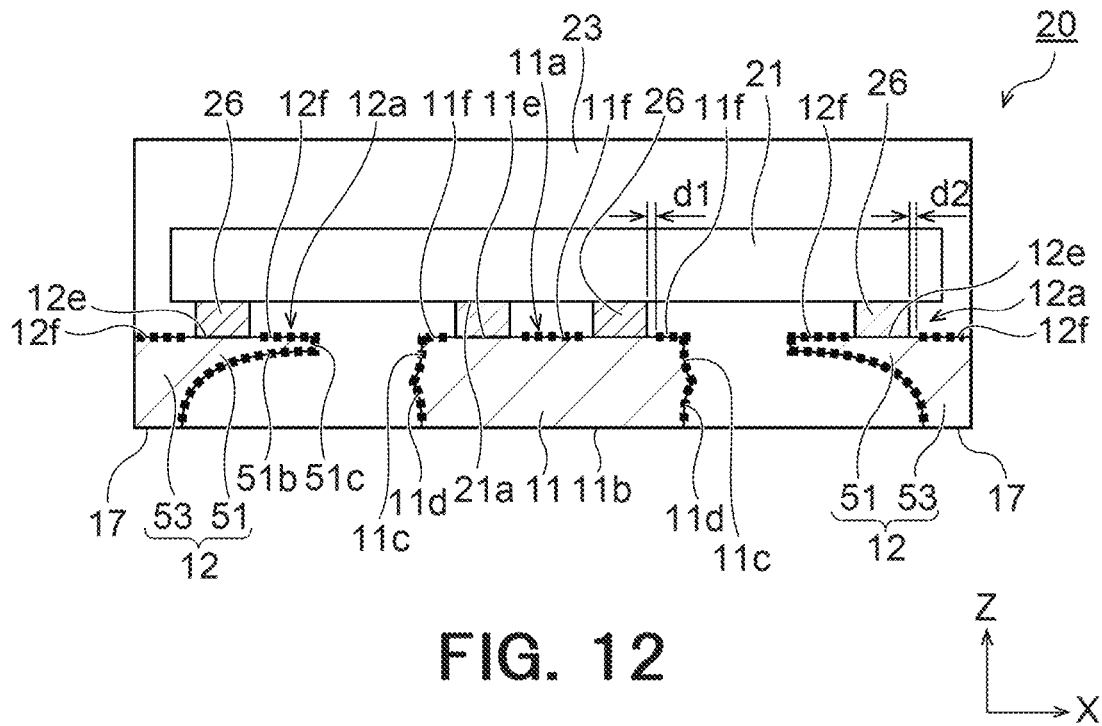
FIG. 12 is a cross-sectional view (taken along XII-XII of FIG. 11) of a semiconductor device according to the second embodiment.

A lead frame 10 illustrated in FIGS. 8 and 9 is used when manufacturing a semiconductor device 20 (FIGS. 11 and 12). The lead frame 10 includes a plurality of package areas 10a. The plurality of package areas 10a is in a multi-column-and-multi-row (matrix pattern) layout. Note that only a part of the lead frame 10 is illustrated in FIG. 8, focusing on one package area 10a.

In this description, the terms "inward" and "inner side" refer to a directional side of coming toward the center of each package area 10a. The terms "outward" and "outer side" refer to a directional side of going away from the center of each package area 10a (toward a connecting bar 13). The term "front surface" refers to a surface on which a semiconductor element 21 is mounted. The term "back surface" refers to a surface that is the opposite of the front surface and that is to be connected to an external mounting board that is not illustrated. The term "side surface" refers to a surface that is located between the front surface and the back surface and constitutes a thickness of the lead frame 10 (metal substrate).

In this description, the term "half etching" refers to etching an etching target material halfway through it in its thickness direction. The thickness of the etching target material after half etching is, for example, 30% or greater and 70% or less of the thickness of the etching target material before half etching, preferably, 40% or greater and 60% or less thereof.

As illustrated in FIGS. 8 and 9, each package area 10a of the lead frame 10 includes a die pad 11 and lead portions 12 located around the die pad 11. Among them, the lead portion 12 is partially thinned from its back surface side. The back surface of the lead portion 12 at its thinned part is a roughened surface. The back surface of the lead portion 12 at its non-thinned part is a smooth surface.

The package area 10a is an area corresponding to the semiconductor device 20 (described later). The package area 10a is an area surrounded by virtual lines forming a quadrangular shape (two-dot chain lines) in FIG. 8. In the present embodiment, the lead frame 10 includes the plurality of package areas 10a. However, this is a non-limiting example; a single package area 10a only may be formed in one lead frame 10.

The package areas 10a are connected to one another via the connecting bars (supporting member) 13. The connecting bars 13 support the die pad 11 and the lead portions 12. The connecting bars 13 extend in X and Y directions respectively. The X and Y directions are two directions parallel to the sides of the package area 10a in a plane of the lead frame 10. The X and Y directions are orthogonal to each other. A Z direction is a direction perpendicular to both of the X and Y directions.

The connecting bars 13 are disposed around the package area 10a outward of the package area 10a. Each connecting bar 13 has an elongated rod shape in a plan view. The width of each connecting bar 13 (distance in a direction orthogonal to the length direction of the connecting bar 13) may be 95 µm or greater and 250 µm or less. To each connecting bar 13, a plurality of lead portions 12 is connected at intervals in the length direction of the connecting bar 13. The die pad 11 is supported via suspension leads 14 by the connecting bars 13. The connecting bar 13 is not thinned, though not limited thereto; for example, it may be thinned from its back surface side by half etching. The thickness of the connecting bar 13 may be 80 µm or greater and 200 µm or less, though dependent on the structure of the semiconductor device 20.

As illustrated in FIG. 9, the die pad 11 has a die pad front surface 11a, which is located at the front surface side, and a die pad back surface 11b, which is located at the back surface side. As will be described later, the semiconductor element 21 is mountable on the die pad front surface 11a. The die pad back surface 11b is exposed to the outside from the semiconductor device 20 (described later). A first die pad side surface 11c and a second die pad side surface 11d are formed at, of the die pad 11, the side face oriented toward the lead portion 12. The first die pad side surface 11c is located at the die pad front surface 11a side. The second die pad side surface 11d is located at the die pad back surface 11b side. In this case, each of the first die pad side surface 11c and the second die pad side surface 11d of the die pad 11 is a roughened surface. On the other hand, as will be described later, a smooth surface (die pad smooth surface area 11e) and a roughened surface (die pad roughened surface area 11f) are formed in the die pad front surface 11a. The die pad back surface 11b is a smooth surface. In the present embodiment, the term "roughened surface" refers to a surface an S ratio of which is 1.30 or higher. The term "smooth surface" refers to a surface the S ratio of which is lower than 1.30.

A roughened surface is a surface that is rougher than a smooth surface. The S ratio of "roughened surface" should preferably be 1.30 or higher and 2.30 or lower. The S ratio of "smooth surface" should preferably be 1.00 or higher and 1.20 or lower. The S ratio is the quotient of division, by an observation area, of a surface area obtained by measuring a measurement target surface with segmentation into a plurality of pixels by means of an optical-interferometer-type measurement device. Specifically, this value is calculated by dividing, by an observation area, a surface area obtained by measuring a measurement target surface with segmentation into a plurality of pixels by means of VertScan manufactured by Hitachi Hi-Tech Corporation.

The roughened surface may be formed by, for example, performing a surface roughening treatment of an outer surface of a metal substrate 31 to be described later by means of a micro etching fluid that contains hydrogen peroxide and sulfuric acid as principal components. The smooth surface may be a non-treated surface, which is a surface of the metal substrate 31 to be described later not having been subjected to such a surface roughening treatment. In FIG. 9, roughened portions are indicated by thick broken lines (the same holds true for the other cross-sectional views, too).

The die pad front surface 11a of the die pad 11 is an area (internal terminal) that is to be electrically connected to the semiconductor element 21 via bumps 26 as will be described later. The die pad front surface 11a may be an area that is not thinned by half etching or the like. In the die pad front surface 11a, the die pad smooth surface area 11e, which is an area having a smooth surface, and the die pad roughened surface area 11f, which is an area having a roughened surface, are formed.

A plurality of die pad smooth surface areas 11e may be formed on the die pad front surface 11a. Each of the plurality of die pad smooth surface areas 11e is connected to the corresponding one of the bumps 26 (see FIG. 12). The number of the die pad smooth surface areas 11e on the die pad 11 may be the same as the number of the bumps 26 connected to the die pad 11. Alternatively, a plurality of bumps 26 may be disposed in one die pad smooth surface area 11e. In this case, the number of the die pad smooth surface areas 11e on the die pad 11 may be less than the number of the bumps 26 connected to the die pad 11.

Figure 10A:
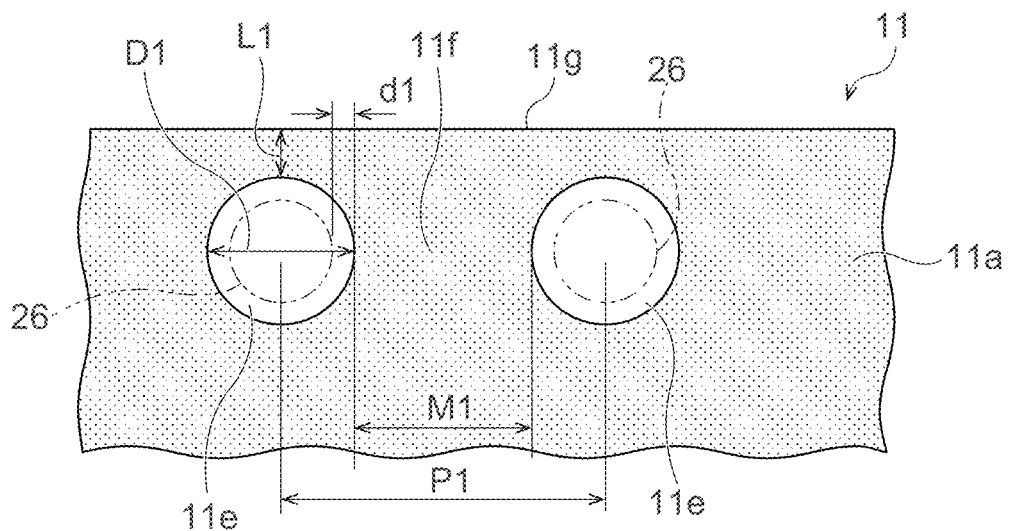
FIGS. 10A and 10B are enlarged plan views of a front surface of a die pad and a front surface of a lead portion respectively.

The die pad roughened surface area 11f is rougher than the die pad smooth surface area 11e (has a higher S ratio). As illustrated in FIG. 10A, in a plan view, the die pad roughened surface area 11f is formed in such a way as to surround the entire perimeter of each die pad smooth surface area 11e. That is, the die pad smooth surface area 11e does nowhere directly adjoin the peripheral edge 11g of the die pad 11. In addition, the die pad roughened surface area 11f is formed along the entirety of the peripheral edge 11g of the die pad 11 in a plan view. The peripheral edge 11g of the die pad 11 mentioned here means a region enclosed by the plurality of (four) sides of the die pad 11 as illustrated in FIG. 8. The entire area of the die pad front surface 11a except for the die pad smooth surface area 11e may be the die pad roughened surface area 11f. That is, the die pad front surface 11a may be comprised only of the plurality of die pad smooth surface areas 11e and the die pad roughened surface area 11f other than them.

Figure 10B:
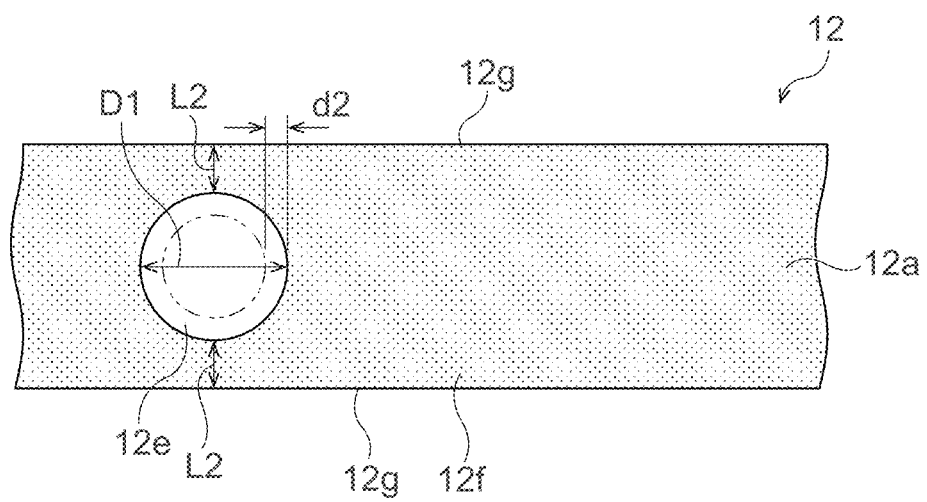

As illustrated in FIG. 10A, the die pad smooth surface area 11e may have a circular shape in a plan view. The die pad smooth surface area 11e should preferably be larger than the bump 26 (virtual line) in a plan view. The width (diameter) D1 of the die pad smooth surface area 11e may be 0.030 mm or greater, or 0.035 mm or greater. The width (diameter) D1 may be 0.070 mm or less, or 0.065 mm or less. When the bump 26 is disposed at the center of the die pad smooth surface area 11e, the minimum distance d1 between the circumferential edge of the bump 26 and the circumferential edge of the die pad smooth surface area 11e may be 0.005 mm or longer, or 0.010 mm or longer. The minimum distance d1 may be 0.020 mm or shorter, or 0.015 mm or shorter. The minimum distance L1 between the die pad smooth surface area 11e and the peripheral edge 11g of the die pad 11 may be 0.025 mm or longer, or 0.030 mm or longer. The minimum distance L1 may be 1.0 mm or shorter, or 0.50 mm or shorter. Since the die pad smooth surface area 11e has a circular shape in a plan view, it is easier to position the bump 26, which is circular, in relation to the die pad smooth surface area 11e. In FIGS. 10A and 10B, the portion configured to be a smooth surface is in white, and the portion configured to be a roughened surface is shaded (the same holds true for FIGS. 17A to 17D).

In FIG. 10A, in a case where there exists a plurality of die pad smooth surface areas 11e in the die pad front surface 11a, the minimum distance M1 between the die pad smooth surface areas 11e located next to each other may be 0.030 mm or longer, or 0.040 mm or longer. The minimum distance M1 may be 1.0 mm or shorter, or 0.50 mm or shorter. The pitch P1 of the centers of the die pad smooth surface areas 11e located next to each other may be 0.045 mm or longer, or 0.057 mm or longer. The pitch P1 may be 1.2 mm or shorter, or 0.60 mm or shorter. The pitch P1 mentioned above is equivalent to the pitch of the centers of the bumps 26 located next to each other.

Referring to FIG. 9, an external terminal may be formed on the die pad back surface 11b of the die pad 11. This external terminal may be electrically connected to a mounting board that is not illustrated. The die pad back surface 11b is not thinned by, for example, half etching, and is a smooth surface, similarly to the surface of a before-treatment metal substrate (metal substrate 31 to be described later). The die pad back surface 11b is exposed to the outside from the semiconductor device 20 after the manufacturing of the semiconductor device 20 (described later).

Each lead portion 12 is configured to be connected to the semiconductor element 21 via the bump 26 as will be described later, and is disposed with a space from the die pad 11. The lead portions 12 are spaced apart from one another in the length direction of the connecting bar 13. Each lead portion 12 extends from the connecting bar 13.

The lead portions 12 are disposed around the die pad 11. The lead portion 12 is partially thinned from its back surface side. In this case, of the lead portion 12, the back surface of an inner lead 51 to be described later is thinned. An external terminal 17 is formed at the non-thinned part of the back surface of the lead portion 12. The external terminal 17 is configured to be electrically connected to an external mounting board (not illustrated). The external terminal 17 is exposed to the outside from the semiconductor device 20 after the manufacturing of the semiconductor device 20 (described later).

As illustrated in FIG. 9, the lead portion 12 includes the inner lead 51 and a terminal portion 53. The inner lead 51 is located at an inner side (die pad 11 side). The terminal portion 53 is located at an outer side (connecting bar 13 side). The inner lead 51 extends from the terminal portion 53 toward the die pad 11. An internal terminal is formed on a front surface of the inner lead 51. The internal terminal is an area (lead smooth surface area 12e) that is to be electrically connected to the semiconductor element 21 via the bump 26 as will be described later.

The inner lead 51 is thinned from its back surface side by, for example, half etching. The inner lead 51 has an inner lead front surface 51a and an inner lead back surface 51b. The inner lead front surface 51a is located at the front surface side. In addition, an inner lead tip surface 51c is formed at, of the inner lead 51, a face oriented toward the die pad 11. The inner lead back surface 51b is located at the back surface side.

The terminal portion 53 is located at the connecting bar 13 side. The base end of the terminal portion 53 is connected to the connecting bar 13. The terminal portion 53 has a terminal portion front surface 53a. The external terminal 17 described above is formed on the back surface of the terminal portion 53. Not being half-etched, the terminal portion 53 has the same thickness as that of the die pad 11. The back surface side of the part, of the lead portion 12, located at the connecting bar 13 side outward of the terminal portion 53 may be thinned so as to constitute a portion for connection to the connecting bar 13.

In the present embodiment, the back surface of the lead portion 12 at its thinned part is a roughened surface. Specifically, the inner lead 51 of the lead portion 12 is thinned from its back surface side. The inner lead back surface 51b, which is located at the back surface side of the inner lead 51, is a roughened surface throughout the entire area thereof. On the other hand, the back surface of the lead portion 12 at its non-thinned part is a smooth surface. Specifically, the terminal portion 53 of the lead portion 12 is not thinned from its back surface side. The external terminal 17, which is located at the back surface side of the terminal portion 53, is a smooth surface throughout the entire area thereof.

Furthermore, the inner lead tip surface 51c of the lead portion 12 is a roughened surface throughout the entire area thereof. Though not illustrated, both side surfaces along the length direction of the lead portion 12 may also be roughened surfaces. On the other hand, the inner lead 51 of the lead portion 12 is not thinned from its front surface side. Moreover, the terminal portion 53 of the lead portion 12 is not thinned from its front surface side.

The inner lead front surface 51a of the inner lead 51 and the terminal portion front surface 53a of the terminal portion 53 constitute a lead front surface 12a. The lead front surface 12a is an area that is not thinned from its front surface side by half etching, etc. In the lead front surface 12a, a lead smooth surface area 12e, which is an area having a smooth surface, and a lead roughened surface area 12f, which is an area having a roughened surface, are formed.

In the lead front surface 12a of each lead portion 12, one lead smooth surface area 12e is formed. In the lead front surface 12a of each lead portion 12, a plurality of lead smooth surface areas 12e may be formed. Each of the plurality of lead smooth surface areas 12e is connected to the corresponding one of the bumps 26 (see FIG. 12). A plurality of bumps 26 may be disposed in one lead smooth surface area 12e. In this case, the number of the lead smooth surface areas 12e on each lead portion 12 may be less than the number of the bumps 26 connected to this lead portion 12.

The lead roughened surface area 12f exists around the lead smooth surface area 12e. The lead roughened surface area 12f is rougher than the lead smooth surface area 12e (has a higher S ratio). As illustrated in FIG. 10B, in a plan view, the lead roughened surface area 12f is formed in such a way as to surround the entire perimeter of each lead smooth surface area 12e. That is, the lead smooth surface area 12e does nowhere directly adjoin the peripheral edge 12g of the lead portion 12. In addition, the lead roughened surface area 12f is formed along the entirety of the peripheral edge 12g of the lead portion 12 in a plan view. The peripheral edge 12g of the lead portion 12 mentioned here means a region enclosed by the plurality of (three) sides of the lead portion 12 and by the connecting bar 13 as illustrated in FIG. 8. The entire area of the lead front surface 12a except for the lead smooth surface area 12e may be the lead roughened surface area 12f. That is, the lead front surface 12a may be comprised only of the lead smooth surface area(s) 12e and the lead roughened surface area 12f other than it/them.

As illustrated in FIG. 10B, the lead smooth surface area 12e may have a circular shape in a plan view. The shape of the lead smooth surface area 12e may be the same as that of the die pad smooth surface area 11e described above or different therefrom. The lead smooth surface area 12e should preferably be larger than the bump 26 (virtual line) in a plan view. The width (diameter) D2 of the lead smooth surface area 12e may be 0.030 mm or greater, or 0.035 mm or greater. The width (diameter) D2 may be 0.070 mm or less, or 0.065 mm or less. When the bump 26 is disposed at the center of the lead smooth surface area 12e, the minimum distance d2 between the circumferential edge of the bump 26 and the circumferential edge of the lead smooth surface area 12e may be 0.005 mm or longer, or 0.010 mm or longer. The minimum distance d2 may be 0.020 mm or shorter, or 0.015 mm or shorter. The minimum distance L2 between the lead smooth surface area 12e and the peripheral edge 12g of the lead portion 12 may be 0.025 mm or longer, or 0.030 mm or longer. The minimum distance L2 may be 1.0 mm or shorter, or 0.50 mm or shorter. Since the lead smooth surface area 12e has a circular shape in a plan view, it is easier to position the bump 26, which is circular, in relation to the die pad smooth surface area 11e.

The lead frame 10 having been described above is made of metal such as copper, copper alloy, 42 alloy (42%-nickel-content Fe alloy), or the like as a whole. The thickness of the non-thinned part of the lead frame 10 may be 80 m or greater and 300 m or less, though dependent on the structure of the semiconductor device 20 to be manufactured.

In the present embodiment, the lead portions 12 are arranged along all of the four sides of the package area 10a but are not limited thereto. For example, they may be arranged along two mutually-opposite sides only of the package area 10a.

(Structure of Semiconductor Device)

Next, with reference to FIGS. 11 to 13, a semiconductor device according to the present embodiment will now be described. FIGS. 11 to 13 are diagrams illustrating a semiconductor device according to the present embodiment (flip-chip type).

As illustrated in FIGS. 11 and 12, the semiconductor device (semiconductor package) 20 includes the die pad 11, the semiconductor element 21, the plurality of lead portions 12, the plurality of bumps 26, and a molding resin 23.

Among them, the semiconductor element 21 is mounted on the die pad 11 and the lead portions 12. Each of the plurality of bumps 26 provides electrical connection between the semiconductor element 21 and the die pad 11 or the lead portion 12. In this case, the bump 26 constitutes a connecting portion. The bump 26 may be a pillar. The molding resin 23 seals the die pad 11, the lead portions 12, the semiconductor element 21, and the bumps 26.

The die pad 11 and the lead portions 12 are made of the above-described lead frame 10. In this case, the inner lead 51 of the lead portion 12 is thinned from its back surface side. The inner lead back surface 51b of the inner lead 51 is a roughened surface. The molding resin 23 is closely adhered to the inner lead back surface 51b. The terminal portion 53 of the lead portion 12 is not thinned from its back surface side. The external terminal 17, which is located on the back surface of the terminal portion 53, has a smooth surface. The external terminal 17 is exposed to the outside from the molding resin 23.

The bumps 26 are provided on the die pad 11 and the lead portions 12 respectively. The bump 26 on the die pad 11 is provided in the die pad smooth surface area 11e. The bump 26 is spaced apart from the die pad roughened surface area 11f by the minimum distance d1. The bump 26 on the lead portion 12 is provided in the lead smooth surface area 12e. The bump 26 is spaced apart from the lead roughened surface area 12f by the minimum distance d2. The semiconductor element 21 and the die pad 11 and the lead portion 12 are electrically connected to each other via the bump 26.

The semiconductor element 21 is not specifically limited, and various kinds of semiconductor element commonly used in the art can be used. For example, an integrated circuit, a large-scale integrated circuit, a transistor, a thyristor, a diode, or the like can be used. The semiconductor element 21 includes a plurality of electrodes 21a to which the bumps 26 are attached respectively.

Thermosetting resin such as silicone resin or epoxy resin, or thermoplastic resin such as PPS resin, etc., can be used as the molding resin 23. The thickness of the molding resin 23 as a whole may be 300 μm or greater and 1,500 μm or less or so. The length of one side of the molding resin 23 (one side of the semiconductor device 20) may be, for example, 0.2 mm or greater and 20 mm or less, or 0.2 mm or greater and 16 mm or less. In FIG. 11, the illustration of a part, of the molding resin 23, located at the front surface side with respect to the lead portions 12 and the semiconductor element 21 is omitted.

The bump (connecting portion) 26 may be made of a metal material having good conductive property such as, for example, copper, and may be solid and have a substantially round columnar shape or a substantially globular shape. The upper end of each of the bumps 26 is connected to the electrode 21a of the semiconductor element 21, and the lower end thereof is connected to the die pad smooth surface area 11e or the lead smooth surface area 12e. The width (diameter) of the bump 26 may be 0.01 mm or greater and 0.070 mm or less. Providing the bumps 26 on the die pad 11 is not necessarily needed. In this case, the die pad 11 and the semiconductor element 21 may be fixed to each other by means of, for example, an adhesive such as a die bonding paste.

FIGS. 13A and 13B are enlarged cross-sectional views of the neighborhood of the bump 26. As illustrated in FIG. 13A, the bump 26 may have a single-layer structure. In this case, the bump 26 may include a layer made of metal such as, for example, copper. The bump 26 may be made of the same metal as the metal included mainly in the die pad 11 and the lead portions 12 (for example, copper). The height of the bump 26 may be 30 μm or greater and 110 μm or less.

Alternatively, as illustrated in FIG. 13B, the bump 26 may include a plurality of layers. For example, the bump 26 includes a first layer 26a, which is located at the die pad 11 side or the lead portion 12 side, and a second layer 26b, which is located at the semiconductor element 21 side. The first layer 26a may contain metal such as, for example, tin. The height of the first layer 26a may be 1 μm or greater and 10 μm or less. The second layer 26b may contain metal such as, for example, copper. The height of the second layer 26b may be 30 μm or greater and 100 μm or less.

Besides the above, the structure of the die pad 11 and the lead portions 12 is the same as the structure having been described earlier with reference to FIGS. 8 to 10, except for areas not included in the semiconductor device 20; therefore, a detailed explanation is not given here.

(Method of Manufacturing Lead Frame)

Next, a method of manufacturing the lead frame 10 illustrated in FIGS. 8 and 9 will now be described while referring to FIGS. 14A to 14I. FIGS. 14A to 14I are cross-sectional views of a method of manufacturing the lead frame 10 (diagrams corresponding to FIG. 9).

Figure 14A:
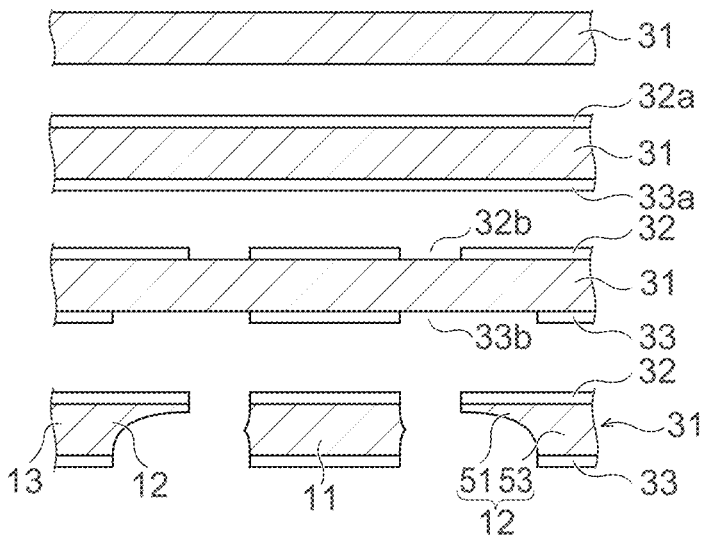

First, as illustrated in FIG. 14A, the metal substrate 31 having a flat plate shape is prepared. A substrate made of metal such as copper, copper alloy, 42 alloy (42%-nickel-content Fe alloy), or the like can be used as the metal substrate 31. A metal substrate whose both surfaces have been degreased and cleansed should preferably be used as the metal substrate 31.

Figure 14E:
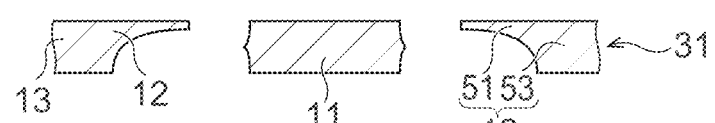
Figure 14F:
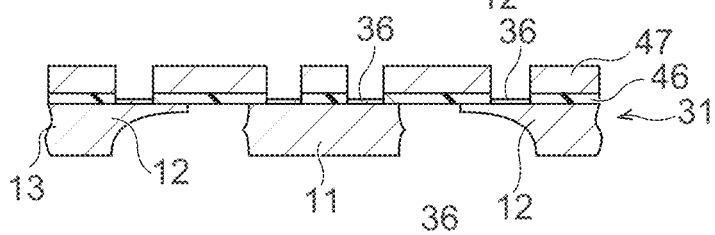
Figure 14G:
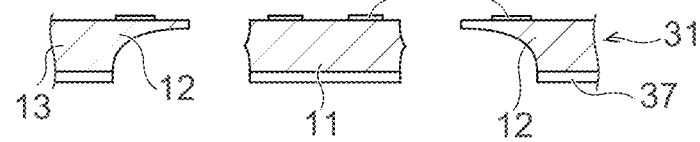
Figure 14H:
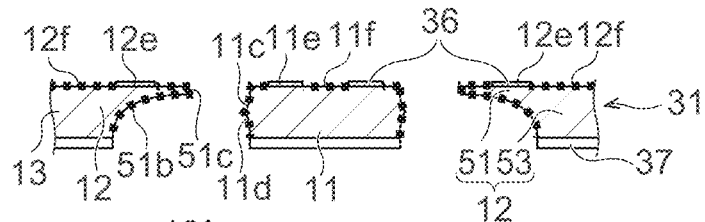
Figure 14I:
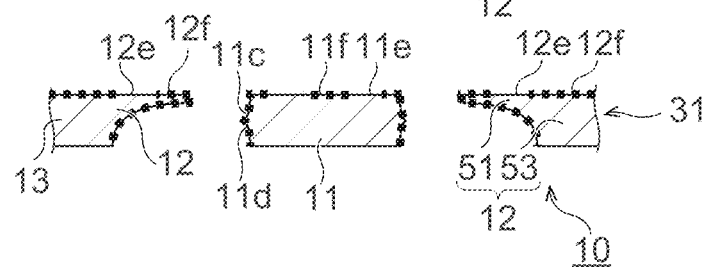
Figures 14B, 14C, 14D:
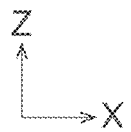

Next, a photoresist 32a, 33a is applied to each of the front and back surfaces of the metal substrate 31 throughout the entire area thereof and is then dried (FIG. 14B). A photoresist known in the art can be used as the photoresist 32a, 33a.

Next, exposure light is applied to the metal substrate 31 through a photomask to perform development, thereby forming etching resist layers 32 and 33 having desired openings 32b and 33b (FIG. 14C).

Next, an etching treatment is applied to the metal substrate 31 by means of a corrosive fluid while using the etching resist layer 32, 33 as anti-etching coating (FIG. 14D). The corrosive fluid can be selected as appropriate depending on the material of the metal substrate 31 that is used. For example, in a case where a copper substrate is used as the metal substrate 31, an aqueous ferric chloride is commonly used as the corrosive fluid, and spray etching may be performed from both surface sides of the metal substrate 31. By this means, the outer shape of the die pad 11, the lead portions 12, and the connecting bars 13 is formed. When this is performed, the lead portion 12 is partially thinned from its back surface side by half etching. Specifically, the back surface of the inner lead 51 of the lead portion 12 undergoes thinning.

Next, the etching resist layers 32 and 33 are taken away (FIG. 14E). The metal substrate 31 that includes the die pad 11 and lead portions 12 located around the die pad 11 can be obtained in this way.

Next, a plating layer 36 is formed on a part of the metal substrate 31 (FIG. 14F). When this is performed, first, an elastic member 46 such as a rubber gasket having a predetermined pattern of openings is disposed on the surface of the metal substrate 31. The openings of the elastic member 46 have a shape corresponding to the die pad smooth surface area 11e and the lead smooth surface area 12e. Next, the surface of the metal substrate 31 is held by means of a jig 47, with the elastic member 46 sandwiched therebetween. The jig 47 has openings with the same pattern as that of the elastic member 46. Next, the plating layer 36 is formed on, of the front surface of the metal substrate 31, the part not covered by the elastic member 46 and the jig 47. Accordingly, the plating layer 36 is formed at the part corresponding to the die pad smooth surface area lie of the die pad 11 and the part corresponding to the lead smooth surface area 12e of the lead portion 12. The thickness of the plating layer 36 may be greater than 0 μm but not greater than 2 μm. As the metal of which the plating layer 36 is made, for example, silver may be used. In a case where the plating layer 36 is a silver plating layer, a silver plating fluid containing silver cyanide and potassium cyanide as principal components can be used as an electrolytic plating fluid.

Next, the elastic member 46 and the jig 47 are removed. In addition, a supporting layer 37 that supports the metal substrate 31 is provided on the back surface of the metal substrate 31 (FIG. 14G). The supporting layer 37 may be, for example, a resist layer.

Next, as illustrated in FIG. 14H, of the metal substrate 31, the part not covered by the plating layer 36 and the supporting layer 37 is roughened, thereby forming roughened surfaces at the part. Specifically, the die pad roughened surface area 11f and the lead roughened surface area 12f are formed on the metal substrate 31 respectively. Furthermore, the first die pad side surface 11c, the second die pad side surface 11d, the inner lead tip surface 51c, and the inner lead back surface 51b turn into roughened surfaces. While this is performed, roughened surfaces are formed throughout the entire surface of the metal substrate 31 except for the part covered by the plating layer 36 and the supporting layer 37 by supplying a micro etching fluid to the metal substrate 31. The micro etching fluid is a surface treatment agent that slightly erodes a metal surface to form a fine convex-and-concave roughened surface. For example, when surface roughening of the metal substrate 31 made of copper or copper alloy is performed, a micro etching fluid that contains hydrogen peroxide and sulfuric acid as principal components may be used.

Next, as illustrated in FIG. 14I, the supporting layer 37 and the plating layer 36 are taken away sequentially, thereby obtaining the lead frame 10 illustrated in FIGS. 8 and 9.

(Method of Manufacturing Semiconductor Device)

Next, a method of manufacturing the semiconductor device 20 illustrated in FIGS. 11 and 12 will now be described while referring to FIGS. 15A to 15D. FIGS. 15A to 15D are cross-sectional views of a method of manufacturing the semiconductor device 20 (diagrams corresponding to FIG. 12).

First, the lead frame 10 is manufactured using, for example, the method illustrated in FIGS. 14A to 14I (FIG. 15A).

Next, the semiconductor element 21 is mounted onto the die pad 11 and the lead portions 12 of the lead frame 10. In this case, the bump 26 has been formed in advance on each of the electrodes 21a of the semiconductor element 21. Next, the bumps 26 are connected to the die pad 11 and the lead portions 12 respectively, and are fixed thereto (FIG. 15B). When this is performed, each electrode 21a of the semiconductor element 21 and the die pad 11 and the lead portion 12 is electrically connected to each other via the bump 26. The bump 26 on the die pad 11 is connected to the die pad smooth surface area 11e. When this is performed, the bump 26 is disposed apart from the die pad roughened surface area 11f. The bump 26 on the lead portion 12 is connected to the lead smooth surface area 12e. When this is performed, the bump 26 is disposed apart from the lead roughened surface area 12f.

Next, the molding resin 23 is formed by performing injection molding or transfer molding of thermosetting resin or thermoplastic resin to the lead frame 10 (FIG. 15C). By this means, the die pad 11, the lead portions 12, the semiconductor element 21, and the bumps 26 are sealed with resin.

After the sealing, the lead frame 10 and the molding resin 23 are cut into the package areas 10a. As a result of this cutting, the lead frame 10 is separated into pieces each corresponding to the semiconductor device 20, and the semiconductor device 20 illustrated in FIGS. 11 and 12 can be obtained (FIG. 15D).

By the way, it could happen that, during long-term use of the semiconductor device 20 having been manufactured in this way, moisture in air, etc. enters via an interface between the molding resin 23 and the die pad 11 or the lead portion 12 from the side surface side or the back surface side of the semiconductor device 20.

To address this issue, according to the present embodiment, the die pad roughened surface area 11f exists in such a way as to surround the entire perimeter of the die pad smooth surface area 11e. Similarly, the lead roughened surface area 12f exists in such a way as to surround the entire perimeter of the lead smooth surface area 12e. For this reason, the distance of an entry path along which moisture enters via the interface between the die pad front surface 11a or the lead front surface 12a and the molding resin 23, outside the bump 26, is long. This makes it possible to suppress the entry of the moisture toward the semiconductor element 21 via the interface between the die pad front surface 11a or the lead front surface 12a and the molding resin 23 (see an arrow $F_A$ in FIG. 16). Consequently, it is possible to improve the reliability of the semiconductor device 20 after long-term use.

Moreover, according to the present embodiment, of the die pad front surface 11a, the die pad smooth surface area lie located outward of and next to the bump 26 is a smooth surface. Furthermore, of the lead front surface 12a, the lead smooth surface area 12e located outward of and next to the bump 26 is a smooth surface.

Therefore, in a case where the bump 26 has a structure of a single layer of metal such as copper (see FIG. 13A), the following effects can be obtained. When the semiconductor element 21 is mounted onto the die pad 11 and the lead portions 12, it is possible to enhance the property of close contact of the bumps 26 with the die pad 11 and the lead portions 12. If the surface of the die pad 11 and the lead portion 12 to which the bump 26 is connected were a roughened surface, due to the influence of an oxide film formed on the roughened surface (for example, copper oxide), the area of contact of the bump 26 and the roughened surface would be narrower. In this case, there is a risk of a decrease in bonding strength of the bump 26 and the die pad 11 and the lead portion 12.

Moreover, in a case where the bump 26 contains metal such as tin (see FIG. 13B), the following effects can be obtained. When the semiconductor element 21 is mounted onto the die pad 11 and the lead portions 12, it is possible to suppress tin or the like contained in the bump 26 from flowing out by running along the roughened surface. By contrast, if the portion located outward of and next to the bump 26 had a roughened surface, there is a risk that tin or the like contained in the bump 26 might flow out by running along the roughened surface due to surface tension.

In addition, according to the present embodiment, the die pad roughened surface area 11f is formed along the entirety of the peripheral edge 11g of the die pad 11 in a plan view. In addition, the lead roughened surface area 12f is formed along the entirety of the peripheral edge 12g of the lead portion 12 in a plan view. This makes it possible to more effectively suppress the entry of moisture toward the semiconductor element 21 via the interface between the die pad front surface 11a or the lead front surface 12a and the molding resin 23.

Moreover, according to the present embodiment, the inner lead back surface 51b and the inner lead tip surface 51c of the lead portion 12 are roughened surfaces. Furthermore, each of the first die pad side surface 11c and the second die pad side surface 11d of the die pad 11 is a roughened surface. For this reason, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_B$ in FIG. 16). Consequently, it is possible to improve the reliability of the semiconductor device 20 after long-term use.

Especially in the semiconductor device 20 of a flip-chip type, the electrode 21a of the semiconductor element 21 is oriented toward the back surface side. For this reason, in the semiconductor device 20 of a flip-chip type, the distance from the back surface of the semiconductor device 20 to the electrode 21a of the semiconductor element 21 tends to be short. To address this issue, according to the present embodiment, the back surface of the lead portion 12 at its thinned part is a roughened surface. This makes it possible to more effectively suppress the entry of the moisture toward the semiconductor element 21 via the interface between the molding resin 23 and the lead portion 12.

Moreover, according to the present embodiment, the inner lead back surface S1b and the inner lead tip surface 51c of the lead portion 12 are roughened surfaces. Furthermore, each of the first die pad side surface 11c and the second die pad side surface 11d of the die pad 11 is a roughened surface.

This makes it possible to increase the strength of adhesion of the die pad 11 and the lead portion 12 to the molding resin 23, thereby suppressing the die pad 11 and the lead portion 12 and the molding resin 23 from coming off from each other.

Variation Examples

Next, with reference to FIGS. 17A to 17D, variation examples of the die pad smooth surface area 11e and the lead smooth surface area 12e will now be described. Each of FIGS. 17A to 17D is an enlarged plan view of the die pad smooth surface area 11e and the lead smooth surface area 12e (hereinafter simply referred to also as "smooth surface area 11e, 12e") and the die pad roughened surface area 11f and the lead roughened surface area 12f (hereinafter simply referred to also as "roughened surface area 11f, 12f").

As illustrated in FIG. 17A, the smooth surface area 11e, 12e may have a square shape or a rectangular shape in a plan view. The width (length of each side) D3 of the smooth surface area 11e, 12e may be 0.030 mm or greater, or 0.035 mm or greater. The width D3 may be 0.070 mm or less, or 0.065 mm or less. When the bump 26 is disposed at the center of the smooth surface area 11e, 12e, the minimum distance d3 between the circumferential edge of the bump 26 and the peripheral edge of the smooth surface area 11e, 12e may be 0.005 mm or longer, or 0.010 mm or longer. The minimum distance d3 may be 0.020 mm or shorter, or 0.015 mm or shorter. The minimum distance L3 between the smooth surface area 11e, 12e and the peripheral edge 11g of the die pad 11 or the peripheral edge 12g of the lead portion 12 may be 0.025 mm or longer, or 0.030 mm or longer. The minimum distance L3 may be 1.0 mm or shorter, or 0.50 mm or shorter. Since the smooth surface area 11e, 12e has a square shape or a rectangular shape in a plan view, it is possible to ensure a sufficient minimum distance (gap) d3 between the circumferential edge of the bump 26 and the peripheral edge of the smooth surface area 11e, 12e.

As illustrated in FIG. 17B, the smooth surface area 11e, 12e may have a square shape or a rectangular shape in a plan view, and a plurality of bumps 26 may be disposed in one smooth surface area 11e, 12e. The length D4a of a longer side of the smooth surface area 11e, 12e may be 0.045 mm or greater, or 0.065 mm or greater. The length D4a may be 0.12 mm or less, or 0.10 mm or less. The length D4b of a shorter side of the smooth surface area 11e, 12e may be 0.030 mm or greater, or 0.035 mm or greater. The length D4b may be 0.070 mm or less, or 0.065 mm or less. When each bump 26 is disposed at the center of the smooth surface area 11e, 12e in the shorter-side direction, the minimum distance d4 between the circumferential edge of the bump 26 and the peripheral edge of the smooth surface area 11e, 12e in the shorter-side direction may be 0.005 mm or longer, or 0.010 mm or longer. The minimum distance d4 may be 0.020 mm or shorter, or 0.015 mm or shorter. The minimum distance L4 between the smooth surface area 11e, 12e and the peripheral edge 11g of the die pad 11 or the peripheral edge 12g of the lead portion 12 may be 0.025 mm or longer, or 0.030 mm or longer. The minimum distance L4 may be 1.0 mm or shorter, or 0.50 mm or shorter. Since the smooth surface area 11e, 12e has a square shape or a rectangular shape in a plan view, it is possible to ensure a sufficient minimum distance (gap) d4 between the circumferential edge of the bump 26 and the peripheral edge of the smooth surface area 11e, 12e. Moreover, it is possible to dispose two or more bumps 26 next to each other in each smooth surface area 11e, 12e.

As illustrated in FIG. 17C, the smooth surface area 11e, 12e may have an elliptical shape or an oblong shape in a plan view, and a plurality of bumps 26 may be disposed in one smooth surface area 11e, 12e. The length D5a of the smooth surface area 11e, 12e in its major-axis direction may be 0.045 mm or greater, or 0.065 mm or greater. The length D5a may be 0.12 mm or less, or 0.10 mm or less.

The length D5b of the smooth surface area 11e, 12e in its minor-axis direction may be 0.030 mm or greater, or 0.035 mm or greater. The length D5b may be 0.070 mm or less, or 0.065 mm or less. When each bump 26 is disposed at the center of the smooth surface area 11e, 12e in the minor-axis direction, the minimum distance d5 between the circumferential edge of the bump 26 and the peripheral edge of the smooth surface area 11e, 12e may be 0.005 mm or longer, or 0.010 mm or longer. The minimum distance d5 may be 0.020 mm or shorter, or 0.015 mm or shorter. The minimum distance L5 between the smooth surface area 11e, 12e and the peripheral edge 11g of the die pad 11 or the peripheral edge 12g of the lead portion 12 may be 0.025 mm or longer, or 0.030 mm or longer. The minimum distance L5 may be 1.0 mm or shorter, or 0.50 mm or shorter. Since the smooth surface area 11e, 12e has an elliptical shape or an oblong shape in a plan view, it is possible to dispose two or more bumps 26 next to each other in each smooth surface area 11e, 12e.

As illustrated in FIG. 17D, the peripheral edge of the smooth surface area 11e, 12e may be a closed figure that includes a curve Cv and a line segment Ls in a plan view. The smooth surface area 11e, 12e may be a figure of a circle or an ellipse with partial removal, for example, a semicircle or a semi-ellipse. The line segment Ls constituting the peripheral edge of the smooth surface area 11e, 12e may be parallel to the peripheral edge 11g of the die pad 11 or the peripheral edge 12g of the lead portion 12. The length D6a of the smooth surface area 11e, 12e in a direction orthogonal to the line segment Ls may be 0.030 mm or greater, or 0.050 mm or greater. The length D6a may be 0.12 mm or less, or 0.10 mm or less. The length D6b of the smooth surface area 11e, 12e in a direction parallel to the line segment Ls may be 0.030 mm or greater, or 0.035 mm or greater. The length D6b may be 0.070 mm or less, or 0.065 mm or less. When each bump 26 is disposed at the center of the smooth surface area 11e, 12e in the direction parallel to the line segment Ls and in the direction orthogonal thereto, the minimum distance d6 between the circumferential edge of the bump 26 and the peripheral edge of the smooth surface area 11e, 12e may be 0.005 mm or longer, or 0.010 mm or longer. The minimum distance d6 may be 0.020 mm or shorter, or 0.015 mm or shorter. The minimum distance L6 between the smooth surface area 11e, 12e and the peripheral edge 11g of the die pad 11 or the peripheral edge 12g of the lead portion 12 may be 0.025 mm or longer, or 0.030 mm or longer. The minimum distance L6 may be 1.0 mm or shorter, or 0.50 mm or shorter. Since the smooth surface area 11e, 12e has a shape of a closed figure that includes the curve Cv and the line segment Ls in a plan view, it is possible to ensure that the minimum distance L6 between the smooth surface area 11e, 12e and the peripheral edge 11g of the die pad 11 or the peripheral edge 12g of the lead portion 12 is not shorter than a certain distance.

Third Embodiment

Next, with reference to FIGS. 18 to 25, a third embodiment will now be described. FIGS. 18 to 25 are diagrams illustrating the third embodiment. In FIGS. 18 to 25, the same reference signs are assigned to the same portions as those of the embodiment illustrated in FIGS. 8 to 17, and a detailed explanation will be omitted.

(Structure of Lead Frame)

First, with reference to FIGS. 18 and 19, an overview of a lead frame according to the present embodiment will now be given. FIGS. 18 and 19 are diagrams illustrating a lead frame according to the present embodiment.

In this description, the term "outer perimeter" refers to, of the lead frame 10 (metal substrate), a portion exposed to the outside, and includes "front surface", "side surface", and "back surface".

As illustrated in FIGS. 18 and 19, each package area 10a of the lead frame 10 includes a die pad 11 and lead portions 12 located around the die pad 11. Among them, the lead portion 12 is partially thinned from its back surface side. The back surface of the lead portion 12 at its thinned part is a roughened surface. The back surface of the lead portion 12 at its non-thinned part is a smooth surface.

As illustrated in FIG. 19, the die pad 11 has a die pad front surface 11a, which is located at the front surface side, and a die pad back surface 11b, which is located at the back surface side. In this case, each of the die pad front surface 11a, the first die pad side surface 11c, and the second die pad side surface 11d of the die pad 11 is a roughened surface. On the other hand, the die pad back surface 11b of the die pad 11 is a smooth surface.

As illustrated in FIG. 19, the lead portion 12 includes an inner lead 51 and a terminal portion 53. The inner lead 51 is located at an inner side (die pad 11 side). The terminal portion 53 is located at an outer side (connecting bar 13 side). The inner lead 51 extends from the terminal portion 53 toward the die pad 11. An internal terminal is formed at a tip portion on a front surface of the inner lead 51. The internal terminal is an area that is to be electrically connected to a semiconductor element 21 via a bump 26 as will be described later.

The inner lead 51 is thinned from its back surface side by, for example, half etching. The inner lead 51 has an inner lead front surface 51a and an inner lead back surface 51b. The inner lead front surface 51a is located at the front surface side. An internal terminal is formed on a part of the inner lead front surface 51a. In addition, an inner lead tip surface 51c is formed at, of the inner lead 51, a face oriented toward the die pad 11. The inner lead back surface 51b is located at the back surface side.

The inner lead tip surface 51c of the lead portion 12 is a roughened surface throughout the entire area thereof. Though not illustrated, both side surfaces along the length direction of the lead portion 12 may also be roughened surfaces. On the other hand, the inner lead 51 of the lead portion 12 is not thinned from its front surface side. The inner lead front surface 51a, which is located at the front surface side of the inner lead 51, is a roughened surface throughout the entire area thereof. Moreover, the terminal portion 53 of the lead portion 12 is not thinned from its front surface side. A terminal portion front surface 53a, which is located at the front surface side of the terminal portion 53, is a roughened surface throughout the entire area thereof.

Besides the above, the structure of the lead frame 10 according to the present embodiment may be the same as the structure of the lead frame 10 according to the second embodiment.

In the present embodiment, the definition of "roughened surface" and "smooth surface", and the measurement method thereof, are the same as those of the second embodiment.

(Structure of Semiconductor Device)

Next, with reference to FIGS. 20 to 22, a semiconductor device according to the present embodiment will now be described. FIGS. 20 to 22 are diagrams illustrating a semiconductor device according to the present embodiment (flip-chip type).

As illustrated in FIGS. 20 and 21, the semiconductor device (semiconductor package) 20 includes the die pad 11, the semiconductor element 21, the plurality of lead portions 12, the plurality of bumps 26, and the molding resin 23.

Among them, the semiconductor element 21 is mounted on the die pad 11. The plurality of lead portions 12 is disposed around the die pad 11. Each of the plurality of bumps 26 provides electrical connection between the semiconductor element 21 and the die pad 11 or the lead portion 12. In this case, the bump 26 constitutes a connecting portion. The bump 26 may be a pillar. The molding resin 23 seals the die pad 11, the lead portions 12, the semiconductor element 21, and the bumps 26.

The bumps 26 are provided on the die pad 11 and the lead portions 12. The semiconductor element 21 and the die pad 11 and the lead portion 12 are electrically connected to each other via the bump 26.

The bump (connecting portion) 26 may be made of a metal material having good conductive property such as, for example, copper, and may be solid and have a substantially round columnar shape or a substantially globular shape. The upper end of the bumps 26 is connected to the electrodes 21a of the semiconductor element 21 respectively, and the lower end thereof is connected to the die pad 11 and the lead portions 12 respectively. Providing the bumps 26 on the die pad 11 is not necessarily needed. In this case, the die pad 11 and the semiconductor element 21 may be fixed to each other by means of, for example, an adhesive such as a die bonding paste.

FIG. 22 is an enlarged cross-sectional view of the neighborhood of the bump 26. As illustrated in FIG. 22, the bump 26 may include a plurality of layers. For example, the bump 26 includes a first layer 26a, which is located at the die pad 11 side or the lead portion 12 side, and a second layer 26b, which is located at the semiconductor element 21 side. The first layer 26a may contain metal such as, for example, tin. The height of the first layer 26a may be 1 μm or greater and 10 μm or less. The second layer 26b may contain metal such as, for example, copper. The height of the second layer 26b may be 30 μm or greater and 100 μm or less.

The semiconductor device 20 is not limited to a flip-chip-type device. For example, a bonding wire, in place of the bump 26, may constitute the connecting portion. In this case, the semiconductor element 21 and the lead portion 12 may be electrically connected to each other via the bonding wire.

Besides the above, the structure of the semiconductor device 20 according to the present embodiment may be the same as the structure of the semiconductor device 20 according to the second embodiment.

(Method of Manufacturing Lead Frame)

Next, a method of manufacturing the lead frame 10 illustrated in FIGS. 18 and 19 will now be described while referring to FIGS. 23A to 23I. FIGS. 23A to 23I are cross-sectional views of a method of manufacturing the lead frame 10 (diagrams corresponding to FIG. 19).

First, in the same manner as done in the second embodiment (FIGS. 14A to 14E), a metal substrate 31 that includes the die pad 11 and lead portions 12 located around the die pad 11 is manufactured (FIGS. 23A to 23E).

Next, a plating layer 36 is formed on a part of the outer perimeter of the metal substrate 31 (FIG. 23F). In this process, the plating layer 36 is formed on the outer-perimeter area of the metal substrate 31 except for the entire area of its front surface. That is, the plating layer 36 is formed on the entire area of the back surface and the entire area of the side surface of the metal substrate 31, without being formed on the entire area of the front surface of the metal substrate 31. More specifically, the plating layer 36 is not formed on the die pad front surface 11a of the die pad 11, nor on the inner lead front surface 51a and the terminal portion front surface 53a of the lead portion 12. On the other hand, the plating layer 36 is formed on the die pad back surface 11b, the first die pad side surface 11c, and the second die pad side surface 11d of the die pad 11. In addition, the plating layer 36 is formed on the external terminal 17, the inner lead back surface 51b, and the inner lead tip surface 51c of the lead portion 12. The plating layer 36 need not necessarily be formed on the front surface of the connecting bar 13. The plating layer 36 may be formed on the back surface of the connecting bar 13.

When this is performed, as illustrated in FIG. 23F, the entire area of the front surface of the metal substrate 31 is covered by a first jig 45, with an elastic member 44 such as a rubber gasket sandwiched therebetween. In this state, electrolytic plating is applied to the metal substrate 31, thereby forming the plating layer 36 on the metal substrate 31, except for the entire area of its front surface. The thickness of the plating layer 36 may be greater than 0 μm but not greater than 2 μm. As the metal of which the plating layer 36 is made, for example, silver may be used. In a case where the plating layer 36 is a silver plating layer, a silver plating fluid containing silver cyanide and potassium cyanide as principal components can be used as an electrolytic plating fluid. Since the plating layer 36 is not formed throughout the entire area of the front surface of the metal substrate 31 as described here, it is possible to reduce an amount of use of metal such as silver of which the plating layer 36 is made. This makes it possible to reduce the manufacturing cost of the lead frame 10.

Next, a part of the plating layer 36 that exists at areas where roughened surfaces are to be formed is removed. Specifically, the plating layer 36 existing on at least the back surface of the metal substrate 31 is left unremoved, and another part of the plating layer 36 is removed (FIG. 23G). Specifically, of the plating layer 36, the part existing on the side surfaces of the metal substrate 31 is removed. By this means, the plating layer 36 on the first die pad side surface 11c and the second die pad side surface 11d of the die pad 11 is removed. In addition, the plating layer 36 on the inner lead tip surface 51c and the inner lead back surface 51b of the lead portion 12 is removed.

While this is performed, as illustrated in FIG. 23G, first, an elastic member 46 such as a rubber gasket is disposed on the back surface of the metal substrate 31, and a second jig 47A is disposed at the back surface side of the metal substrate 31, with the elastic member 46 sandwiched therebetween. Next, the plating layer 36 at the part not covered by the elastic member 46 is taken away. As a result of this removal, the first die pad side surface 11c, the second die pad side surface 11d, the inner lead tip surface 51c, and the inner lead back surface 51b become exposed. On the other hand, the plating layer 36 on the die pad back surface 11b and the external terminal 17, which are covered by the elastic member 46, is left unremoved.

Next, as illustrated in FIG. 23H, a supporting layer 37 that supports the metal substrate 31 is provided on the back surface of the metal substrate 31. The supporting layer 37 may be, for example, a resist layer. Next, as illustrated in FIG. 23H, of the metal substrate 31, the part not covered by the plating layer 36 is roughened, thereby forming roughened surfaces at the part not covered by the plating layer 36. Specifically, each of the die pad front surface 11a, the first die pad side surface 11c, the second die pad side surface 11d, the inner lead front surface 51a, the terminal portion front surface 53a, the inner lead tip surface 51c, and the inner lead back surface 51b turns into a roughened surface. While this is performed, roughened surfaces are formed throughout the entire surface of the metal substrate 31 except for the part covered by the plating layer 36 by supplying a micro etching fluid to the metal substrate 31. The micro etching fluid is a surface treatment agent that slightly erodes a metal surface to form a fine convex-and-concave roughened surface. For example, when surface roughening of the metal substrate 31 made of copper or copper alloy is performed, a micro etching fluid that contains hydrogen peroxide and sulfuric acid as principal components may be used.

Next, as illustrated in FIG. 23I, the supporting layer 37 and the plating layer 36 are taken away sequentially, thereby obtaining the lead frame 10 illustrated in FIGS. 18 and 19.

(Method of Manufacturing Semiconductor Device)

As illustrated in FIGS. 24A to 24D, a method of manufacturing the semiconductor device 20 according to the present embodiment can be implemented substantially in the same manner as a method of manufacturing the semiconductor device 20 according to the second embodiment. In this case, the electrodes 21a of the semiconductor element 21 are electrically connected to the die pad 11 and the lead portions 12 via the bumps 26 respectively.

As described above, according to the present embodiment, the plating layer 36 is formed on the metal substrate 31, except for its front surface (FIG. 24(f)). Next, the plating layer 36 existing on the back surface of the metal substrate 31 is left unremoved, and another part of the plating layer 36 is removed (FIG. 24(g)). After this removal, roughened surfaces are formed at, of the metal substrate 31, the part not covered by the plating layer 36 (FIG. 24(h)). As described above, the plating layer 36 for forming roughened surfaces is provided on the metal substrate 31 except for its front surface, instead of being provided throughout the entire surface of the metal substrate 31. This makes it possible to reduce an amount of use of metal such as silver of which the plating layer 36 is made. Consequently, it is possible to reduce the manufacturing cost of the lead frame 10.

By the way, it could happen that, during long-term use of the semiconductor device 20 having been manufactured in this way, moisture in air, etc. enters via an interface between the molding resin 23 and the die pad 11 or the lead portion 12 from the back surface side of the semiconductor device 20. To address this issue, according to the present embodiment, the inner lead back surface 51b and the inner lead tip surface 51c of the lead portion 12 are roughened surfaces. Furthermore, each of the first die pad side surface 11c and the second die pad side surface 11d of the die pad 11 is a roughened surface. For this reason, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_4$ in FIG. 25). Consequently, it is possible to improve the reliability of the semiconductor device 20 after long-term use.

Fourth Embodiment

Next, with reference to FIGS. 26 to 29, a fourth embodiment will be described below. FIGS. 26 to 29 are diagrams illustrating the fourth embodiment. The main difference of the fourth embodiment illustrated in FIGS. 26 to 29 lies in that a metal layer 25 is provided on the surface of the die pad 11 and the lead portions 12, and the rest of its structure is substantially the same as that of the third embodiment described above. In FIGS. 26 to 29, the same reference signs are assigned to the same portions as those of the second embodiment illustrated in FIGS. 8 to 17 and the third embodiment illustrated in FIGS. 18 to 25, and a detailed explanation will be omitted.

(Structure of Lead Frame and Semiconductor Device)

FIG. 26 is a cross-sectional view of a lead frame 10A according to the present embodiment. FIG. 27 is a cross-sectional view of a semiconductor device 20A according to the present embodiment.

In the lead frame 10A illustrated in FIG. 26 and the semiconductor device 20A illustrated in FIG. 27, a metal layer 25 is located on a part of the die pad 11 and a part of the lead portion 12. Specifically, the metal layer 25 for improving the property of close contact with the bumps 26 is provided at a plurality of positions on the die pad front surface 11a of the die pad 11. In addition, the metal layer 25 for improving the property of close contact with the bump 26 is provided on the internal terminal formed on the inner lead 51 of the lead portion 12.

The function of the metal layer 25 is to ensure good connection of the bumps 26 to the die pad 11 and the lead portions 12. The metal layer 25 may be, for example, a plating layer formed using an electrolytic plating method. The thickness of the metal layer 25 may be 1 μm or greater and 10 μm or less. As the metal of which this plating layer is made, silver, silver alloy, gold, gold alloy, platinum group, copper, copper alloy, palladium, or the like may be used. If ground plating is required depending on the metal of which the metal layer 25 is made, a known material such as nickel or copper can be used.

As illustrated in FIGS. 26 and 27, the surface of the lead portion 12 includes a first front surface portion 56a, which is a smooth surface, and a second front surface portion 56b, which is a roughened surface. The first front surface portion 56a is located at an inner end portion (die pad 11 side) of the lead portion 12. The metal layer 25 is formed on the first front surface portion 56a. The first front surface portion 56a is a smooth surface throughout its entire area. The first front surface portion 56a is located at a part of the inner lead front surface 51a.

The second front surface portion 56b is located outward of (on the side that is the opposite of the die pad 11) and next to the first front surface portion 56a and the metal layer 25. The second front surface portion 56b adjoins the first front surface portion 56a and the metal layer 25 directly. The second front surface portion 56b is a roughened surface throughout its entire area. In the lead frame 10A, preferably, the second front surface portion 56b should extend continuously to a connection portion of the lead portion 12 and the connecting bar 13. The front surface of the connecting bar 13 may be a roughened surface. The second front surface portion 56b is located at a part of the inner lead front surface 51a and a part of the terminal portion front surface 53a.

As illustrated in FIG. 27, in the semiconductor device 20A, the bumps 26 are provided on the metal layer 25. The upper end of the bumps 26 is connected to the electrodes 21a of the semiconductor element 21 respectively, and the lower end thereof is connected to the die pad 11 and the lead portions 12 respectively via the metal layer 25. Providing the metal layer 25 and the bumps 26 on the die pad 11 is not necessarily needed.

In the present embodiment, the definition of "roughened surface" and "smooth surface", and the measurement method thereof, are the same as those of the second embodiment.

(Method of Manufacturing Lead Frame)

Next, a method of manufacturing the lead frame 10A illustrated in FIG. 26 will now be described while referring to FIGS. 28A to 28I. In FIGS. 28A to 28J, the same reference signs are assigned to the same portions as those of the structure illustrated in FIGS. 23A to 23I, and a detailed explanation will be omitted.

First, in the same manner as done in the second embodiment (FIGS. 14A to 14E), a metal substrate 31 that includes the die pad 11 and lead portions 12 located around the die pad 11 is manufactured (FIGS. 28A to 28E).

Next, a plating layer 36 is formed on the metal substrate 31, except for a part of its front surface (FIG. 28F). In this process, the plating layer 36 is formed on a part of the front surface of the metal substrate 31, the back surface throughout the entire area thereof, and the side surface throughout the entire area thereof. In addition, the plating layer 36 is formed on a part of the front surface of the die pad 11 and a part of the front surface of the lead portion 12. More specifically, the plating layer 36 is formed on, of the die pad front surface 11a of the die pad 11, an area where the metal layer 25 is to be formed, and is not formed on any area other than the area where the metal layer 25 is to be formed. In addition, the plating layer 36 is formed on the die pad back surface 11b, the first die pad side surface 11c, and the second die pad side surface 11d of the die pad 11. In addition, the plating layer 36 is formed on the first front surface portion 56a, the external terminal 17, the inner lead back surface 5ib, and the inner lead tip surface 51c of the lead portion 12. On the other hand, the plating layer 36 is not formed on the second front surface portion 56b of the lead portion 12. The plating layer 36 need not necessarily be formed on the front surface of the connecting bar 13, and may be formed on the back surface of the connecting bar 13.

When this is performed, as illustrated in FIG. 28F, a part of the front surface of the metal substrate 31 is covered by a first jig 45A, with an elastic member 44A such as a rubber gasket sandwiched therebetween. In this state, electrolytic plating is applied to the metal substrate 31, thereby forming the plating layer 36 on the metal substrate 31, except for the part of its front surface.

Since the plating layer 36 is not formed on the part of the front surface of the metal substrate 31 as described here, it is possible to reduce an amount of use of metal such as silver of which the plating layer 36 is made. This makes it possible to reduce the manufacturing cost of the lead frame 10A. The material and thickness of the plating layer 36 may be same as those of the third embodiment.

Next, a part of the plating layer 36 that exists at areas where roughened surfaces are to be formed is removed (FIG. 28G). In this process, the plating layer 36 that exists on a part of the front surface of the metal substrate 31 and on the back surface thereof is left unremoved, and another part of the plating layer 36 is removed. Specifically, of the plating layer 36, the part corresponding to the first die pad side surface 11c, the second die pad side surface 11d, the inner lead tip surface 51c, and the inner lead back surface 51b of the metal substrate 31 is removed.

While this is performed, as illustrated in FIG. 28G, first, elastic members 46 are disposed on the front and back surfaces of the metal substrate 31 respectively, and the metal substrate 31 is clamped with a second jig 47B, with the elastic members 46 such as rubber gaskets sandwiched therebetween.

The elastic member 46 on the front surface of the metal substrate 31 covers the front surface of the metal substrate 31 throughout the entire area thereof. Next, the plating layer 36 at the part not covered by the elastic member 46 is taken away. As a result of this removal, the first die pad side surface 11c, the second die pad side surface 11d, the inner lead tip surface 51c, and the inner lead back surface 51b become exposed. On the other hand, the plating layer 36 on the die pad front surface 11a, the die pad back surface 11b, the first front surface portion 56a, and the external terminal 17, which are covered by the elastic members 46, is left unremoved.

Next, a supporting layer 37 is provided on the back surface of the metal substrate 31 substantially in the same manner as done in the above-described step illustrated in FIG. 23H. Next, of the metal substrate 31, the part not covered by the plating layer 36 is roughened, thereby forming roughened surfaces at the part not covered by the plating layer 36 (FIG. 28H). Therefore, the first die pad side surface 11c, the second die pad side surface 11d, the second front surface portion 56b, the inner lead tip surface 51c, and the inner lead back surface 51b turn into roughened surfaces.

Next, the supporting layer 37 and the plating layer 36 are taken away sequentially substantially in the same manner as done in the step illustrated in FIG. 23I (FIG. 28I).

After the removal, as illustrated in FIG. 28J, the metal layer 25 is formed on a part of the front surface of the metal substrate 31. Specifically, the metal layer 25 is formed on a part of the die pad 11 and a part of the lead portion 12. In this case, first, a non-illustrated plating resist layer that has a predetermined pattern is formed using, for example, a photolithography method on the die pad 11 and the lead portion 12. Next, the metal layer 25 that is a plating layer is formed using, for example, an electrolytic plating method at the part that is not covered by the plating resist layer. The plating resist layer is thereafter removed, thereby obtaining the lead frame 10A illustrated in FIG. 26.

(Method of Manufacturing Semiconductor Device)

A method of manufacturing the semiconductor device 20A according to the present embodiment can be implemented substantially in the same manner as a method of manufacturing the semiconductor device 20 illustrated in FIGS. 24A to 24D. In this case, the electrodes 21a of the semiconductor element 21 are electrically connected to the die pad 11 and the lead portions 12 via the bumps 26 and the metal layer 25 respectively.

As described above, according to the present embodiment, the plating layer 36 is formed on the metal substrate 31, except for a part of its front surface (FIG. 28F). Next, the plating layer 36 existing on a part of the front surface of the metal substrate 31 and on the back surface thereof is left unremoved, and another part of the plating layer 36 is removed (FIG. 28G). After this removal, roughened surfaces are formed at, of the metal substrate 31, the part not covered by the plating layer 36 (FIG. 28H). As described above, the plating layer 36 for forming roughened surfaces is provided on the metal substrate 31 except for a part of its front surface, instead of being provided throughout the entire surface of the metal substrate 31. This makes it possible to reduce an amount of use of metal such as silver of which the plating layer 36 is made. Consequently, it is possible to reduce the manufacturing cost of the lead frame 10.

Moreover, according to the present embodiment, the second front surface portion 56b located outward of and next to the metal layer 25 is a roughened surface. For this reason, the distance of an entry path along which moisture enters via the interface between the front surface of the lead portion 12 and the molding resin 23 is long. This makes it possible to suppress the entry of the moisture toward the semiconductor element 21 via the interface between the front surface of the lead portion 12 and the molding resin 23 (see an arrow $F_B$ in FIG. 29). Consequently, it is possible to improve the reliability of the semiconductor device 20A after long-term use.

Moreover, according to the present embodiment, the second front surface portion 56b of the lead portion 12 is a roughened surface. This makes it possible to increase the strength of adhesion of the second front surface portion 56b and the molding resin 23, thereby suppressing the front surface of the lead portion 12 and the molding resin 23 from coming off from each other.

Moreover, according to the present embodiment, at the back surface side of the semiconductor device 20A, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_A$ in FIG. 29). Consequently, it is possible to improve the reliability of the semiconductor device 20A after long-term use.

Fifth Embodiment

With reference to FIGS. 30 to 37, a fifth embodiment will now be described. FIGS. 30 to 37 are diagrams illustrating the fifth embodiment. In FIGS. 30 to 37, the same reference signs are assigned to the same portions as those of the embodiments illustrated in FIGS. 8 to 29, and a detailed explanation will be omitted.
(Structure of Lead Frame)

First, with reference to FIGS. 30 and 31, an overview of a lead frame according to the present embodiment will now be given. FIGS. 30 and 31 are diagrams illustrating a lead frame according to the present embodiment.

In this description, the term "outer perimeter" refers to, of the lead frame 10 (metal substrate), a portion exposed to the outside, and includes "front surface", "side surface", and "back surface".

As illustrated in FIGS. 30 and 31, each package area 10a of the lead frame 10 includes a die pad 11 and lead portions 12 located around the die pad 11. Among them, the lead portion 12 is partially thinned from its back surface side. The back surface of the lead portion 12 at its thinned part is a roughened surface. The back surface of the lead portion 12 at its non-thinned part is a smooth surface.

As illustrated in FIG. 31, the die pad 11 has a die pad front surface 11a, which is located at the front surface side, and a die pad back surface 11b, which is located at the back surface side. As will be described later, the semiconductor element 21 is mountable on the die pad front surface 11a. The die pad back surface 11b is exposed to the outside from the semiconductor device 20 (described later). A first die pad side surface 11c and a second die pad side surface 11d are formed at, of the die pad 11, the side face oriented toward the lead portion 12. The first die pad side surface 11c is located at the die pad front surface 11a side. The second die pad side surface 11d is located at the die pad back surface 11b side. In this case, each of the first die pad side surface 11c and the second die pad side surface 11d of the die pad 11 is a roughened surface. On the other hand, each of the die pad front surface 11a and the die pad back surface 11b of the die pad 11 is a smooth surface.

In the present embodiment, the definition of "roughened surface" and "smooth surface", and the measurement method thereof, are the same as those of the second embodiment.

The roughened surface may be formed by, for example, performing a surface roughening treatment of an outer surface of a metal substrate 31 to be described later by means of a micro etching fluid that contains hydrogen peroxide and sulfuric acid as principal components. The smooth surface may be a non-treated surface, which is a surface of the metal substrate 31 to be described later not having been subjected to such a surface roughening treatment. In FIG. 31, roughened portions are indicated by thick broken lines (the same holds true for the other cross-sectional views, too).

As illustrated in FIG. 31, the lead portion 12 includes an inner lead 51 and a terminal portion 53. The inner lead 51 is located at an inner side (die pad 11 side). The terminal portion 53 is located at an outer side (connecting bar 13 side). The inner lead 51 extends from the terminal portion 53 toward the die pad 11. An internal terminal is formed at a tip portion on a front surface of the inner lead 51. The internal terminal is an area that is to be electrically connected to a semiconductor element 21 via a bump 26 as will be described later. A metal layer 25 for improving the property of close contact with the bump 26 is provided on the internal terminal.

The inner lead 51 is thinned from its back surface side by, for example, half etching. The inner lead 51 has an inner lead front surface 51a and an inner lead back surface 51b. The inner lead front surface 51a is located at the front surface side. An internal terminal is formed on a part of the inner lead front surface 51a. In addition, an inner lead tip surface 51c is formed at, of the inner lead 51, a face oriented toward the die pad 11. The inner lead back surface 51b is located at the back surface side.

Furthermore, the inner lead tip surface 51c of the lead portion 12 is a roughened surface throughout the entire area thereof. Though not illustrated, both side surfaces along the length direction of the lead portion 12 may also be roughened surfaces. On the other hand, the inner lead 51 of the lead portion 12 is not thinned from its front surface side. The inner lead front surface 51a, which is located at the front surface side of the inner lead 51, is a smooth surface throughout the entire area thereof. Moreover, the terminal portion 53 of the lead portion 12 is not thinned from its front surface side. A terminal portion front surface 53a, which is located at the front surface side of the terminal portion 53, is a smooth surface throughout the entire area thereof.

As illustrated in FIG. 31, the metal layer 25 is located on the die pad 11 and the lead portions 12. The metal layer 25 is formed on a part of the die pad 11 and a part of the lead portion 12. The function of the metal layer 25 is to ensure good connection of the bumps 26 to the die pad 11 and the lead portions 12. The metal layer 25 may be, for example, a plating layer formed using an electrolytic plating method. The thickness of the metal layer 25 may be 1 m or greater and 10 m or less. As the metal of which this plating layer is made, silver, silver alloy, gold, gold alloy, platinum group, copper, copper alloy, palladium, or the like may be used. If ground plating is required depending on the metal of which the metal layer 25 is made, a known material such as nickel or copper can be used.

Besides the above, the structure of the lead frame 10 according to the present embodiment may be the same as the structure of the lead frame 10 according to the second embodiment.

(Structure of Semiconductor Device)

Next, with reference to FIGS. 32 to 34, a semiconductor device according to the present embodiment will now be described. FIGS. 32 to 34 are diagrams illustrating a semiconductor device according to the present embodiment (flip-chip type).

As illustrated in FIGS. 32 and 33, the semiconductor device (semiconductor package) 20 includes the die pad 11, the semiconductor element 21, the plurality of lead portions 12, the plurality of bumps 26, and the molding resin 23.

Among them, the semiconductor element 21 is mounted on the die pad 11. The plurality of lead portions 12 is disposed around the die pad 11. The metal layer 25 is formed on each of the die pad 11 and the lead portion 12. The bumps 26 are provided on the metal layer 25. The semiconductor element 21 and the die pad 11 and the lead portion 12 are electrically connected to each other via the bump 26.

The length of one side of the molding resin 23 (one side of the semiconductor device 20) may be, for example, 0.2 mm or greater and 16 mm or less.

The bump (connecting portion) 26 may be made of a metal material having good conductive property such as, for example, copper, and may be solid and have a substantially round columnar shape or a substantially globular shape. The upper end of the bumps 26 is connected to the electrodes 21a of the semiconductor element 21 respectively, and the lower end thereof is connected to the die pad 11 and the lead portions 12 respectively via the metal layer 25. Providing the metal layer 25 and the bumps 26 on the die pad 11 is not necessarily needed. In this case, the die pad 11 and the semiconductor element 21 may be fixed to each other by means of, for example, an adhesive such as a die bonding paste.

FIG. 34 is an enlarged cross-sectional view of the neighborhood of the bump 26. As illustrated in FIG. 34, the bump 26 may include a plurality of layers. For example, the bump 26 includes a first layer 26a, which is located at the metal layer 25 side, and a second layer 26b, which is located at the semiconductor element 21 side. The first layer 26a may contain metal such as, for example, tin. The height of the first layer 26a may be 1 μm or greater and 10 μm or less. The second layer 26b may contain metal such as, for example, copper. The height of the second layer 26b may be 30 μm or greater and 100 μm or less.

Besides the above, the structure of the die pad 11 and the lead portions 12 is the same as the structure having been described earlier with reference to FIGS. 30 and 31, except for areas not included in the semiconductor device 20; therefore, a detailed explanation is not given here.

The semiconductor device 20 is not limited to a flip-chip-type device. For example, a bonding wire, in place of the bump 26, may constitute the connecting portion. In this case, the semiconductor element 21 and the lead portion 12 may be electrically connected to each other via the bonding wire.

Besides the above, the structure of the semiconductor device 20 according to the present embodiment may be the same as the structure of the semiconductor device 20 according to the second embodiment.

(Method of Manufacturing Lead Frame)

Next, a method of manufacturing the lead frame 10 illustrated in FIGS. 30 and 31 will now be described while referring to FIGS. 35A to 35J. FIGS. 35A to 35J are cross-sectional views of a method of manufacturing the lead frame 10 (diagrams corresponding to FIG. 31).

First, in the same manner as done in the second embodiment (FIGS. 14A to 14E), a metal substrate 31 that includes the die pad 11 and lead portions 12 located around the die pad 11 is manufactured (FIGS. 35A to 35E).

Figure 35A:
Figure 35B:
Figure 35C:
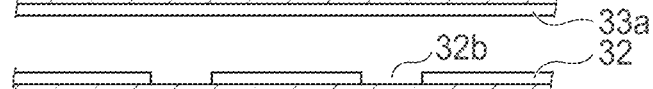
Figure 35D:
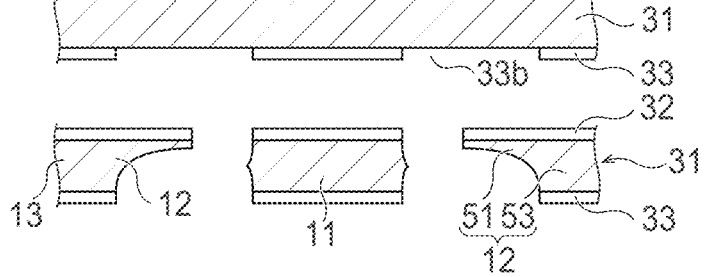
Figure 35E:
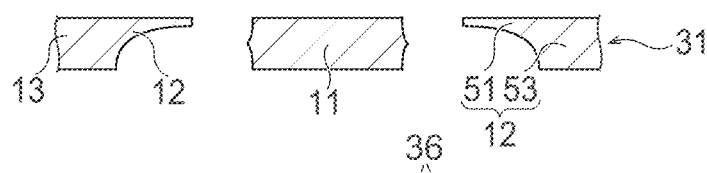
Figure 35F:
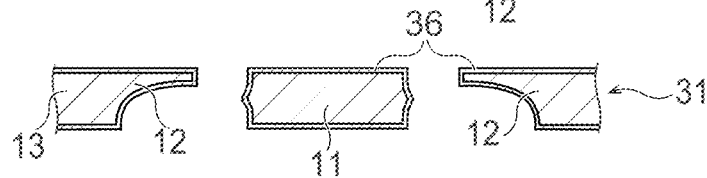

Next, a plating layer 36 is formed around the metal substrate 31 (FIG. 35F). In this process, the plating layer 36 is formed entirely around the die pad 11, the lead portions 12, and the connecting bars 13. The thickness of the plating layer 36 may be greater than 0 μm but not greater than 2 μm. As the metal of which the plating layer 36 is made, for example, silver may be used. In a case where the plating layer 36 is a silver plating layer, a silver plating fluid containing silver cyanide and potassium cyanide as principal components can be used as an electrolytic plating fluid.

Figure 35G:
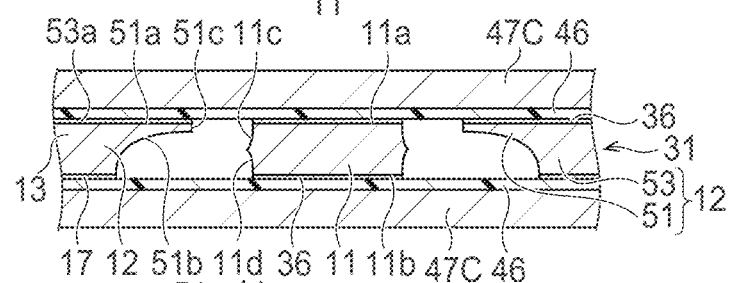

Next, a part of the plating layer 36 that exists at areas where roughened surfaces are to be formed is removed. Specifically, the plating layer 36, except for the part located on the front and back surfaces of the metal substrate 31, is removed (FIG. 35G). By this means, the plating layer 36 on the first die pad side surface 11c of the die pad 11, the second die pad side surface 11d of the die pad 11, the inner lead tip surface 51c of the lead portion 12, and the inner lead back surface 51b of the lead portion 12 is removed.

While this is performed, as illustrated in FIG. 35G, first, elastic members 46 such as rubber gaskets are disposed on the front and back surfaces of the metal substrate 31 respectively, and the metal substrate 31 is clamped with a jig 47C, with the elastic members 46 sandwiched therebetween. Next, the plating layer 36 at the part not covered by the elastic member 46 is taken away. As a result of this removal, the first die pad side surface 11c, the second die pad side surface 11d, the inner lead tip surface 51c, and the inner lead back surface 51b become exposed. On the other hand, the plating layer 36 on the die pad front surface 11a, the terminal portion front surface 53a, the die pad back surface 11b, the inner lead front surface 51a, and the external terminal 17, which are covered by the elastic members 46, is left unremoved.

Figure 35H:
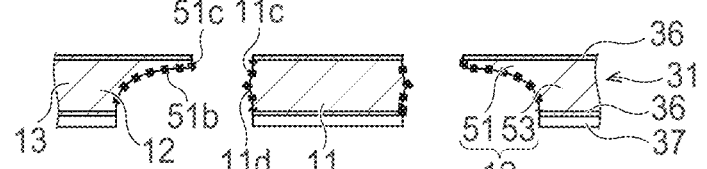

Next, as illustrated in FIG. 35H, a supporting layer 37 that supports the metal substrate 31 is provided on the back surface of the metal substrate 31. The supporting layer 37 may be, for example, a resist layer. Next, as illustrated in FIG. 35H, of the metal substrate 31, the part not covered by the plating layer 36 is roughened, thereby forming roughened surfaces at the part not covered by the plating layer 36. Specifically, the first die pad side surface 11c, the second die pad side surface 11d, the inner lead tip surface 51c, and the inner lead back surface 51b turn into roughened surfaces. While this is performed, roughened surfaces are formed throughout the entire surface of the metal substrate 31 except for the part covered by the plating layer 36 by supplying a micro etching fluid to the metal substrate 31. The micro etching fluid is a surface treatment agent that slightly erodes a metal surface to form a fine convex-and-concave roughened surface. For example, when surface roughening of the metal substrate 31 made of copper or copper alloy is performed, a micro etching fluid that contains hydrogen peroxide and sulfuric acid as principal components may be used.

Figure 35I:
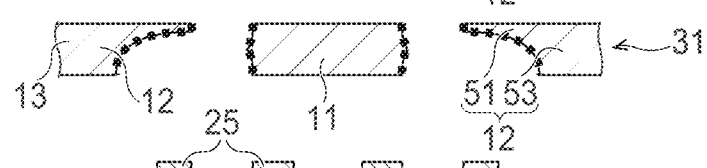

Next, as illustrated in FIG. 35I, the supporting layer 37 and the plating layer 36 are taken away sequentially.

Figure 35J:
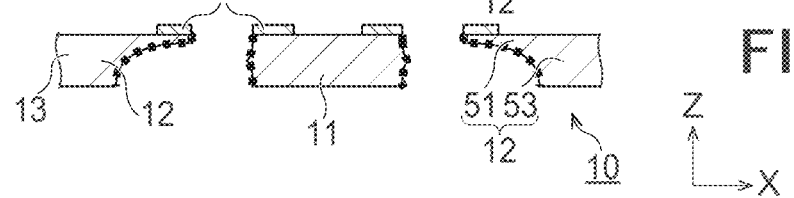
Figure 36A:
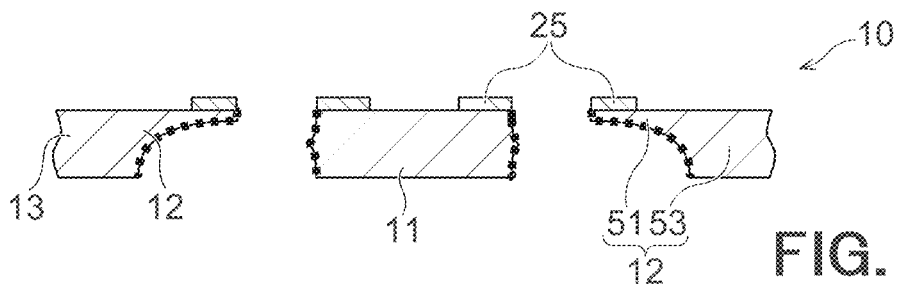
Figure 36B:
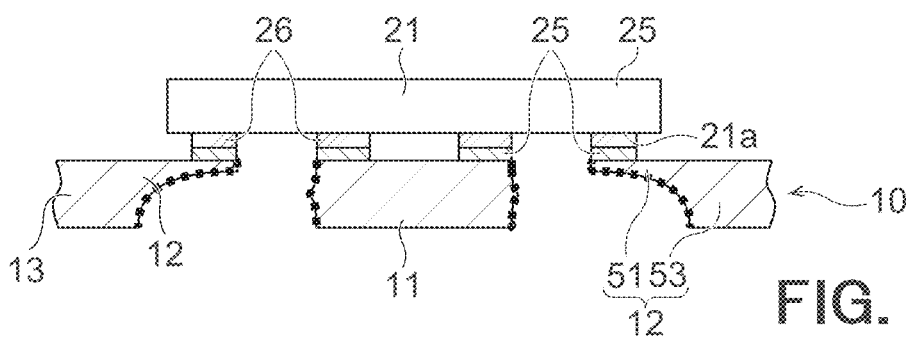
Figure 36C:
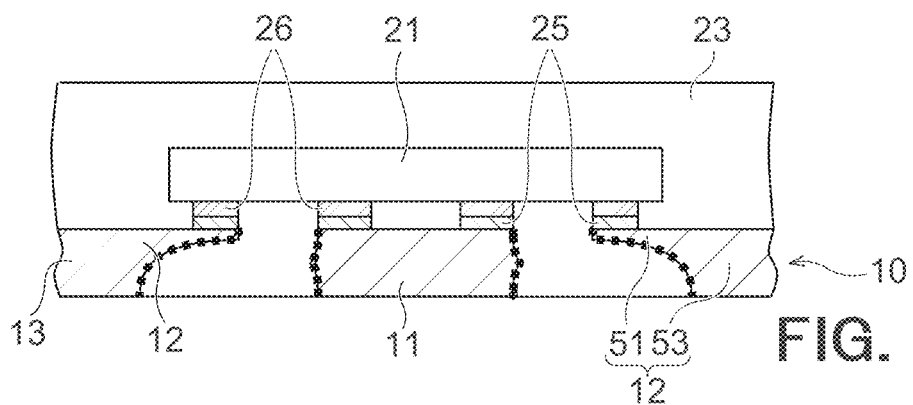
Figure 36D:
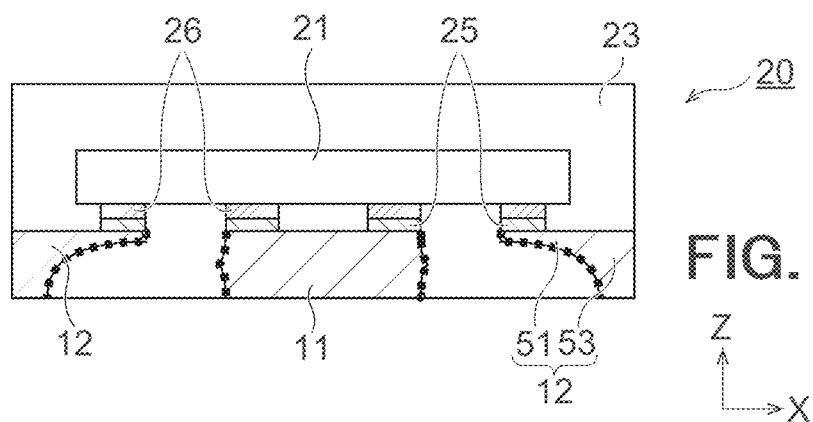

After the removal, as illustrated in FIG. 35J, the metal layer 25 is formed on the die pad 11 and the lead portion 12. In this case, first, a non-illustrated plating resist layer that has a predetermined pattern is formed using, for example, a photolithography method on the die pad 11 and the lead portion 12. Next, the metal layer 25 that is a plating layer is formed using, for example, an electrolytic plating method at the part that is not covered by the plating resist layer. The plating resist layer is thereafter removed, thereby obtaining the lead frame 10 illustrated in FIGS. 30 and 31.
(Method of Manufacturing Semiconductor Device)

As illustrated in FIGS. 36A to 36D, a method of manufacturing the semiconductor device 20 according to the present embodiment can be implemented substantially in the same manner as a method of manufacturing the semiconductor device 20 according to the second embodiment. In this case, each electrode 21a of the semiconductor element 21 and the die pad 11 and the lead portion 12 is electrically connected to each other via the bump 26 and the metal layer 25.

By the way, it could happen that, during long-term use of the semiconductor device 20 having been manufactured in this way, moisture in air, etc. enters via an interface between the molding resin 23 and the die pad 11 or the lead portion 12 from the back surface side of the semiconductor device 20. To address this issue, according to the present embodiment, the inner lead back surface 51b and the inner lead tip surface 51c of the lead portion 12 are roughened surfaces. Furthermore, each of the first die pad side surface 11c and the second die pad side surface 11d of the die pad 11 is a roughened surface. For this reason, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_A$ in FIG. 37). Consequently, it is possible to improve the reliability of the semiconductor device 20 after long-term use.

Especially in the semiconductor device 20 of a flip-chip type, the electrode 21a of the semiconductor element 21 is oriented toward the back surface side. For this reason, in the semiconductor device 20 of a flip-chip type, the distance from the back surface of the semiconductor device 20 to the electrode 21a of the semiconductor element 21 tends to be short. To address this issue, according to the present embodiment, the back surface of the lead portion 12 at its thinned part is a roughened surface. This makes it possible to more effectively suppress the entry of the moisture toward the semiconductor element 21 via the interface between the molding resin 23 and the lead portion 12.

Moreover, according to the present embodiment, the inner lead back surface 51b and the inner lead tip surface 51c of the lead portion 12 are roughened surfaces. Furthermore, each of the first die pad side surface 11c and the second die pad side surface 11d of the die pad 11 is a roughened surface. This makes it possible to increase the strength of adhesion of the die pad 11 and the lead portion 12 to the molding resin 23, thereby suppressing the die pad 11 and the lead portion 12 and the molding resin 23 from coming off from each other.

Sixth Embodiment

Next, with reference to FIGS. 38 to 41, a sixth embodiment will be described below. FIGS. 38 to 41 are diagrams illustrating the sixth embodiment. The main difference of the sixth embodiment illustrated in FIGS. 38 to 41 lies in that a roughened surface is formed in the front surface of the lead portion 12, and the rest of its structure is substantially the same as that of the fifth embodiment described above. In FIGS. 38 to 41, the same reference signs are assigned to the same portions as those of the embodiments illustrated in FIGS. 8 to 37, and a detailed explanation will be omitted.
(Structure of Lead Frame and Semiconductor Device)

FIG. 38 is a cross-sectional view of a lead frame 10A according to the present embodiment. FIG. 39 is a cross-sectional view of a semiconductor device 20A according to the present embodiment.

In the lead frame 10A illustrated in FIG. 38 and the semiconductor device 20A illustrated in FIG. 39, the surface of the lead portion 12 includes a first front surface portion 54a, which is a smooth surface, and a second front surface portion 54b, which is a roughened surface.

The first front surface portion 54a is located outward of (on the side that is the opposite of the die pad 11) and next to the metal layer 25. The first front surface portion 54a adjoins the metal layer 25 directly. The first front surface portion 54a is a smooth surface throughout its entire area. The length $L_A$ of the first front surface portion 54a in the length direction of the lead portion 12 (length in the X direction) may be 25 μm or greater and 200 μm or less, preferably, 50 μm or greater and 100 μm or less.

The first front surface portion 54a is located at a part of the inner lead front surface 51a, but is not limited thereto. The first front surface portion 54a may be, for example, located at a part of the inner lead front surface 51a and a part of the terminal portion front surface 53a.

The second front surface portion 54b is located outward of and next to the first front surface portion 54a. That is, the second front surface portion 54b adjoins the first front surface portion 54a directly. The second front surface portion 54b is a roughened surface throughout its entire area. In the lead frame 10A, preferably, the second front surface portion 54b should extend continuously to a connection portion of the lead portion 12 and the connecting bar 13. The front surface of the connecting bar 13 may be a roughened surface. The second front surface portion 54b is located at a part of the inner lead front surface 51a and a part of the terminal portion front surface 53a, but is not limited thereto. The second front surface portion 54b may be located at a part of the terminal portion front surface 53a.

In the present embodiment, the definition of "roughened surface" and "smooth surface", and the measurement method thereof, are the same as those of the second embodiment.
(Method of Manufacturing Lead Frame)

Next, a method of manufacturing the lead frame 10A illustrated in FIG. 38 will now be described while referring to FIGS. 40A to 40J. In FIGS. 40A to 40J, the same reference signs are assigned to the same portions as those of the structure illustrated in FIGS. 35A to 35J, and a detailed explanation will be omitted.

First, in the same manner as done in the second embodiment (FIGS. 14A to 14E), a metal substrate 31 that includes the die pad 11 and lead portions 12 located around the die pad 11 is manufactured (FIGS. 40A to 40E).

Next, the plating layer 36 is formed entirely around the metal substrate 31 substantially in the same manner as done in the above-described step illustrated in FIG. 35F (FIG. 40F).

Next, of the plating layer 36, the part corresponding to the first die pad side surface 11c, the second die pad side surface 11d, the second front surface portion 54b, the inner lead tip surface 51c, and the inner lead back surface 51b of the metal substrate 31 is removed (FIG. 40G).

While this is performed, as illustrated in FIG. 40G, first, elastic members 46 such as rubber gaskets are disposed on the front and back surfaces of the metal substrate 31 respectively, and the metal substrate 31 is clamped with a jig 47D, with the elastic members 46 sandwiched therebetween. The elastic member 46 on the front surface of the metal substrate 31 covers the die pad front surface 11a, the area corresponding to the first front surface portion 54a, and, of the lead portion 12, the area where the metal layer 25 is to be provided. Next, the plating layer 36 at the part not covered by the elastic member 46 is taken away. Therefore, the first die pad side surface 11c, the second die pad side surface 11d, the second front surface portion 54b, the inner lead tip surface 51c, and the inner lead back surface 51b become exposed. On the other hand, the plating layer 36 on the die pad front surface 11a, the die pad back surface 11b, the first front surface portion 54a, and the external terminal 17, which are covered by the elastic members 46, is left unremoved.

Next, a supporting layer 37 is provided on the back surface of the metal substrate 31 substantially in the same manner as done in the above-described step illustrated in FIG. 35H. Next, of the metal substrate 31, the part not covered by the plating layer 36 is roughened, thereby forming roughened surfaces at the part not covered by the plating layer 36 (FIG. 40H). Therefore, the first die pad side surface 11c, the second die pad side surface 11d, the second front surface portion 54b, the inner lead tip surface 51c, and the inner lead back surface 51b turn into roughened surfaces.

Next, the supporting layer 37 and the plating layer 36 are taken away sequentially substantially in the same manner as done in the step illustrated in FIG. 35I (FIG. 40I).

After the removal, the metal layer 25 is formed on the die pad 11 and the lead portion 12 substantially in the same manner as done in the above-described step illustrated in FIG. 35J. The lead frame 10A illustrated in FIG. 38 can be obtained in this way (FIG. 40J).

(Method of Manufacturing Semiconductor Device)

A method of manufacturing the semiconductor device 20A according to the present embodiment can be implemented substantially in the same manner as a method of manufacturing the semiconductor device 20 illustrated in FIGS. 36A to 36D.

According to the present embodiment, of the front surface of the lead portion 12, the first front surface portion 54a, which is located outward of and next to the metal layer 25, is a smooth surface. Therefore, when the semiconductor element 21 is mounted onto the die pad 11, it is possible to suppress tin or the like contained in the bump 26 from flowing out by running along the first front surface portion 54a (see an arrow Fc in FIG. 41). By contrast, if the first front surface portion 54a had a roughened surface, there is a risk that tin or the like contained in the bump 26 might flow out by running along the first front surface portion 54a due to surface tension.

Moreover, according to the present embodiment, the second front surface portion 54b located outward of and next to the first front surface portion 54a is a roughened surface. For this reason, the distance of an entry path along which moisture enters via the interface between the front surface of the lead portion 12 and the molding resin 23 is long. This makes it possible to suppress the entry of the moisture toward the semiconductor element 21 via the interface between the front surface of the lead portion 12 and the molding resin 23 (see an arrow $F_1$ in FIG. 41). Consequently, it is possible to improve the reliability of the semiconductor device 20A after long-term use.

Moreover, according to the present embodiment, the second front surface portion 54b of the lead portion 12 is a roughened surface. This makes it possible to increase the strength of adhesion of the second front surface portion 54b and the molding resin 23, thereby suppressing the front surface of the lead portion 12 and the molding resin 23 from coming off from each other.

Moreover, according to the present embodiment, at the back surface side of the semiconductor device 20A, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_A$ in FIG. 41). Consequently, it is possible to improve the reliability of the semiconductor device 20A after long-term use.

Seventh Embodiment

Next, with reference to FIGS. 42 to 45, a seventh embodiment will be described below. FIGS. 42 to 45 are diagrams illustrating the seventh embodiment. The main difference of the seventh embodiment illustrated in FIGS. 42 to 45 lies in that a recessed portion 18 is formed in the front surface of the lead portion 12, and the rest of its structure is substantially the same as that of the fifth embodiment described above. In FIGS. 42 to 45, the same reference signs are assigned to the same portions as those of the embodiments illustrated in FIGS. 8 to 41, and a detailed explanation will be omitted.

(Structure of Lead Frame and Semiconductor Device)

FIG. 42 is a cross-sectional view of a lead frame 10B according to the present embodiment. FIG. 43 is a cross-sectional view of a semiconductor device 20B according to the present embodiment.

In the lead frame 10B illustrated in FIG. 42 and the semiconductor device 20B illustrated in FIG. 43, a recessed portion 18 is formed in the front surface of the lead portion 12 outward of (on the side that is the opposite of the die pad 11) the metal layer 25. In addition, the portion (third front surface portion 54c) located outward of and next to the recessed portion 18 is a roughened surface. The inner surface of the recessed portion 18 is a smooth surface. The portion (fourth front surface portion 54d) located between the recessed portion 18 and the metal layer 25 is a smooth surface.

The fourth front surface portion 54d is located outward of (on the side that is the opposite of the die pad 11) and next to the metal layer 25. The fourth front surface portion 54d adjoins the metal layer 25 directly. The fourth front surface portion 54d is a smooth surface throughout its entire area. The length $L_B$ of the fourth front surface portion 54d in the length direction of the lead portion 12 (length in the X direction) may be 25 μm or greater and 200 μm or less, preferably, 50 μm or greater and 100 μm or less.

The recessed portion 18 is located outward of (on the side that is the opposite of the die pad 11) and next to the fourth front surface portion 54d. The recessed portion 18 adjoins the fourth front surface portion 54d directly. The inner surface of the recessed portion 18 is a smooth surface throughout its entire area. The length $L_C$ of the recessed portion 18 in the length direction of the lead portion 12 (length in the X direction) may be 50 μm or greater and 150 μm or less, preferably, 75 μm or greater and 100 μm or less. The depth of the recessed portion 18 may be 25 μm or greater and 125 μm or less, preferably, 50 μm or greater and 100 μm or less. The plan-view shape of the recessed portion 18 may be, for example, a circle, a polygon such as a quadrangle, or the like. The recessed portion 18 is provided at a part of the lead portion 12 in the width direction thereof. However, this is a non-limiting example; the recessed portion 18 may be provided throughout the entire area of the lead portion 12 in the width direction thereof.

The third front surface portion 54c is located outward of (on the side that is the opposite of the die pad 11) and next to the recessed portion 18. The third front surface portion 54c adjoins the recessed portion 18 directly. The third front surface portion 54c is a roughened surface throughout its entire area. In the lead frame 10B, preferably, the third front surface portion 54c should extend continuously to a connection portion of the lead portion 12 and the connecting bar 13. The front surface of the connecting bar 13 may be a roughened surface.

In the present embodiment, the definition of "roughened surface" and "smooth surface", and the measurement method thereof, are the same as those of the second embodiment.

(Method of Manufacturing Lead Frame)

Next, a method of manufacturing the lead frame 10B illustrated in FIG. 42 will now be described while referring to FIGS. 44A to 44J. In FIGS. 44A to 44J, the same reference signs are assigned to the same portions as those of the structure illustrated in FIGS. 35A to 35J, and a detailed explanation will be omitted.

First, the metal substrate 31 is prepared substantially in the same manner as done in the above-described step illustrated in FIGS. 35A and 35B (FIG. 44A), and a photoresist 32a, 33a is formed on each of the front and back surfaces of the metal substrate 31 (FIG. 44B).

Next, etching resist layers 32 and 33 having openings 32b and 33b are formed substantially in the same manner as done in the above-described step illustrated in FIG. 35C (FIG. 44C). In this process, the opening 32b is formed also at an area corresponding to the recessed portion 18.

Next, the outer shape of the die pad 11, the lead portions 12, and the connecting bars 13 is formed by applying etching to the metal substrate 31 substantially in the same manner as done in the above-described step illustrated in FIG. 35D (FIG. 44D). In addition, in this process, the recessed portion 18 is formed in the front surface of the lead portion 12. Next, the etching resist layers 32 and 33 are taken away substantially in the same manner as done in the above-described step illustrated in FIG. 35E (FIG. 44E).

Next, the plating layer 36 is formed entirely around the metal substrate 31 substantially in the same manner as done in the above-described step illustrated in FIG. 35F (FIG. 44F). In this process, the plating layer 36 is formed also inside the recessed portion 18.

Next, of the plating layer 36, the part corresponding to the first die pad side surface 11c, the second die pad side surface lid, the third front surface portion 54c, the inner lead tip surface 51c, and the inner lead back surface 51b of the metal substrate 31 is removed (FIG. 44G).

While this is performed, as illustrated in FIG. 44G, first, elastic members 46 such as rubber gaskets are disposed on the front and back surfaces of the metal substrate 31 respectively, and the metal substrate 31 is clamped with a jig 47E, with the elastic members 46 sandwiched therebetween.

The elastic member 46 on the front surface of the metal substrate 31 covers the die pad front surface 11a, the recessed portion 18, the area corresponding to the fourth front surface portion 54d, and, of the lead portion 12, the area where the metal layer 25 is to be provided. Next, the plating layer 36 at the part not covered by the elastic member 46 is taken away. Therefore, the first die pad side surface 11c, the second die pad side surface 11d, the third front surface portion 54c, the inner lead tip surface 51c, and the inner lead back surface 51b become exposed. On the other hand, the plating layer 36 on the die pad front surface 11a, the die pad back surface 11b, the inner surface of the recessed portion 18, the fourth front surface portion 54d, and the external terminal 17, which are covered by the elastic members 46, is left unremoved.

Next, a supporting layer 37 is provided on the back surface of the metal substrate 31 substantially in the same manner as done in the above-described step illustrated in FIG. 35H. Next, of the metal substrate 31, the part not covered by the plating layer 36 is roughened, thereby forming roughened surfaces at the part not covered by the plating layer 36 (FIG. 44H). Therefore, the first die pad side surface 11c, the second die pad side surface lid, the third front surface portion 54c, the inner lead tip surface 51c, and the inner lead back surface 51b turn into roughened surfaces.

Next, the supporting layer 37 and the plating layer 36 are taken away sequentially substantially in the same manner as done in the step illustrated in FIG. 35I (FIG. 44I).

After the removal, the metal layer 25 is formed on the die pad 11 and the lead portion 12 substantially in the same manner as done in the above-described step illustrated in FIG. 35J. The lead frame 10B illustrated in FIG. 42 can be obtained in this way (FIG. 44J).

(Method of Manufacturing Semiconductor Device)

A method of manufacturing the semiconductor device 20B according to the present embodiment can be implemented substantially in the same manner as a method of manufacturing the semiconductor device 20 illustrated in FIGS. 36A to 36D.

According to the present embodiment, of the front surface of the lead portion 12, the fourth front surface portion 54d, which is located outward of and next to the metal layer 25, is a smooth surface. Therefore, when the semiconductor element 21 is mounted onto the die pad 11, it is possible to suppress tin or the like contained in the bump 26 from flowing out by running along the fourth front surface portion 54d (see an arrow Fe in FIG. 45). By contrast, if the fourth front surface portion 54d had a roughened surface, there is a risk that tin or the like contained in the bump 26 might flow out by running along the fourth front surface portion 54d due to surface tension.

Moreover, according to the present embodiment, the recessed portion 18 is formed in the front surface of the lead portion 12 outward of the metal layer 25. Because of this structure, even in a case where tin or the like contained in the bump 26 flows out by running along the fourth front surface portion 54d, it is possible to catch the tin or the like that has flowed out at the recessed portion 18. By this means, it is possible to suppress the tin or the like that has flowed out from reaching the third front surface portion 54c side.

Moreover, according to the present embodiment, the third front surface portion 54c located outward of and next to the recessed portion 18 is a roughened surface. For this reason, the distance of an entry path along which moisture enters via the interface between the front surface of the lead portion 12 and the molding resin 23 is long. This makes it possible to suppress the entry of the moisture toward the semiconductor element 21 via the interface between the front surface of the lead portion 12 and the molding resin 23 (see an arrow $F_B$ in FIG. 45). Consequently, it is possible to improve the reliability of the semiconductor device 20B after long-term use.

Moreover, according to the present embodiment, the third front surface portion 54c of the lead portion 12 is a roughened surface. This makes it possible to increase the strength of adhesion of the third front surface portion 54c and the molding resin 23, thereby suppressing the front surface of the lead portion 12 and the molding resin 23 from coming off from each other.

Moreover, according to the present embodiment, at the back surface side of the semiconductor device 20B, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_A$ in FIG. 45). Consequently, it is possible to improve the reliability of the semiconductor device 20B after long-term use.

Eighth Embodiment

Next, with reference to FIGS. 46 to 49, an eighth embodiment will be described below. FIGS. 46 to 49 are diagrams illustrating the eighth embodiment. The main difference of the eighth embodiment illustrated in FIGS. 46 to 49 lies in that the inner surface of the recessed portion 18 is a roughened surface, and the rest of its structure is substantially the same as that of the seventh embodiment described above. In FIGS. 46 to 49, the same reference signs are assigned to the same portions as those of the embodiments illustrated in FIGS. 8 to 45, and a detailed explanation will be omitted.

(Structure of Lead Frame and Semiconductor Device)

FIG. 46 is a cross-sectional view of a lead frame 10C according to the present embodiment. FIG. 47 is a cross-sectional view of a semiconductor device 20C according to the present embodiment.

In the lead frame 10C illustrated in FIG. 46 and the semiconductor device 20C illustrated in FIG. 47, a recessed portion 18 is formed in the front surface of the lead portion 12 outward of (on the side that is the opposite of the die pad 11) the metal layer 25. In addition, the portion (third front surface portion 54c) located outward of and next to the recessed portion 18 is a roughened surface. The inner surface of the recessed portion 18 is a roughened surface throughout its entire area. The portion (fourth front surface portion 54d) located between the recessed portion 18 and the metal layer 25 is a smooth surface.

In the present embodiment, the definition of "roughened surface" and "smooth surface", and the measurement method thereof, are the same as those of the second embodiment.

(Method of Manufacturing Lead Frame)

Next, a method of manufacturing the lead frame 10C illustrated in FIG. 46 will now be described while referring to FIGS. 48A to 48J. In FIGS. 48A to 48J, the same reference signs are assigned to the same portions as those of the structure illustrated in FIGS. 35A to 35J, and a detailed explanation will be omitted.

First, the metal substrate 31 is prepared substantially in the same manner as done in the above-described step illustrated in FIGS. 35A and 35B (FIG. 48A), and a photoresist 32a, 33a is formed on each of the front and back surfaces of the metal substrate 31 (FIG. 48B).

Next, etching resist layers 32 and 33 having openings 32b and 33b are formed substantially in the same manner as done in the above-described step illustrated in FIG. 35C (FIG. 48C). In this process, the opening 32b is formed also at an area corresponding to the recessed portion 18.

Next, the outer shape of the die pad 11, the lead portions 12, and the connecting bars 13 is formed by applying etching to the metal substrate 31 substantially in the same manner as done in the above-described step illustrated in FIG. 35D (FIG. 48D). In addition, in this process, the recessed portion 18 is formed in the front surface of the lead portion 12. Next, the etching resist layers 32 and 33 are taken away substantially in the same manner as done in the above-described step illustrated in FIG. 35E (FIG. 48E).

Next, the plating layer 36 is formed entirely around the metal substrate 31 substantially in the same manner as done in the above-described step illustrated in FIG. 35F (FIG. 48F). In this process, the plating layer 36 is formed also inside the recessed portion 18.

Next, of the plating layer 36, the part corresponding to the first die pad side surface 11c, the second die pad side surface 11d, the third front surface portion 54c, the recessed portion 18, the inner lead tip surface 51c, and the inner lead back surface 51b of the metal substrate 31 is removed (FIG. 48G).

While this is performed, as illustrated in FIG. 48G, first, elastic members 46 such as rubber gaskets are disposed on the front and back surfaces of the metal substrate 31 respectively, and the metal substrate 31 is clamped with a jig 47F, with the elastic members 46 sandwiched therebetween.

The elastic member 46 on the front surface of the metal substrate 31 covers the die pad front surface 11a, the area corresponding to the fourth front surface portion 54d, and, of the lead portion 12, the area where the metal layer 25 is to be provided. Next, the plating layer 36 at the part not covered by the elastic member 46 is taken away. Therefore, the first die pad side surface 11c, the second die pad side surface 11d, the third front surface portion 54c, the recessed portion 18, the inner lead tip surface 51c, and the inner lead back surface 51b become exposed. On the other hand, the plating layer 36 on the die pad front surface 11a, the die pad back surface 11b, the fourth front surface portion 54d, and the external terminal 17, which are covered by the elastic members 46, is left unremoved.

Next, a supporting layer 37 is provided on the back surface of the metal substrate 31 substantially in the same manner as done in the above-described step illustrated in FIG. 35H. Next, of the metal substrate 31, the part not covered by the plating layer 36 is roughened, thereby forming roughened surfaces at the part not covered by the plating layer 36 (FIG. 48H). Therefore, the first die pad side surface 11c, the second die pad side surface 11d, the third front surface portion 54c, the inner surface of the recessed portion 18, the inner lead tip surface 51c, and the inner lead back surface 51b turn into roughened surfaces.

Next, the supporting layer 37 and the plating layer 36 are taken away sequentially substantially in the same manner as done in the step illustrated in FIG. 35I (FIG. 48I).

After the removal, the metal layer 25 is formed on the die pad 11 and the lead portion 12 substantially in the same manner as done in the above-described step illustrated in FIG. 35J. The lead frame 10C illustrated in FIG. 46 can be obtained in this way (FIG. 48J).

(Method of Manufacturing Semiconductor Device)

A method of manufacturing the semiconductor device 20C according to the present embodiment can be implemented substantially in the same manner as a method of manufacturing the semiconductor device 20 illustrated in FIGS. 36A to 36D.

According to the present embodiment, of the front surface of the lead portion 12, the fourth front surface portion 54d, which is located outward of and next to the metal layer 25, is a smooth surface. Therefore, when the semiconductor element 21 is mounted onto the die pad 11, it is possible to suppress tin or the like contained in the bump 26 from flowing out by running along the fourth front surface portion 54d (see an arrow Fe in FIG. 49). By contrast, if the fourth front surface portion 54d had a roughened surface, there is a risk that tin or the like contained in the bump 26 might flow out by running along the fourth front surface portion 54d due to surface tension.

Moreover, according to the present embodiment, the recessed portion 18 is formed in the front surface of the lead portion 12 outward of the metal layer 25. Because of this structure, even in a case where tin or the like contained in the bump 26 flows out by running along the fourth front surface portion 54d, it is possible to catch the tin or the like that has flowed out at the recessed portion 18. By this means, it is possible to suppress the tin or the like that has flowed out from reaching the third front surface portion 54c side.

Moreover, according to the present embodiment, the inner surface of the recessed portion 18 and the third front surface portion 54c are roughened surfaces. For this reason, the distance of an entry path along which moisture enters via the interface between the front surface of the lead portion 12 and the molding resin 23 is long. This makes it possible to suppress the entry of the moisture toward the semiconductor element 21 via the interface between the front surface of the lead portion 12 and the molding resin 23 (see an arrow $F_B$ in FIG. 49). Consequently, it is possible to improve the reliability of the semiconductor device 20C after long-term use.

Moreover, according to the present embodiment, the inner surface of the recessed portion 18 and the third front surface portion 54c are roughened surfaces. This makes it possible to increase the strength of adhesion of the recessed portion 18 and the third front surface portion 54c and the molding resin 23, thereby suppressing the front surface of the lead portion 12 and the molding resin 23 from coming off from each other.

Moreover, according to the present embodiment, at the back surface side of the semiconductor device 20C, the distance of an entry path along which moisture enters via the interface between the molding resin 23 and the die pad 11 or the lead portion 12 is long. This makes it possible to suppress the entry of the moisture toward the semiconductor element 21 via the interface between the molding resin 23 and the die pad 11 or the lead portion 12 (see an arrow $F_A$ in FIG. 49). Consequently, it is possible to improve the reliability of the semiconductor device 20C after long-term use.

Ninth Embodiment

With reference to FIGS. 50 to 57, a ninth embodiment will now be described. FIGS. 50 to 57 are diagrams illustrating the ninth embodiment. In FIGS. 50 to 57, the same reference signs are assigned to the same portions as those of the embodiments illustrated in FIGS. 8 to 49, and a detailed explanation will be omitted.

(Structure of Lead Frame)

First, with reference to FIGS. 50 and 51, an overview of a lead frame according to the present embodiment will now be given. FIGS. 50 and 51 are diagrams illustrating a lead frame according to the present embodiment.

As illustrated in FIGS. 50 and 51, each package area 10a of the lead frame 10 includes a die pad 11 and lead portions 12 located around the die pad 11. Among them, the lead portion 12 is partially thinned from its back surface side. The back surface of the lead portion 12 at its thinned part is a roughened surface. The back surface of the lead portion 12 at its non-thinned part is a smooth surface.

As illustrated in FIG. 51, the die pad 11 has a die pad front surface 11a, which is located at the front surface side, and a die pad back surface 11b, which is located at the back surface side. As will be described later, the semiconductor element 21 is mountable on the die pad front surface 11a. The die pad back surface 11b is exposed to the outside from the semiconductor device 20 (described later). A die pad side surface 11h is formed at, of the die pad 11, the side face oriented toward the lead portion 12. The die pad side surface 11h extends in a thickness direction (Z direction) from the die pad front surface 11a side to the die pad back surface 11b side. In this case, the die pad side surface 11h is a roughened surface. That is, a third roughened surface R3 is formed at the die pad side surface 11h. On the other hand, the die pad back surface 11b is a smooth surface.

In the present embodiment, the term "roughened surface" refers to a surface an S ratio of which is 1.10 or higher. The term "smooth surface" refers to a surface the S ratio of which is lower than 1.10. A roughened surface is a surface that is rougher than a smooth surface. The S ratio of "roughened surface" should preferably be 1.10 or higher and 2.30 or lower. The S ratio of "smooth surface" should preferably be 1.00 or higher but lower than 1.10. The S ratio represents a surface area percentage obtained by measuring a measurement target surface with segmentation into a plurality of pixels by means of an optical-interferometer-type measurement device. Specifically, this value is calculated by dividing, by an observation area, a surface area obtained by measuring a measurement target surface with segmentation into a plurality of pixels by means of VertScan manufactured by Hitachi Hi-Tech Corporation.

The roughened surface may be formed by, for example, performing a surface roughening treatment of an outer surface of a metal substrate 31 to be described later by means of a micro etching fluid. An example of a micro etching fluid mentioned here is an etchant that contains sulfuric acid or hydrochloric acid as a principal component (for example, a first micro etching fluid to be described later). Alternatively, as the micro etching fluid, an etchant that contains hydrogen peroxide and sulfuric acid as principal components (for example, a second micro etching fluid to be described later) may be used. The smooth surface may be a non-treated surface, which is a surface of the metal substrate 31 to be described later not having been subjected to such a surface roughening treatment. In FIG. 51, a roughened surface that is relatively smooth (for example, a first roughened surface R1 to be described later) is indicated by a thin broken line. In FIG. 51, roughened surfaces that are relatively rough (for example, a second roughened surface R2, a third roughened surface R3, a fourth roughened surface R4, and a fifth roughened surface R5 to be described later) are indicated by thick broken lines.

The die pad front surface 11a of the die pad 11 is an area (internal terminal) for bonding to the semiconductor element 21 by means of an adhesive 24 such as a die attaching paste as will be described later. The die pad front surface 11a may be an area that is not thinned by half etching or the like. The first roughened surface R1 is formed at the die pad front surface 11a. The first roughened surface R1 is smoother (less rough) than the second roughened surface R2 of the lead portion 12 to be described later. Specifically, the S ratio of the first roughened surface R1 may be 1.10 or higher but lower than 1.30.

In the present embodiment, the first roughened surface R1 is formed throughout the entire area of the die pad front surface 11a. However, this is a non-limiting example; the first roughened surface R1 may be formed at a part of the die pad front surface 11a. It is especially preferable if the first roughened surface R1 is formed outward of and around, of the die pad front surface 11a, an area where the semiconductor element 21 is to be mounted. This makes it possible to suppress a phenomenon (bleed out) that ingredients such as epoxy resin in the adhesive 24 are leached out due to capillary action of the die pad front surface 11a as will be described later. The first roughened surface R1 may be formed along the entire area of the periphery of the die pad 11. In a case where the first roughened surface R1 is formed at a part of the die pad front surface 11a, the portion other than the first roughened surface R1 may be a smooth surface. Alternatively, the portion other than the first roughened surface R1 of the die pad front surface 11a may be a roughened surface that is rougher than the first roughened surface R1. For example, the S ratio of the portion other than the first roughened surface R1 of the die pad front surface 11a may be 1.30 or higher and 2.30 or lower.

Referring to FIG. 51, the die pad back surface 11b is not thinned by, for example, half etching, and is a smooth surface, similarly to the surface of a before-treatment metal substrate (metal substrate 31 to be described later). The die pad back surface 11b is exposed to the outside from the semiconductor device 20 after the manufacturing of the semiconductor device 20 (described later).

Each lead portion 12 is configured to be connected to the semiconductor element 21 via a bonding wire 22 as will be described later, and is disposed with a space from the die pad 11. The lead portions 12 are spaced apart from one another in the length direction of the connecting bar 13. Each lead portion 12 extends from the connecting bar 13.

As illustrated in FIG. 51, the lead portion 12 includes an inner lead 51 and a terminal portion 53. The inner lead 51 is located at an inner side (die pad 11 side). The terminal portion 53 is located at an outer side (connecting bar 13 side). The inner lead 51 extends from the terminal portion 53 toward the die pad 11. An internal terminal is formed on a front surface of the inner lead 51. The internal terminal is an area that is to be electrically connected to the semiconductor element 21 via the bonding wire 22 as will be described later. A metal layer 25 for improving the property of close contact with the bonding wire 22 is provided on the internal terminal.

In the present embodiment, the back surface of the lead portion 12 at its thinned part is a roughened surface. Specifically, the inner lead 51 of the lead portion 12 is thinned from its back surface side. The inner lead back surface 51b, which is located at the back surface side of the inner lead 51, is a roughened surface throughout the entire area thereof. That is, a fourth roughened surface R4 is formed at the inner lead back surface 51b. On the other hand, the back surface of the lead portion 12 at its non-thinned part is a smooth surface. Specifically, the terminal portion 53 of the lead portion 12 is not thinned from its back surface side. The external terminal 17, which is located at the back surface side of the terminal portion 53, is a smooth surface throughout the entire area thereof.

Furthermore, the inner lead tip surface 51c of the lead portion 12 is a roughened surface throughout the entire area thereof. That is, a fifth roughened surface R5 is formed at the inner lead tip surface 51c. Though not illustrated, both side surfaces along the length direction of the lead portion 12 may also be roughened surfaces. On the other hand, the inner lead 51 of the lead portion 12 is not thinned from its front surface side. Moreover, the terminal portion 53 of the lead portion 12 is not thinned from its front surface side.

The inner lead front surface 51a of the inner lead 51 and the terminal portion front surface 53a of the terminal portion 53 constitute a lead front surface 12a. The lead front surface 12a is an area that is not thinned from its front surface side by half etching, etc. In the lead front surface 12a, a smooth surface area S, which is an area having a smooth surface, and the second roughened surface R2, which is an area having a roughened surface, are formed.

The smooth surface area S is located at an inner end portion (die pad 11 side) of the lead portion 12. The metal layer 25 is formed on the smooth surface area S. In this case, the metal layer 25 covers the whole of the smooth surface area S in a plan view. The metal layer 25 may be, for example, a plating layer formed using an electrolytic plating method. The thickness of the metal layer 25 may be 1 μm or greater and 10 μm or less. As the metal of which this plating layer is made, silver, silver alloy, gold, gold alloy, platinum group, copper, copper alloy, palladium, or the like may be used. If ground plating is required depending on the metal of which the metal layer 25 is made, a known material such as nickel or copper can be used.

In this case, in the lead front surface 12a of each lead portion 12, one smooth surface area S is formed. However, this is a non-limiting example; in the lead front surface 12a of each lead portion 12, a plurality of smooth surface areas S may be formed. Forming the smooth surface area S in the lead front surface 12a of each lead portion 12 is not necessarily needed. That is, the whole of the lead front surface 12a of each lead portion 12 may be the second roughened surface R2.

The second roughened surface R2 is located outward of the smooth surface area S and the metal layer 25 (connecting bar 13 side). In this case, the second roughened surface R2 is provided only at an area located outward of the smooth surface area S (connecting bar 13 side). However, this is a non-limiting example; the second roughened surface R2 may be provided in such a way as to surround the smooth surface area S in a plan view. The lead front surface 12a may be made up of the smooth surface area S and the second roughened surface R2 only.

In the present embodiment, the second roughened surface R2 is rougher than the first roughened surface R1 of the die pad 11 described above. Specifically, the S ratio of the second roughened surface R2 may be 1.30 or higher and 2.30 or lower, whereas, as described above, the S ratio of the first roughened surface R1 may be 1.10 or higher but lower than 1.30.

The third roughened surface R3 of the die pad 11 described above may be rougher than the first roughened surface R1. The S ratio of the third roughened surface R3 may be 1.30 or higher and 2.30 or lower. The fourth roughened surface R4 of the lead portion 12 may be rougher than the first roughened surface R1 described above. The S ratio of the fourth roughened surface R4 may be 1.30 or higher and 2.30 or lower. The fifth roughened surface R5 of the lead portion 12 may be rougher than the first roughened surface R1 described above. The S ratio of the fifth roughened surface R5 may be 1.30 or higher and 2.30 or lower.

The relation of roughness between the second roughened surface R2, the third roughened surface R3, the fourth roughened surface R4, and the fifth roughened surface R5 is not specifically limited. The roughness of the second roughened surface R2, the third roughened surface R3, the fourth roughened surface R4, and the fifth roughened surface R5 may be different from one another or the same as one another.

Besides the above, the structure of the lead frame 10 according to the present embodiment may be the same as the structure of the lead frame 10 according to the second embodiment.

(Structure of Semiconductor Device)

Next, with reference to FIGS. 52 and 53, a semiconductor device according to the present embodiment will now be described. FIGS. 52 and 53 are diagrams illustrating a semiconductor device (QFN type) according to the present embodiment.

As illustrated in FIGS. 52 and 53, the semiconductor device (semiconductor package) 20 includes the die pad 11, the semiconductor element 21, the plurality of lead portions 12, a plurality of bonding wires 22, and the molding resin 23.

Among them, the semiconductor element 21 is mounted on the die pad 11. Each of the plurality of bonding wires 22 provides electrical connection between the semiconductor element 21 and the metal layer 25 of the lead portion 12. In this case, the bonding wire 22 constitutes a connecting portion.

The molding resin 23 seals the die pad 11, the lead portions 12, the semiconductor element 21, and the bonding wires 22.

The die pad 11 and the lead portions 12 are made of the above-described lead frame 10. In this case, the first roughened surface R1 is formed at the die pad front surface 11a of the die pad 11. In addition, the second roughened surface R2 is formed at a position located outward of the metal layer 25 (the side farther from the die pad 11) as a part of the lead front surface 12a of the lead portion 12. The second roughened surface R2 of the lead portion 12 is rougher than the first roughened surface R1 of the die pad 11.

In addition, the third roughened surface R3 is formed at the die pad side surface 11h of the die pad 11. The third roughened surface R3 is rougher than the first roughened surface R1. The molding resin 23 is closely adhered to the die pad side surface 11h. The inner lead 51 of the lead portion 12 is thinned from its back surface side. The inner lead back surface 51b of the inner lead 51 is the fourth roughened surface R4. The fourth roughened surface R4 is rougher than the first roughened surface R1. The molding resin 23 is closely adhered to the inner lead back surface 51b. In addition, the fifth roughened surface R5 is formed at the inner lead tip surface 51c of the inner lead 51. The fifth roughened surface R5 is rougher than the first roughened surface R1. The molding resin 23 is closely adhered to the inner lead tip surface 51c. The terminal portion 53 of the lead portion 12 is not thinned from its back surface side. The external terminal 17, which is located on the back surface of the terminal portion 53, has a smooth surface. The external terminal 17 is exposed to the outside from the molding resin 23.

The semiconductor element 21 is not specifically limited, and various kinds of semiconductor element commonly used in the art can be used. For example, an integrated circuit, a large-scale integrated circuit, a transistor, a thyristor, a diode, or the like can be used. The semiconductor element 21 includes a plurality of electrodes 21a to which the bonding wires 22 are attached respectively. The semiconductor element 21 is fixed to the front surface of the die pad 11 by means of the adhesive 24 such as, for example, a die attaching paste. The adhesive 24 may be an epoxy-resin-based adhesive whose ingredients include a silver paste and epoxy resin, etc.

Each bonding wire 22 is made of a material having good conductive property such as, for example, gold or copper. One end of each bonding wire 22 is connected to an electrode 21a of the semiconductor element 21, and the opposite end thereof is connected to the metal layer 25 located on the corresponding lead portion 12. A conductor such as a bump may be used as the connection member in place of the bonding wire 22. In this case, the semiconductor element 21 can be connected to the lead portion 12 by flip-chip bonding.

Thermosetting resin such as silicone resin or epoxy resin, or thermoplastic resin such as PPS resin, etc., can be used as the molding resin 23. The thickness of the molding resin 23 as a whole may be 300 µm or greater and 1,500 µm or less or so. The length of one side of the molding resin 23 (one side of the semiconductor device 20) may be, for example, 0.2 mm or greater and 20 mm or less. In FIG. 52, the illustration of a part, of the molding resin 23, located at the front surface side with respect to the lead portions 12 and the semiconductor element 21 is omitted.

Besides the above, the structure of the die pad 11 and the lead portions 12 is the same as the structure having been described earlier with reference to FIGS. 50 and 51, except for areas not included in the semiconductor device 20; therefore, a detailed explanation is not given here.

(Method of Manufacturing Lead Frame)

Next, a method of manufacturing the lead frame 10 illustrated in FIGS. 50 and 51 will now be described while referring to FIGS. 54A to 54E and FIGS. 55A to 55H. FIGS. 54A to 54E and FIGS. 55A to 55H are cross-sectional views of a method of manufacturing the lead frame 10 (diagrams corresponding to FIG. 51).

First, in the same manner as done in the second embodiment (FIGS. 14A to 14E), a metal substrate 31 that includes the die pad 11 and lead portions 12 located around the die pad 11 is manufactured (FIGS. 54A to 54E).

Figure 55A:
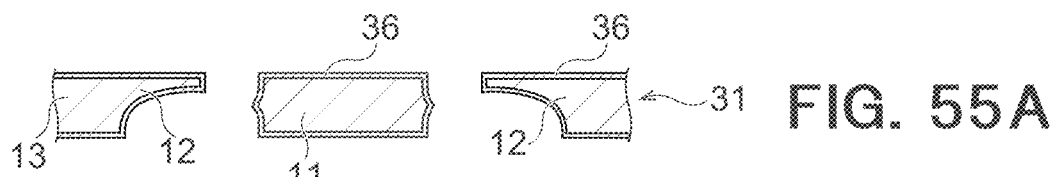

Next, a plating layer (coating layer) 36 is formed around the metal substrate 31 (FIG. 55A). In this process, the plating layer 36 may be formed on the whole of the externally exposed portion of the die pad 11, the lead portions 12, and the connecting bars 13. The thickness of the plating layer 36 may be greater than 0 µm but not greater than 2 µm. As the metal of which the plating layer 36 is made, for example, silver may be used. In a case where the plating layer 36 is a silver plating layer, a silver plating fluid containing silver cyanide and potassium cyanide as principal components can be used as an electrolytic plating fluid.

Figure 55B:
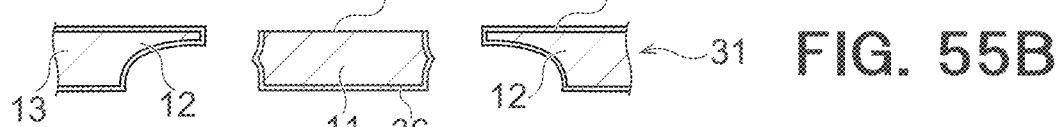

Next, the plating layer 36 existing at, of the metal substrate 31, the area where the first roughened surface R1 is to be formed is removed. Specifically, the plating layer 36 existing at the entire area of the die pad front surface 11a of the die pad 11 is removed (FIG. 55B). In this case, for example, the metal substrate 31 is clamped with a jig at its front and back surfaces except for the die pad front surface 11a, with elastic members each sandwiched therebetween. Next, the plating layer 36 at the part not covered by the elastic member and the jig may be taken away. By this means, the plating layer 36 on the die pad front surface 11a is removed.

Figure 55C:
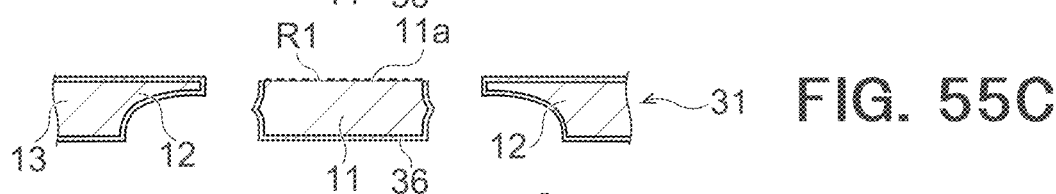
Figure 55D:
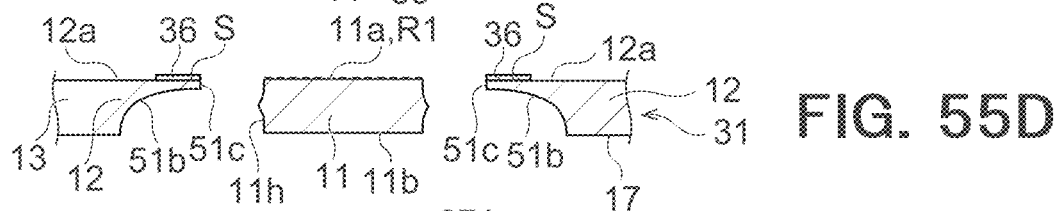

Next, of the metal substrate 31, the part not covered by the plating layer 36 is roughened, thereby forming the first roughened surface R1 at this part (FIG. 55C). Specifically, the first roughened surface R1 is formed at the whole of the die pad front surface 11a, which is not covered by the plating layer 36, by supplying the first micro etching fluid to the metal substrate 31. The first micro etching fluid is a surface treatment agent that slightly erodes a metal surface to form the first roughened surface R1 with a fine convex-and-concave pattern. For example, when surface roughening is applied to the metal substrate 31 made of copper or copper alloy, a micro etching fluid that contains sulfuric acid or hydrochloric acid as a principal component may be used as the first micro etching fluid.

Next, the plating layer 36 existing on the metal substrate 31 except for the smooth surface area S of the lead front surface 12a (area where the metal layer 25 is to be formed) is removed. In this case, for example, the metal substrate 31 is clamped with a jig at its front and back surfaces except for the smooth surface area S, with elastic members each sandwiched therebetween. Next, the plating layer 36 at the part not covered by the elastic member and the jig may be taken away. By this means, the plating layer 36 located at the die pad back surface 11b and the die pad side surface 11h of the die pad 11 is removed. In addition, the plating layer 36 located at the lead front surface 12a except for the smooth surface area S, the inner lead back surface 51b, the inner lead tip surface 51c, and the external terminal 17 of the lead portion 12 is removed.

Figure 55E:

Next, a protective layer 37A is provided on each of the front and back surfaces of the metal substrate 31 (FIG. 55E). The protective layer 37A may be, for example, a resist layer. The protective layer 37A at the front surface side covers the die pad front surface 11a of the die pad 11 and the plating layer 36 on the smooth surface area S of the lead portion 12. At this time, the protective layer 37A at the front surface side covers the entire area of the first roughened surface R1 of the die pad 11. In addition, the protective layer 37A at the front surface side may cover a part or the whole of the plating layer 36 on the smooth surface area S. The protective layer 37A at the back surface side covers the die pad back surface 11b of the die pad 11 and the external terminal 17 of the lead portion 12.

Figure 55F:
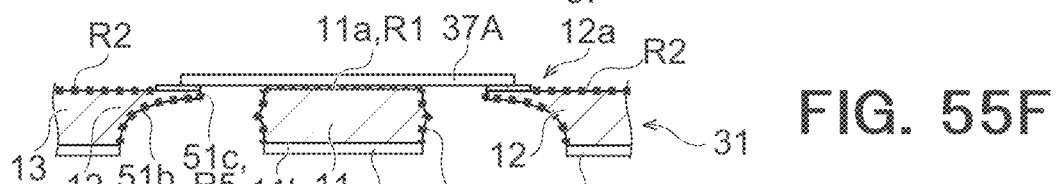

Next, of the metal substrate 31, the part not covered by the plating layer 36 and the protective layer 37A is roughened, thereby forming roughened surfaces at the part not covered by the plating layer 36 and the protective layer 37A (FIG. 55F). Specifically, the second roughened surface R2 is formed at a part of the lead front surface 12a of the lead portion 12. In addition, the third roughened surface R3 is formed at the die pad side surface 11h of the die pad 11. In addition, the fourth roughened surface R4 is formed at the inner lead back surface 51b of the lead portion 12. In addition, the fifth roughened surface R5 is formed at the inner lead tip surface 51c of the lead portion 12.

While this is performed, the second micro etching fluid is supplied to the metal substrate 31. By this means, roughened surfaces are formed on the whole of the metal substrate 31 except for the part covered by the plating layer 36 and the protective layer 37A. The second micro etching fluid is a surface treatment agent that slightly erodes a metal surface to form a fine convex-and-concave roughened surface. For example, when surface roughening of the metal substrate 31 made of copper or copper alloy is performed, a micro etching fluid that contains hydrogen peroxide and sulfuric acid as principal components may be used as the second micro etching fluid. The second micro etching fluid may contain components different from the components of the first micro etching fluid described above. The second micro etching fluid treats metal to make its surface rougher than done by the first micro etching fluid. Therefore, each of the second roughened surface R2, the third roughened surface R3, the fourth roughened surface R4, and the fifth roughened surface R5 is rougher than the first roughened surface R1.

Figure 55G:
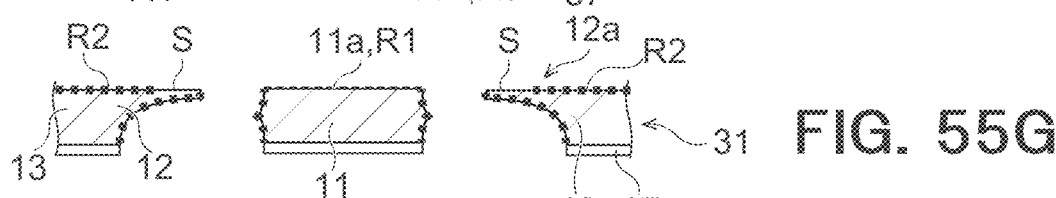

Next, each of the protective layer 37A and the plating layer 36 on the front surface of the metal substrate 31 is removed (FIG. 55G). In this process, the plating layer 36 covering the lead front surface 12a is removed, and the smooth surface area S becomes exposed. The protective layer 37A at the back surface side is left unremoved.

Figure 55H:
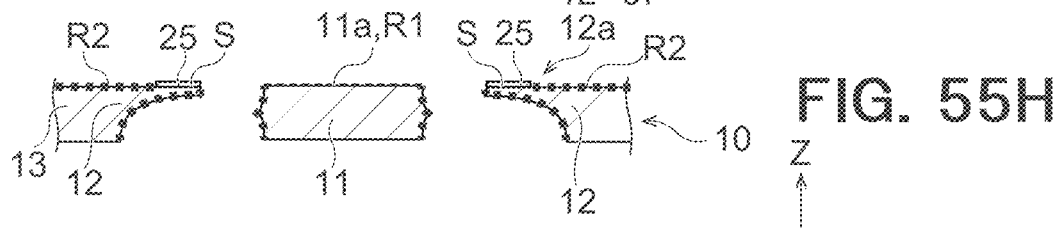

After the removal, the metal layer 25 is formed on the smooth surface area S of the lead portion 12 (FIG. 55H). In this case, first, a non-illustrated plating resist layer that has a predetermined pattern is formed using, for example, a photolithography method on the die pad 11 and the lead portion 12, except for the smooth surface area S. Next, the metal layer 25 that is a plating layer is formed using, for example, an electrolytic plating method at the smooth surface area S, which is not covered by the plating resist layer. The plating resist layer is thereafter removed, thereby obtaining the lead frame 10 illustrated in FIGS. 50 and 51.

(Method of Manufacturing Semiconductor Device)

Next, a method of manufacturing the semiconductor device 20 illustrated in FIGS. 52 and 53 will now be described while referring to FIGS. 56A to 56E. FIGS. 56A to 56E are cross-sectional views of a method of manufacturing the semiconductor device 20 (diagrams corresponding to FIG. 53).

Figure 56A:
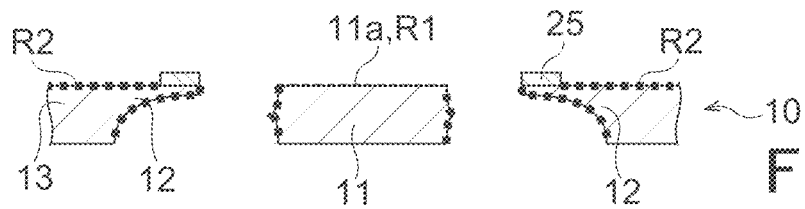

First, the lead frame 10 is manufactured using, for example, the method illustrated in FIGS. 54A to 54E and FIGS. 55A to 55H (FIG. 56A).

Figure 56B:
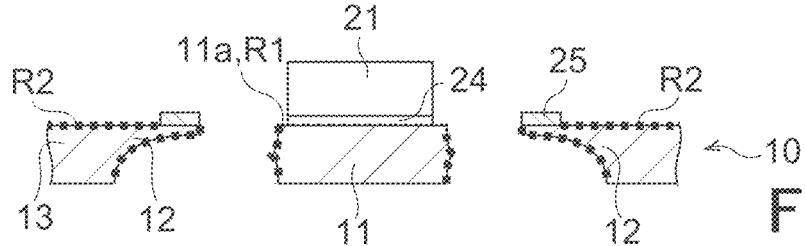

Next, the semiconductor element 21 is mounted onto the die pad 11 of the lead frame 10. In this case, for example, the semiconductor element 21 is placed on the die pad 11 and is fixed thereto using the adhesive 24 such as a die attaching paste (FIG. 56B). The adhesive 24 may be an epoxy-resin-based adhesive whose ingredients include a silver paste and epoxy resin, etc. In this process, the semiconductor element 21 is disposed on the first roughened surface R1 of the die pad front surface 11a, with the adhesive 24 interposed therebetween. In addition, the first roughened surface R1 is located along the outer perimeter of the semiconductor element 21 and the adhesive 24.

Figure 56C:
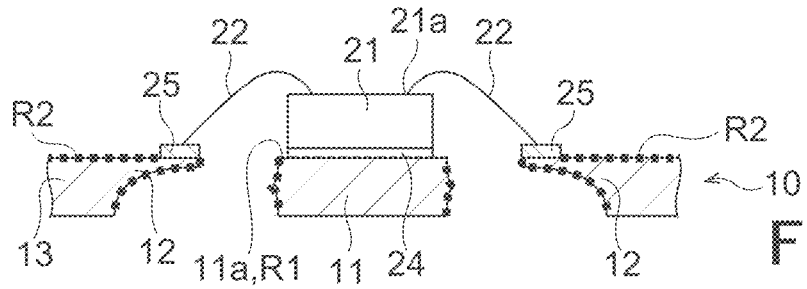

Next, each electrode 21a of the semiconductor element 21, and the metal layer 25 formed on each lead portion 12, are electrically connected to each other by means of the bonding wire (connection member) 22 (FIG. 56C).

Figure 56D:
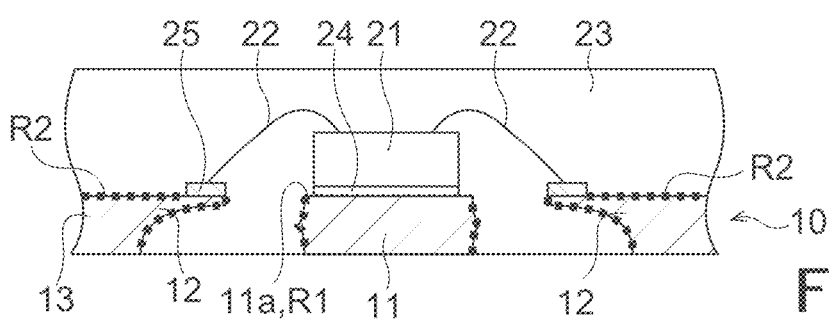

Next, the molding resin 23 is formed by performing injection molding or transfer molding of thermosetting resin or thermoplastic resin to the lead frame 10 (FIG. 56D). By this means, the die pad 11, the lead portions 12, the semiconductor element 21, and the bonding wires 22 are sealed with resin.

Figure 56E:
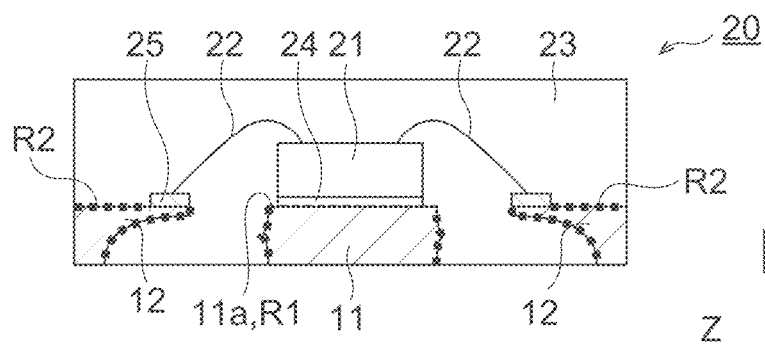

After the sealing, the lead frame 10 and the molding resin 23 are cut into the package areas 10a. As a result of this cutting, the lead frame 10 is separated into pieces each corresponding to the semiconductor device 20, and the semiconductor device 20 illustrated in FIGS. 52 and 53 can be obtained (FIG. 56E).

By the way, during the manufacturing of the semiconductor device 20 in this way, a step of applying heat to the adhesive 24 to cure it is executed (FIG. 56B). Specifically, the adhesive 24 such as a die attaching paste is applied to the die pad 11, the semiconductor element 21 is mounted onto the die pad 11, and, after that, heat is applied to the adhesive 24 to cure it. In this process, there is a risk that ingredients such as epoxy resin in the adhesive 24 having been applied thereto might be leached out due to capillary action of the die pad front surface 11a. This phenomenon is called "bleed out" or "epoxy bleed out".

To address this issue, according to the present embodiment, the first roughened surface R1 is formed at the die pad front surface 11a of the die pad 11. The first roughened surface R1 is less rough than the second roughened surface R2. This makes it possible to suppress the phenomenon of leaching of epoxy resin, etc. in the adhesive 24 (bleed out) due to capillary action caused by the convex-and-concave pattern of the die pad front surface 11a (see an arrow E in FIG. 57). On the other hand, it is conceivable to configure the die pad front surface 11a around the adhesive 24 as a smooth surface. However, if the viscosity of the epoxy resin in the adhesive 24 is low, in contradiction to what is aimed for, such a configuration will make it easier for the epoxy resin to flow along the die pad front surface 11a, which is a smooth surface. For this reason, in the present embodiment, the die pad front surface 11a is configured to be rough moderately to such an extent that does not cause capillary action (defined as the first roughened surface R1). This makes it possible to suppress the epoxy resin from flowing along the die pad front surface 11a, regardless of the viscosity of the epoxy resin in the adhesive 24.

There is a possibility that moisture in air, etc. will enter from the side surface side or the back surface side of the semiconductor device 20 while the semiconductor device 20 described above is used for a long term. For example, it could happen that moisture, etc. enters via an interface between the molding resin 23 and the die pad 11 or the lead portion 12.

To address this issue, according to the present embodiment, the second roughened surface R2 is formed at the lead front surface 12a of the lead portion 12. For this reason, the distance of an entry path along which moisture enters via the interface between the lead front surface 12a and the molding resin 23 is long. This makes it possible to suppress the entry of the moisture toward the semiconductor element 21 via the interface between the lead front surface 12a and the molding resin 23 (see an arrow $F_A$ in FIG. 57). Consequently, it is possible to improve the reliability of the semiconductor device 20 after long-term use.

Moreover, according to the present embodiment, the die pad side surface 11h of the die pad 11 is the third roughened surface R3. The third roughened surface R3 is rougher than the first roughened surface R1. For this reason, at the back surface side of the semiconductor device 20, the distance of an entry path along which moisture enters via the interface between the molding resin 23 and the die pad 11 is long. This makes it possible to suppress the entry of the moisture toward the semiconductor element 21 via the interface between the molding resin 23 and the die pad 11 (see an arrow $F_B$ in FIG. 57). Consequently, it is possible to improve the reliability of the semiconductor device 20 after long-term use. Furthermore, it is possible to increase the strength of adhesion of the die pad 11 and the molding resin 23, thereby suppressing the die pad 11 and the molding resin 23 from coming off from each other.

Moreover, according to the present embodiment, the inner lead back surface 51b of the lead portion 12 is the fourth roughened surface R4. Furthermore, the inner lead tip surface 51c of the lead portion 12 is the fifth roughened surface R5 Each of the fourth roughened surface R4 and the fifth roughened surface R5 is rougher than the first roughened surface R1. For this reason, at the back surface side of the semiconductor device 20, the distance of an entry path along which moisture enters via the interface between the molding resin 23 and the lead portion 12 is long. This makes it possible to suppress the entry of the moisture toward the semiconductor element 21 via the interface between the molding resin 23 and the lead portion 12 (see an arrow Fe in FIG. 57). Consequently, it is possible to improve the reliability of the semiconductor device 20 after long-term use. Furthermore, it is possible to increase the strength of adhesion of the lead portion 12 and the molding resin 23, thereby suppressing the lead portion 12 and the molding resin 23 from coming off from each other.

Variation Example

Next, with reference to FIG. 58, a variation example of the lead frame 10 according to the present embodiment will now be described. FIG. 58 is a cross-sectional view of the lead frame 10 according to a variation example. In FIG. 58, the same reference signs are assigned to the same portions as those of the embodiment illustrated in FIGS. 50 to 57, and a detailed explanation will be omitted.

In FIG. 58, the smooth surface area S and the second roughened surface R2 are formed in the lead front surface 12a of the lead portion 12. In this case, the metal layer 25 is not provided on the smooth surface area S. Therefore, the smooth surface area 5 is exposed to the outside of the lead frame 10.

When the lead frame 10 illustrated in FIG. 58 is manufactured, the step of forming the metal layer 25 (FIG. 55H) is not executed after executing the above-described steps illustrated in FIGS. 54A to 54E and FIGS. 55A to 55G. By this means, the lead frame 10 illustrated in FIG. 58 can be obtained.

By not providing the metal layer 25 on the smooth surface area S as described above, it is possible to reduce the manufacturing steps of the lead frame 10. Moreover, by not providing the metal layer 25 that is a plating layer made of silver, silver alloy, gold, gold alloy, platinum group, copper, copper alloy, palladium, or the like, it is possible to reduce the manufacturing cost of the lead frame 10.

Furthermore, this variation is more effective when the semiconductor element 21 is connected to the lead portions 12 by flip-chip bonding, rather than when the semiconductor element 21 is connected to the lead portions 12 by wire bonding.

The plural elements disclosed in the foregoing embodiments and variation examples can be combined as needed. Alternatively, some elements may be deleted from among all of the elements disclosed in the foregoing embodiments and variation examples.

The invention claimed is:

1. A lead frame, comprising:
a die pad on which a semiconductor element is mountable; and
a lead portion located around the die pad, wherein:
an area of a smooth surface is formed in a front surface of the die pad or a front surface of the lead portion,
an area of a rough surface exists in such a way as to surround an entire perimeter of the area of the smooth surface,
the area of the smooth surface is made of a same material as the area of the rough surface, and
the area of the smooth surface has a circular, elliptical, or oblong shape in a plan view.

2. The lead frame according to claim 1, wherein
an area of the rough surface is formed along an entirety of a peripheral edge of the die pad or along an entirety of a peripheral edge of the lead portion in a plan view.

3. The lead frame according to claim 1, wherein
the lead portion includes an inner lead thinned from a back surface side, an inner lead front surface is formed at a front surface side of the inner lead, an inner lead back surface is formed at a back surface side of the inner lead, and an inner lead tip surface is formed at, of the inner lead, a surface oriented toward the die pad, an external terminal is formed at a non-thinned part of the back surface of the lead portion, the inner lead back surface and the inner lead tip surface is a rough surface, and the external terminal is a smooth surface.

4. The lead frame according to claim 1, wherein a back surface of the die pad is a smooth surface, and a side surface of the die pad is a rough surface.

5. The lead frame according to claim 1, wherein the area of the smooth surface has a square or rectangular shape in a plan view.

6. The lead frame according to claim 1, wherein the area of the smooth surface has a shape of a closed figure that includes a curve and a line segment in a plan view.

7. The lead frame according to claim 1, wherein a minimum distance between the area of the smooth surface and a peripheral edge of the die pad or the lead portion is 0.025 mm or longer and 1.0 mm or shorter.

8. The lead frame according to claim 1, wherein an S ratio of the rough surface is 1.30 or higher, and an S ratio of the smooth surface is lower than 1.30.

9. A method of manufacturing a lead frame, comprising:
a step of preparing a metal substrate;
a step of forming a die pad and a lead portion located around the die pad by etching the metal substrate;
a step of forming a plating layer on a part of the metal substrate;
a step of forming a rough surface at, of the metal substrate, a part that is not covered by the plating layer; and
a step of removing the plating layer, wherein
an area of a smooth surface is formed in a front surface of the die pad or a front surface of the lead portion, and
an area of the rough surface exists in such a way as to surround an entire perimeter of the area of the smooth surface.

* * * * *